(12) United States Patent
Min

(10) Patent No.: US 12,040,275 B2
(45) Date of Patent: Jul. 16, 2024

(54) SEMICONDUCTOR DEVICE INCLUDING VIA PLUG CONNECTED TO SOURCE/DRAIN PATTERN

(71) Applicant: Samsung Electronics Co., Ltd., Suwon-si (KR)

(72) Inventor: Sun Ki Min, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 422 days.

(21) Appl. No.: 17/489,164

(22) Filed: Sep. 29, 2021

(65) Prior Publication Data

US 2022/0223526 A1    Jul. 14, 2022

(30) Foreign Application Priority Data

Jan. 11, 2021    (KR) .................. 10-2021-0003324

(51) Int. Cl.

| | |
|---|---|
| H01L 23/535 | (2006.01) |
| H01L 21/768 | (2006.01) |
| H01L 29/06 | (2006.01) |
| H01L 29/423 | (2006.01) |
| H01L 29/78 | (2006.01) |
| H01L 29/786 | (2006.01) |

(52) U.S. Cl.
CPC ...... *H01L 23/535* (2013.01); *H01L 21/76805* (2013.01); *H01L 21/76895* (2013.01); *H01L 29/0665* (2013.01); *H01L 29/42392* (2013.01); *H01L 29/7851* (2013.01); *H01L 29/78696* (2013.01)

(58) Field of Classification Search
CPC ............. H01L 23/535; H01L 21/76805; H01L 23/53295; H01L 21/76895; H01L 29/0665; H01L 29/42392; H01L 29/7851; H01L 29/78696; H01L 21/823475; H01L 21/76832; H01L 23/5226
See application file for complete search history.

(56) References Cited

U.S. PATENT DOCUMENTS

| | | | |
|---|---|---|---|
| 6,184,073 B1 * | 2/2001 | Lage | ................. H01L 21/76832 257/E21.59 |
| 6,358,832 B1 | 3/2002 | Edelstein et al. | |
| 6,492,732 B2 | 12/2002 | Lee et al. | |
| 6,917,108 B2 | 7/2005 | Fitzsimmons et al. | |
| 7,514,792 B2 | 4/2009 | Hasegawa | |
| 7,538,353 B2 | 5/2009 | Huang et al. | |
| 8,729,706 B2 | 5/2014 | Yu et al. | |
| 9,064,872 B2 | 6/2015 | Boyanov et al. | |
| 10,468,297 B1 | 11/2019 | Tung et al. | |

(Continued)

FOREIGN PATENT DOCUMENTS

| | | |
|---|---|---|
| CN | 103208526 A | 7/2013 |
| KR | 2003-0052653 A | 6/2003 |
| KR | 2009-0057549 A | 6/2009 |

*Primary Examiner* — Changhyun Yi
(74) *Attorney, Agent, or Firm* — Muir Patent Law, PLLC

(57) ABSTRACT

A semiconductor device includes a substrate, a gate structure, a source/drain pattern, first and second interlayer insulating layers, a first via plug connected to the source/drain pattern, and an etch stop structure layer, which may include a plurality of etch stop layers sequentially stacked. The etch stop structure layer may have a structure in relation to other components that improves aspects of the semiconductor device.

21 Claims, 46 Drawing Sheets

(56) References Cited

U.S. PATENT DOCUMENTS

| | | |
|---|---|---|
| 10,504,833 B2 | 12/2019 | Zheng et al. |
| 2009/0061633 A1 | 3/2009 | Nakata et al. |
| 2020/0395459 A1* | 12/2020 | Singh ................ H01L 21/28518 |

* cited by examiner

SEMICONDUCTOR DEVICE INCLUDING VIA PLUG CONNECTED TO SOURCE/DRAIN PATTERN

CROSS-REFERENCE TO RELATED APPLICATION

This application claims priority under 35 U.S.C. 119 to Korean Patent Application No. 10-2021-0003324 filed on Jan. 11, 2021 in the Korean Intellectual Property Office, the contents of which in its entirety are herein incorporated by reference.

BACKGROUND

1. Technical Field

The present disclosure relates to a semiconductor device and a method for fabricating the same.

2. Description of the Related Art

As one of scaling techniques for increasing the density of semiconductor devices, a multi-gate transistor has been proposed, in which a fin- or nanowire-shaped multi-channel active pattern (or silicon body) is formed on a substrate and a gate is formed on the surface of the multi-channel active pattern.

Since the multi-gate transistor uses a three-dimensional (3D) channel, scaling of the multi-gate transistor can be easily achieved. Further, current control capability can be improved without increasing the gate length of the multi-gate transistor. In addition, a short channel effect (SCE) in which the potential of a channel region is affected by a drain voltage can be effectively suppressed.

Meanwhile, as a pitch (size) of the semiconductor device decreases, there is a need for research to decrease capacitance and secure electrical stability between contacts in the semiconductor device.

SUMMARY

Aspects of the present disclosure provide a semiconductor device capable of improving device performance and reliability in MBCFET™.

Aspects of the present disclosure also provide a method for fabricating a semiconductor device capable of improving element performance and reliability.

According to an embodiment of the present disclosure, a semiconductor device includes a gate structure including a gate electrode, on a substrate, a source/drain pattern disposed on a side surface of the gate electrode, on the substrate, a first interlayer insulating layer on the gate structure, a first via plug disposed in the first interlayer insulating layer and connected to the source/drain pattern, an etch stop structure layer including first to third etch stop layers sequentially stacked, on the first interlayer insulating layer, such that the second etch stop layer is between the first etch stop layer and the third etch stop layer, a second interlayer insulating layer contacting the etch stop structure layer, on the etch stop structure layer, such that the etch stop structure layer is between the first interlayer insulating layer and the second interlayer insulating layer, and a wire line disposed in the second interlayer insulating layer and contacting the first via plug. The first etch stop layer contacts a top surface of the first interlayer insulating layer, and the third etch stop layer is a continuously-formed layer that includes a first horizontal portion extending along a top surface of the first interlayer insulating layer, and a first vertical portion protruding from the first horizontal portion of the third etch stop layer in a thickness direction of the substrate.

According to the aforementioned and other embodiments of the present disclosure, a semiconductor device includes a gate structure including a gate electrode extending in a first direction, on a substrate, a source/drain pattern disposed on a side surface of the gate electrode, on the substrate, a first interlayer insulating layer on the gate structure, a first via plug disposed in the first interlayer insulating layer and having a single conductive layer structure, the first via plug connected to the source/drain pattern, and including a first protrusion protruding from a top surface of the first interlayer insulating layer, a second via plug disposed in the first interlayer insulating layer, connected to the gate electrode, and having a conductive multilayer structure, an etch stop structure layer contacting the top surface of the first interlayer insulating layer and including a plurality of layers, a second interlayer insulating layer on the etch stop structure layer and contacting the etch stop structure layer, and a wire line disposed in the second interlayer insulating layer, and contacting the first via plug and the first interlayer insulating layer. The first via plug includes a first sidewall and a second sidewall opposite the first sidewall in a second direction perpendicular to the first direction, the first sidewall extends onto the first protrusion of the first via plug and contacts the etch stop structure layer at the first protrusion of the first via plug, and the second sidewall of the first protrusion extends onto the first via plug and contacts the wire line at the first protrusion of the first via plug.

According to the aforementioned and other embodiments of the present disclosure, a semiconductor device includes an active pattern, which may be a multi-channel active pattern, on a substrate, a gate structure disposed on the active pattern and including a gate electrode and a gate capping pattern, the gate capping pattern being disposed on the gate electrode, a source/drain pattern disposed on a side surface of the gate structure, on the active pattern, a first interlayer insulating layer on the gate capping pattern, a first via plug connected to the source/drain pattern and including a first protrusion protruding from a top surface of the first interlayer insulating layer, a second via plug connected to the gate electrode and including a second protrusion protruding from a top surface of the first interlayer insulating layer, an etch stop structure layer including first to third etch stop layers sequentially stacked, so that a second etch stop layer is between a first etch stop layer and a third etch stop layer, the etch stop structure layer, on the first interlayer insulating layer, a second interlayer insulating layer contacting the etch stop structure layer, on the etch stop structure layer, and a wire line disposed in the second interlayer insulating layer and contacting the first via plug. A sidewall of the first protrusion of the first via plug and a sidewall of the second protrusion of the second via plug contact the first etch stop layer, the first via plug has a single conductive layer structure, the second via plug includes a plug conductive layer and a barrier conductive layer extending along a bottom surface and a sidewall of the plug conductive layer, and the first via plug and the plug conductive layer include tungsten (W).

According to the aforementioned and other embodiments of the present disclosure, a method of fabricating a semiconductor device includes forming a source/drain contact and a gate contact on a substrate, forming a first interlayer insulating layer and a sacrificial etch stop layer on the source/drain contact and the gate contact, forming a first via plug that penetrates the sacrificial etch stop layer and the first interlayer insulating layer and connected to the gate contact, forming a second via plug that penetrates the sacrificial etch stop layer and the first interlayer insulating layer and is connected to the source/drain contact, removing the sacrificial etch stop layer such that a portion of the first via plug and a portion of the second via plug protrude from a top surface of the first interlayer insulating layer, forming an etch stop structure layer contacting the top surface of the first interlayer insulating layer, a portion of the first via plug, and a portion of the second via plug, the etch stop structure layer including a plurality of layers, forming a second interlayer insulating layer on the etch stop structure layer, and forming a wire line that penetrates the second interlayer insulating layer and the etch stop structure layer and is connected to the first via plug and the second via plug.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which.

Figure 1:
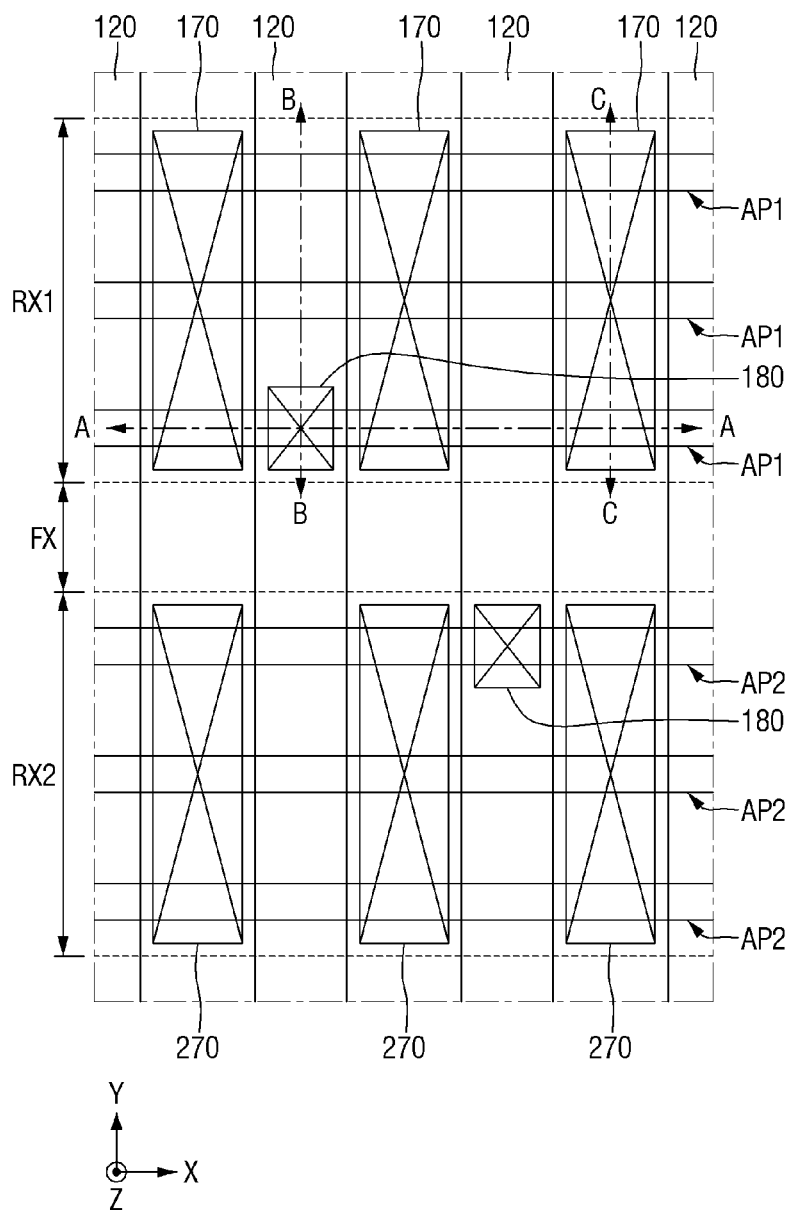
FIG. 1 is an exemplary layout diagram illustrating a semiconductor device according to some embodiments.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

DETAILED DESCRIPTION OF THE EMBODIMENTS

In the drawings of the semiconductor device according to some embodiments, for example, a fin-shaped transistor (FinFET) including a channel region of a fin-shaped pattern, a transistor including a nanowire or a nanosheet, and a multi-bridge channel field effect transistor (MBCFET™), or a vertical transistor (vertical FET) are illustrated. However, the invention is not limited thereto. The semiconductor device according to some embodiments may include a tunneling field effect transistor (TFET) or a three-dimensional (3D) transistor. Also, the semiconductor device according to some embodiments may include a planar transistor. In addition, the technical spirit of the present disclosure can be applied to transistors based on two-dimensional materials (2D material based FETs) and heterostructures thereof.

Further, the semiconductor device according to some embodiments may include a bipolar junction transistor, a lateral double diffusion MOS (LDMOS) transistor, or the like.

A semiconductor device according to some embodiments will be described with reference to FIGS. 1 to 6.

Figure 2:
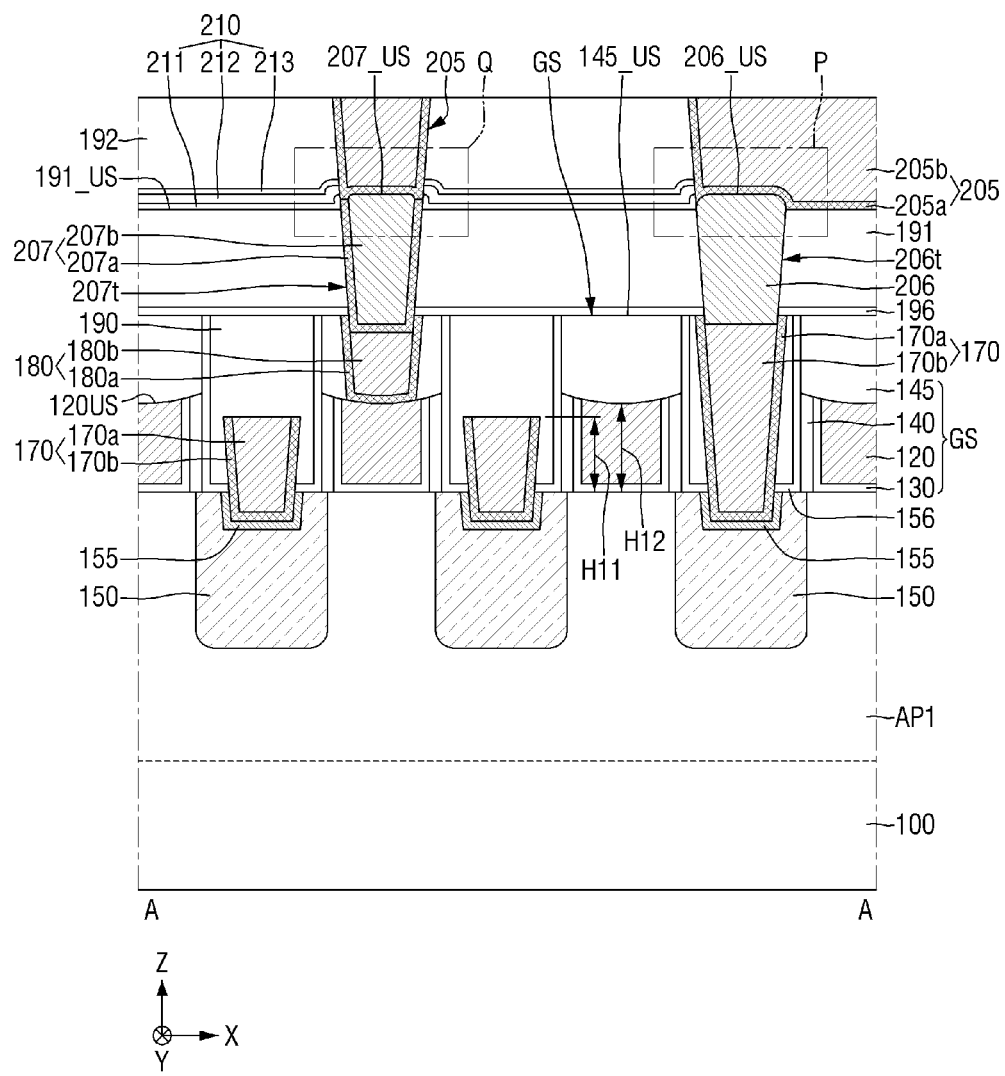
FIG. 2 is an exemplary cross-sectional view taken along line A-A of FIG. 1.
Figure 3:
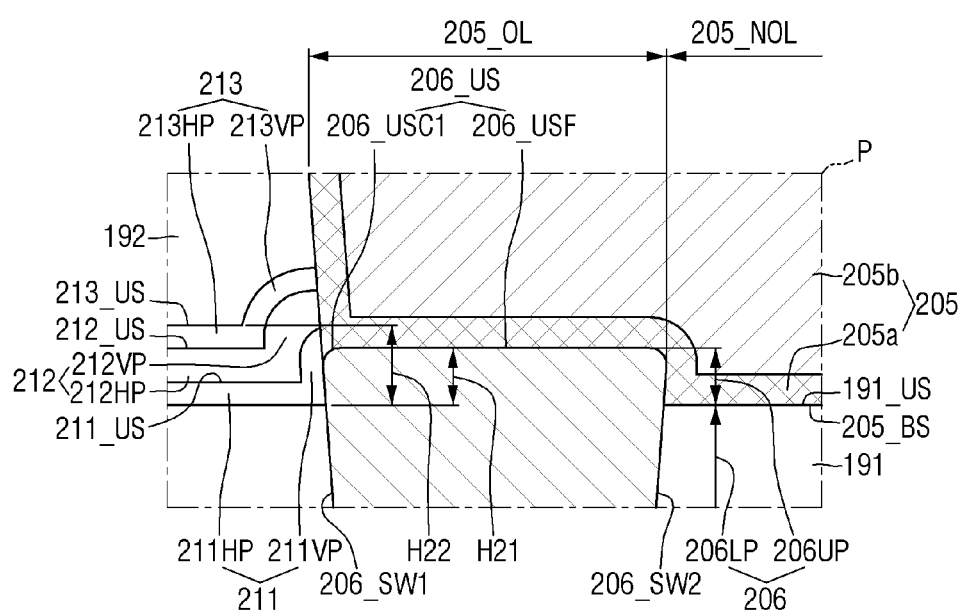
FIGS. 3 and 4 are enlarged views showing portion P and portion Q of FIG. 2.
Figure 4:
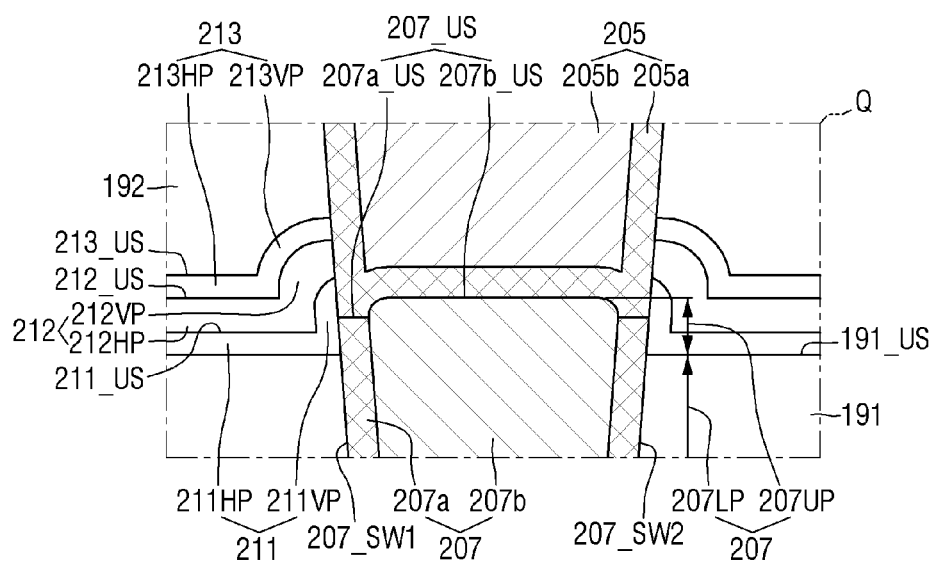
Figure 5:
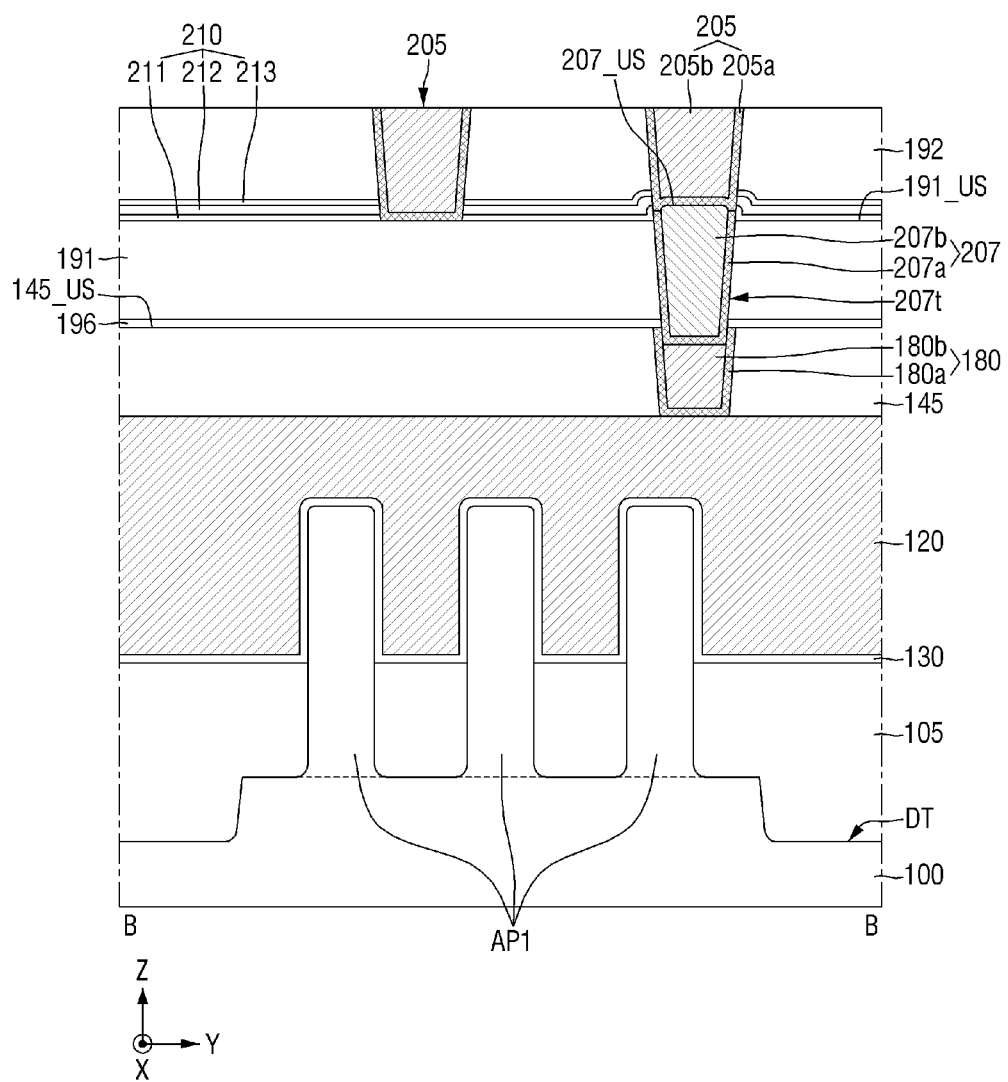
FIGS. 5 and 6 are exemplary cross-sectional views taken along lines B-B and C-C of FIG. 1.
Figure 6:
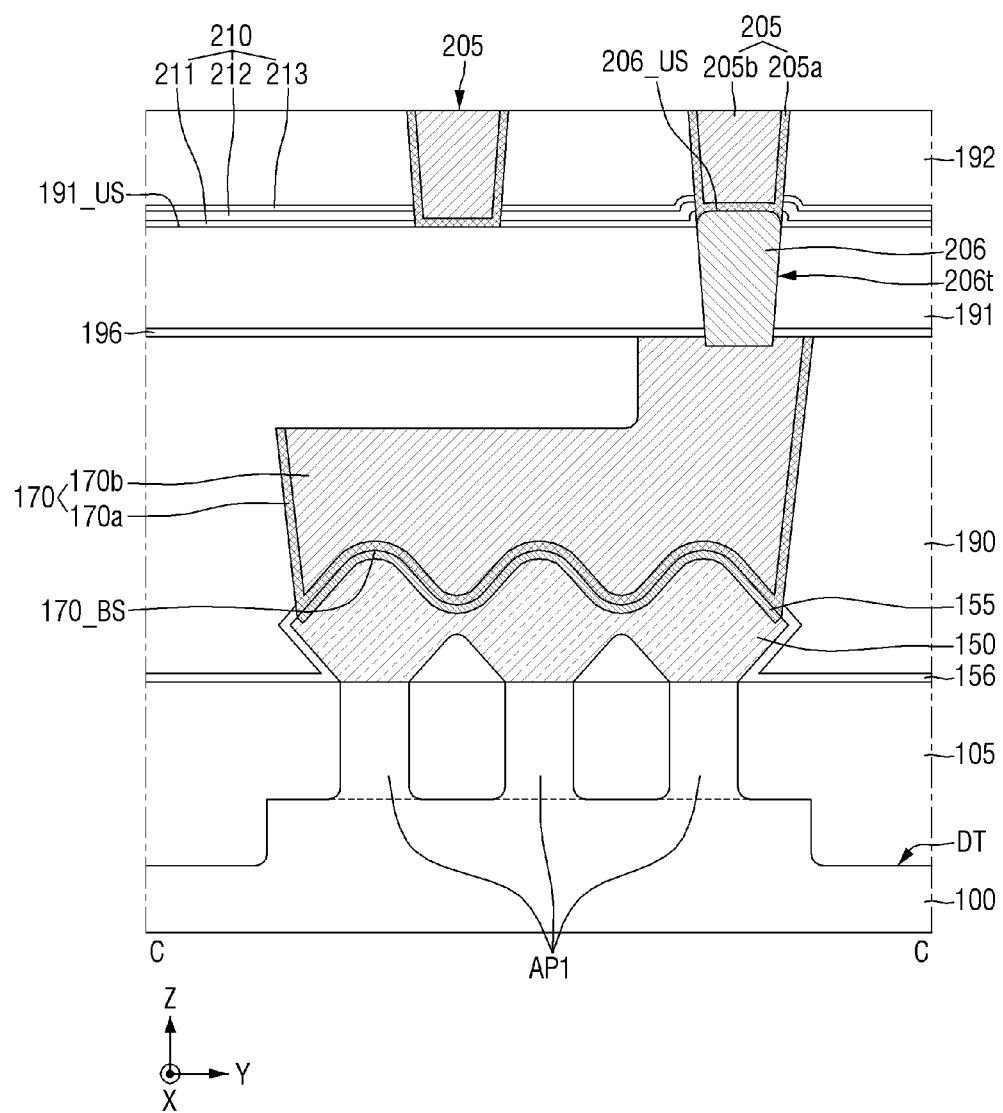

FIG. 1 is an exemplary layout diagram illustrating a semiconductor device according to some embodiments. FIG. 2 is an exemplary cross-sectional view taken along line A-A of FIG. 1. FIGS. 3 and 4 are enlarged views showing portion P and portion Q of FIG. 2. FIGS. 5 and 6 are exemplary cross-sectional views taken along lines B-B and C-C of FIG. 1. For convenience of explanation, a first via plug 206, a second via plug 207, and a wire line 205 are not illustrated in FIG. 1.

For reference, it is illustrated that the first via plug 206 and the second via plug 207 are disposed adjacent to each other in the first direction X on one first active pattern AP1. However, the arrangement of the first via plug 206 and the second via plug 207 is provided for convenience of description and is not limited thereto.

Referring to FIGS. 1 to 6, the semiconductor device according to some embodiments may include at least one first active pattern AP1, at least one second active pattern AP2, at least one first gate electrode 120, a first source/drain contact 170, a second source/drain contact 270, a first gate contact 180, a first via plug 206, a second via plug 207, and a wire line 205. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

A substrate 100 may include a first active region RX1, a second active region RX2, and a field region FX. The field region FX may be formed immediately adjacent to the first active region RX1 and the second active region RX2. The field region FX may form a boundary with the first active region RX1 and the second active region RX2.

The first active region RX1 and the second active region RX2 are spaced apart from each other. The first active region RX1 and the second active region RX2 may be separated by the field region FX.

An element isolation layer may be disposed around the first active region RX1 and the second active region RX2 spaced apart from each other. In this case, a portion of the element isolation layer between the first active region RX1 and the second active region RX2 may be the field region FX. For example, a portion in which a channel region of a transistor, which may be an example of a semiconductor device, is formed may be an active region, and a portion that divides a channel region of a transistor that is formed in the active region may be a field region. Alternatively, the active region may be a portion in which a fin-shaped pattern or a nanosheet, which is used as a channel region of a transistor, is formed, and the field region may be a region in which a fin-shaped pattern or a nanosheet used as a channel region is not formed.

Referring to FIGS. 5 and 6, the field region FX may be defined by a deep trench DT, but is not limited thereto. In addition, the field region FX may be distinguished from the first and second active regions RX1 and RX2 based on other properties or characteristics.

In one example, one of the first active region RX1 and the second active region RX2 may be a PMOS forming region, and the other one may be an NMOS forming region. In another example, the first active region RX1 and the second active region RX2 may be PMOS forming regions. In still another example, the first active region RX1 and the second active region RX2 may be NMOS forming regions.

The substrate 100 may be a silicon substrate or silicon-on-insulator (SOI) substrate. Alternatively, the substrate 100 may be or may include silicon germanium, silicon germanium on insulator (SGOI), indium antimonide, a lead tellurium compound, indium arsenide, indium phosphide, gallium arsenide, or gallium antimonide, but the composition of the substrate 100 is not limited thereto.

At least one first active pattern AP1 may be formed in the first active region RX1. The first active pattern AP1 may protrude from the substrate 100 of the first active region RX1. The first active pattern AP1 may be elongated on the substrate 100 along the first direction X. For example, the first active pattern AP1 may include a long side extending in the first direction X and a short side extending in the second direction Y. A length of the long side in the first direction X is greater than a length of the short side in the second direction Y. Here, the first direction X may cross the second direction Y and the third direction Z. In addition, the second direction Y may cross the third direction Z. The third direction Z may be a thickness direction of the substrate 100, and may be referred to as a vertical direction. Each of the first direction X, the second direction Y, and the third direction Z may be perpendicular to each other direction of the first direction X, the second direction Y, and the third direction Z.

At least one second active pattern AP2 may be formed in the second active region RX2. The description of the second active pattern AP2 may be substantially the same as the description of the first active pattern AP1.

Each of the first active pattern AP1 and the second active pattern AP2 may be a multi-channel active pattern. In the semiconductor device according to some embodiments, each of the first active pattern AP1 and the second active pattern AP2 may be, for example, a fin-shaped pattern. Each of the first active pattern AP1 and the second active pattern AP2 may be used as a channel region of a transistor. Although each of the first active pattern AP1 and the second active pattern AP2 is shown to include three active patterns for simplicity of description, the present disclosure is not limited thereto. Each of the first active pattern AP1 and the second active pattern AP2 may be one or more active patterns.

Each of the first and second active patterns AP1 and AP2 may be a part of the substrate 100 or may include an epitaxial layer grown from the substrate 100. To cover both of these possibilities, each of the first and second active patterns AP1 and AP2 may be described as being provided with the substrate. The first and second active patterns AP1 and AP2 may include or may be, for example, silicon or germanium, which is an elemental semiconductor material. In addition, each of the first active pattern AP1 and the second active pattern AP2 may include or may be a compound semiconductor, for example, a group IV-IV compound semiconductor or a group III-V compound semiconductor.

The group IV-IV compound semiconductor may be a binary compound or a ternary compound including at least two elements selected from the group consisting of carbon (C), silicon (Si), germanium (Ge) and tin (Sn), or the above-mentioned compound doped with a group IV element.

The group III-V compound semiconductor may be, for example, a binary compound, a ternary compound or a quaternary compound formed by combining at least one of aluminum (Al), gallium (Ga) and indium (In) which are group III elements with one of phosphorus (P), arsenic (As) and antimonium (Sb) which are group V elements.

As one example, the first active pattern AP1 and the second active pattern AP2 may include or may be formed of the same material. For example, each of the first active pattern AP1 and the second active pattern AP2 may be a silicon fin-shaped pattern. Alternatively, for example, each of the first active pattern AP1 and the second active pattern AP2 may be a fin-shaped pattern formed of a silicon-germanium pattern. As another example, the first active pattern AP1 and the second active pattern AP2 may include different materials from each other. For example, the first active pattern AP1 may be a silicon fin-shaped pattern, and the second active pattern AP2 may be a fin-shaped pattern including a silicon-germanium pattern.

A field insulating layer 105 may be formed on the substrate 100. The field insulating layer 105 may be formed over the first active region RX1, the second active region RX2, and the field region FX. The field insulating layer 105 may fill the deep trench DT.

The field insulating layer 105 may be formed on a portion of the sidewall of the first active pattern AP1 and a portion of the sidewall of the second active pattern AP2, for example, to contact a portion of the sidewall of the first active pattern AP1 and a portion of the sidewall of the second active pattern AP2. Each of the first active pattern AP1 and the second active pattern AP2 may protrude above the top surface of the field insulating layer 105. The field insulating layer 105 may include, for example, an oxide layer, a nitride layer, an oxynitride layer, or a combination layer thereof. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

At least one gate structure GS may be disposed on the substrate 100. For example, at least one gate structure GS may be disposed on the field insulating layer 105. The gate structure GS may extend lengthwise in the second direction Y. An item, layer, or portion of an item or layer described as extending "lengthwise" in a particular direction has a length in the particular direction and a width perpendicular to that direction, where the length is greater than the width. The adjacent gate structures GS may be spaced apart in the first direction X.

The gate structure GS may be disposed on and may contact the first active pattern AP1 and the second active pattern AP2. The gate structure GS may intersect the first active pattern AP1 and the second active pattern AP2.

Although the gate structure GS is illustrated to be disposed over the first active region RX1 and the second active region RX2, this is only for convenience of description and is not limited thereto. For example, some of the gate structures GS may be separated into two portions by a gate isolation structure disposed on the field insulating layer 105 and may be disposed on the first active region RX1 and the second active region RX2.

The gate structure GS may include, for example, the first gate electrode 120, a first gate insulating layer 130, a first gate spacer 140, and a first gate capping pattern 145.

The first gate electrode 120 may be formed on the first active pattern AP1 and the second active pattern AP2. The first gate electrode 120 may intersect the first active pattern AP1 and the second active pattern AP2. The first gate electrode 120 may wrap around the first active pattern AP1 and the second active pattern AP2 protruding from the top surface of the field insulating layer 105, for example, to cover three surfaces (e.g., a top surface and two side surfaces) of the first active pattern AP1 and the second active pattern AP2. The first gate electrode 120 may include a long side extending in the second direction Y and a short side extending in the first direction X.

A top surface 120US of the first gate electrode 120 may be a concave curved surface recessed toward the top surface of the first active pattern AP1, but is not limited thereto. That is, unlike the illustrated example, the top surface 120US of the first gate electrode 120 may be a flat plane.

The first gate electrode 120 may include or may be, for example, at least one selected from the group consisting of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and a combination thereof.

The first gate electrode 120 may include or may be conductive metal oxide, conductive metal oxynitride or the like, and may include an oxidized form of the aforementioned material.

The first gate spacer 140 may be disposed on the sidewall of the first gate electrode 120. The first gate spacer 140 may extend in the second direction Y. The first gate spacer 140 may include, for example, at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC) or a combination thereof.

A first gate insulating layer 130 may extend along the sidewall and the bottom surface of the first gate electrode 120. The first gate insulating layer 130 may be formed on the first active pattern AP1, the second active pattern AP2, and the field insulating layer 105 and may contact each of the first active pattern AP1, the second active pattern AP2, and the field insulating layer 105. The first gate insulating layer 130 may be formed between the first gate electrode 120 and the first gate spacer 140.

The first gate insulating layer 130 may be formed along a profile of the first active pattern AP1 protruding above the field insulating layer 105 and the top surface of the field insulating layer 105. Although not illustrated, an interface layer may be further formed along the profile of the first active pattern AP1 protruding above the field insulating layer 105. Each of the first gate insulating layers 130 may be formed on the interface layer. Although not illustrated, the first gate insulating layer 130 may be formed along a profile of the second active pattern AP2 protruding above the field insulating layer 105.

The first gate insulating layer 130 may include or may be silicon oxide, silicon oxynitride, silicon nitride, or a high-k material having a higher dielectric constant than silicon oxide. The high-k material may include, for example, at least one selected from the group consisting of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The semiconductor device according to some embodiments may include a negative capacitor (NC) FET using a negative capacitor (NC). For example, the first gate insulating layer 130 may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series and the capacitance of each capacitor has a positive value, the total capacitance becomes smaller than the capacitance of each capacitor. On the other hand, when at least one of the capacitances of two or more capacitors connected in series has a negative value, the total capacitance may have a positive value and may be greater than the absolute value of each capacitance.

When a ferroelectric material layer having a negative capacitance and a paraelectric material layer having a positive capacitance are connected in series, the total capacitance value of the ferroelectric material layer and the paraelectric material layer connected in series may increase. By using the principle that the total capacitance value is increased, the transistor containing the ferroelectric material layer may have a subthreshold swing (SS) lower than or equal to a threshold voltage lower than 60 mV/decade at room temperature.

The ferroelectric material layer may have ferroelectric properties. The ferroelectric material layer may include or may be formed of, for example, at least one of hafnium oxide, hafnium zirconium oxide, barium strontium titanium oxide, barium titanium oxide, or lead zirconium titanium oxide. In this case, as one example, the hafnium zirconium oxide may be a material containing hafnium oxide doped with zirconium (Zr). As another example, the hafnium zirconium oxide may be a compound of hafnium (Hf), zirconium (Zr), and oxygen (O).

The ferroelectric material layer may further include a dopant doped therein. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material layer may vary depending on which ferroelectric material is included in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al), or yttrium (Y).

When the dopant is aluminum (Al), the ferroelectric material layer may include 3 to 8 atomic percent (at %) of aluminum. In this case, the ratio of the dopant may be a ratio of aluminum to the sum of hafnium and aluminum.

When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may include 1 to 7 at % of gadolinium. When the dopant is zirconium (Zr), the ferroelectric material layer may include 50 to 80 at % of zirconium.

The paraelectric material layer may have paraelectric properties. The paraelectric material layer may include or be formed of, for example, at least one of silicon oxide or metal oxide having a high dielectric constant. The metal oxide included in the paraelectric material layer may be, for example, at least one of hafnium oxide, zirconium oxide, or aluminum oxide, but is not limited thereto.

The ferroelectric material layer and the paraelectric material layer may include or be formed of the same material. The ferroelectric material layer may have ferroelectric properties, but the paraelectric material layer may not have ferroelectric properties. For example, when the ferroelectric material layer and the paraelectric material layer include hafnium oxide, the crystal structure of the hafnium oxide included in the ferroelectric material layer may be different from the crystal structure of the hafnium oxide included in the paraelectric material layer.

The ferroelectric material layer may have a thickness that exhibits ferroelectric properties. The thickness of the ferroelectric material layer may be, for example, in a range of 0.5 to 10 nm, but is not limited thereto. Since a critical thickness at which each ferroelectric material exhibits ferroelectric properties may be different, the thickness of the ferroelectric material layer may vary depending on the ferroelectric material.

In one example, the first gate insulating layer 130 may have only one ferroelectric material layer. In another example, the first gate insulating layer 130 may include a plurality of ferroelectric material layers spaced apart from each other. The first gate insulating layer 130 may have a laminated layer structure in which a plurality of ferroelectric material layers and a plurality of paraelectric material layers are alternately laminated.

The first gate capping pattern 145 may be disposed on the top surface 120US of the first gate electrode and the top surface of the first gate spacer 140. The first gate capping pattern 145 may include or be formed of, for example, at least one of silicon nitride (SiN), silicon oxynitride (SiON), silicon oxide (SiO$_2$), silicon carbonitride (SiCN), silicon oxycarbonitride (SiOCN), or a combination thereof.

Unlike the illustrated example, the first gate capping pattern 145 may be disposed between the first gate spacers 140. In this case, the top surface 145_US of the first gate capping pattern may be on the same plane as the top surface of the first gate spacer 140. A top surface 145_US of the first gate capping pattern may be the top surface of the gate structure GS.

A first source/drain pattern 150 may be formed on the first active pattern AP1. The first source/drain pattern 150 may be positioned on the substrate 100. The first source/drain pattern 150 may be disposed on the side surface of the gate structure GS. The first source/drain pattern 150 may be disposed between the gate structures GS.

For example, the first source/drain patterns 150 may be disposed on both (e.g., opposite) sides of the gate structure GS. Unlike the illustrated example, the first source/drain pattern 150 may be disposed on one side of the gate structure GS and may not be disposed on the other side of the gate structure GS.

The first source/drain pattern 150 may include or may be an epitaxial pattern. The first source/drain pattern 150 may be included in a source/drain of a transistor using the first active pattern AP1 as a channel region.

The first source/drain pattern 150 may be connected to a channel pattern portion used as a channel among the first active patterns AP1. The first source/drain pattern 150 is illustrated as merging of three epitaxial patterns formed on the respective first active patterns AP 1. However, this is merely for simplicity of description and the present disclosure is not limited thereto. For example, epitaxial patterns formed on the respective first active patterns AP1 may be separated from each other.

For example, an air gap may be disposed in a space between the first source/drain patterns 150 combined with the field insulating layer 105. As another example, an insulating material may be filled in a space between the first source/drain patterns 150 combined with the field insulating layer 105.

Although not shown, a source/drain pattern as described above may be disposed on the second active pattern AP2 between the gate structures GS.

A lower etch stop layer 156 may be disposed on the top surface of the field insulating layer 105, a sidewall of the gate structure GS, the top surface of the first source/drain pattern 150, and a sidewall of the first source/drain pattern 150. The lower etch stop layer 156 may include a material having an etch selectivity with respect to the first interlayer insulating layer 190 to be described later. The lower etch stop layer 156 may include or may be formed of, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), or a combination thereof. Unlike the illustrated example, in some embodiments, the lower etch stop layer 156 may not be formed.

The first interlayer insulating layer 190 may be formed on the field insulating layer 105. The first interlayer insulating layer 190 may be disposed on the first source/drain pattern 150. The first interlayer insulating layer 190 may not cover the top surface of the first gate capping pattern 145_US. For example, the top surface of the first interlayer insulating layer 190 may be on the same plane as the top surface 145_US of the first gate capping pattern.

The first interlayer insulating layer 190 may include or be formed of, for example, at least one of silicon oxide, silicon nitride, silicon oxynitride, or a low-k material. The low-k material may include, for example, fluorinated tetraethyl-orthosilicate (FTEOS), hydrogen silsesquioxane (HSQ), bisbenzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazene (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, but is not limited thereto.

The first source/drain contact 170 may be disposed on the first active region RX1. The second source/drain contact 270 may be disposed on the second active region RX2. The first source/drain contact 170 may be connected to the first source/drain pattern 150 formed in the first active region RX1. Although not illustrated, the second source/drain contact 270 may be connected to the source/drain pattern formed in the second active region RX2.

Unlike the illustrated example, some of the first source/drain contacts 170 may be directly connected to a portion of the second source/drain contact 270. For example, in the semiconductor device according to some embodiments, at least one source/drain contact may be disposed to extend continuously over the first active region RX1 and the second active region RX2.

Since the matters related to the second source/drain contact 270 are substantially the same as those related to the first source/drain contact 170, the following description will be made using the first source/drain contact 170 on the first active pattern AP1.

The first gate contact 180 may be disposed in the gate structure GS. It may be connected to the first gate electrode 120 included in the gate structure GS.

The first gate contact 180 may be disposed in a position overlapping the gate structure GS. In the semiconductor device according to some embodiments, at least a portion of the first gate contact 180 may be disposed in a position overlapping at least one of the first active region RX1 or the second active region RX2.

For example, in plan view, the first gate contact 180 may be entirely disposed in a position overlapping the first active region RX1 or the second active region RX2.

The first source/drain contact 170 may pass through the lower etch stop layer 156 and may be connected to the first source/drain pattern 150. The first source/drain contact 170 may be disposed on the first source/drain pattern 150.

The first source/drain contact 170 may be disposed at least in part in the first interlayer insulating layer 190. For example, a portion of the first source/drain contact 170 may be surrounded by the first interlayer insulating layer 190, and from a plan view, the first interlayer insulating layer 190 may surround the first source/drain contact 170.

Although the first source/drain contact 170 is illustrated not to be in contact with the gate structures GS disposed on both sides thereof, this is only for convenience of description and is not limited thereto. Unlike the illustrated example, the first source/drain contact 170 may contact at least one of the gate structures GS disposed on opposite sides thereof.

A silicide layer 155 may be formed between the first source/drain contact 170 and the first source/drain pattern 150. The silicide layer 155 is illustrated to be formed along a profile of a boundary surface between the first source/drain pattern 150 and the first source/drain contact 170, but is not limited thereto. The silicide layer 155 may include or may be, for example, a metal silicide material.

The first source/drain contact 170 may include a first portion and a second portion. The first portion of the first source/drain contact 170 may be directly connected to the second portion of the first source/drain contact 170.

The second portion of the first source/drain contact 170 is a portion on which the first via plug 206 is landed. The first source/drain contact 170 may be connected to the wire line 205 through the second portion of the first source/drain contact 170. The first portion of the first source/drain contact 170 is not a portion on which the first via plug 206 is landed.

For example, in the cross-sectional view of FIG. 2, the second portion of the first source/drain contact 170 may be positioned at a portion directly connected to the first via plug 206. The first portion of the first source/drain contact 170 may be positioned at a portion not directly connected to the first via plug 206. For example, the first portion of the first source/drain contact 170 may be a bottom portion or may include only a bottom portion, and the second portion of the first source/drain contact 170 may be a top portion or may include a top portion.

In addition, in order to prevent contact between the first gate contact 180 and the first source/drain contact 170, on both sides (e.g., opposite sides) of the gate structure GS whose portions are connected to the first gate contact 180, the first portion of the first source/drain contact 170 may be positioned, and the second portion of the first source/drain contact 170 may not be positioned (e.g., may be omitted). For example, in the cross-sectional view of FIG. 2, on both sides of the gate structure GS connected to the first gate contact 180, the first portion of the first source/drain contact 170 is positioned, and the second portion of the first source/drain contact 170 is not positioned.

The top surface of the second portion of the first source/drain contact 170 is higher than the top surface of the first portion of the first source/drain contact 170. In FIG. 6, the top surface of the second portion of the first source/drain contact 170 is higher than the top surface of the first portion of the first source/drain contact 170, with respect to the top surface of the field insulating layer 105. For example, the top-most surface of the first source/drain contact 170 may be the top surface of the second portion of the first source/drain contact 170. Also, a single first source/drain contact 170 may be continuously formed, to have one portion that has a higher top surface than another portion.

In FIG. 6, the first source/drain contact 170 is illustrated to have an L shape, but is not limited thereto. Unlike the illustrated example, the first source/drain contact 170 may have a T shape rotated 180 degrees. In this case, the first portion of the first source/drain contact 170 may be disposed on both sides of the second portion of the first source/drain contact 170.

The first interlayer insulating layer 190 does not cover the top-most surface of the first source/drain contact 170. For example, the first interlayer insulating layer 190 may not cover the top surface of the second portion of the first source/drain contact 170. The top-most surface of the first source/drain contact 170 may be the top surface of the second portion of the first source/drain contact 170.

For example, the top surface of the first source/drain contact 170 may not protrude above the top surface 145_US of the first gate capping pattern. The top surface of the second portion of the first source/drain contact 170 may be on the same plane as the top surface 145_US of the gate structure. Unlike the illustrated example, as another example, the top surface of the first source/drain contact 170 may protrude above the top surface 145_US of the first gate capping pattern.

For example, a height H12 from the top surface of the first active pattern AP1 to the top surface 120US of the first gate electrode may be greater than a height H11 from the top surface of the first active pattern AP1 to the top surface of the first portion of the first source/drain contact 170. When the top surface 120US of the first gate electrode has a concave shape in the cross-sectional view, the height of the top surface 120US of the gate electrode may be with respect to a portion closest to the top surface of the first active pattern AP1.

The first source/drain contact 170 may include a first source/drain barrier layer 170a and a first source/drain filling layer 170b on the first source/drain barrier layer 170a. The first source/drain barrier layer 170a may extend along a sidewall and the bottom surface of the first source/drain filling layer 170b.

A bottom surface 170_BS of the first source/drain contact is illustrated as having a wavy shape, but is not limited thereto. Unlike the illustrated example, the bottom surface 170_BS of the first source/drain contact may have a flat shape.

The first source/drain barrier layer 170a may include or may be at least one of, for example, tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), or a two-dimensional (2D) material. In the semiconductor device according to some embodiments, the 2D material may be a metallic material and/or a semiconductor material. The 2D material may include a 2D allotrope or a 2D compound. For example, it may be or include at least one of graphene, molybdenum disulfide ($MoS_2$), molybdenum diselenide ($MoSe_2$), tungsten diselenide ($WSe_2$), or tungsten disulfide ($WS_2$), but is not limited thereto. Since the above-mentioned 2D materials are merely examples, the 2D materials that may be included in the semiconductor device of the present disclosure are not limited thereto.

The first source/drain filling layer 170b may include or may be at least one of, for example, aluminum (Al), tungsten (W), cobalt (Co), ruthenium (Ru), silver (Ag), gold (Au), manganese (Mn), or molybdenum (Mo).

The first gate contact 180 may be disposed on the first gate electrode 120. It may penetrate the first gate capping pattern 145 and may be connected to the first gate electrode 120.

For example, the top surface of the first gate contact 180 may be on the same plane as the top surface 145_US of the first gate capping pattern. Unlike the illustrated example, as another example, the top surface of the first gate contact 180 may protrude above the top surface 145_US of the first gate capping pattern.

The first gate contact 180 may include a gate barrier layer 180a and a gate filling layer 180b on the gate barrier layer 180a. The description of the material included in the gate barrier layer 180a and the gate filling layer 180b may be the same as the description of the first source/drain barrier layer 170a and the first source/drain filling layer 170b.

A second interlayer insulating layer 191 may be disposed on the first interlayer insulating layer 190 and the gate structure GS. The second interlayer insulating layer 191 may include a first via hole 206t and a second via hole 207t. The first via hole 206t may expose the first source/drain contact 170. The second via hole 207t may expose the first gate contact 180.

An upper etch stop layer 196 may be disposed between the first interlayer insulating layer 190 and the second interlayer insulating layer 191. The upper etch stop layer 196 may be disposed on the first gate capping pattern 145, the first gate contact 180, and the first source/drain contact 170.

The upper etch stop layer 196 may be or may include a material having an etch selectivity with respect to the second interlayer insulating layer 191. The upper etch stop layer 196 may be or include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), aluminum oxide (AlO), aluminum nitride (AlN) and aluminum oxycarbide (AlOC), or a combination thereof. Unlike the illustrated example, the upper etch stop layer 196 may not be formed.

The first via plug 206 and the second via plug 207 may be disposed in the second interlayer insulating layer 191. The first via plug 206 may pass through the upper etch stop layer 196 and may be connected to the first source/drain contact 170. The second via plug 207 may pass through the upper etch stop layer 196 and may be connected to the first gate contact 180. Although not illustrated, the first via plug 206 may be connected to the second source/drain contact 270.

The first via plug 206 may fill the first via hole 206t in the second interlayer insulating layer 191 and the upper etch stop layer 196. A portion of the first via plug 206 may protrude above a top surface 191_US of the second interlayer insulating layer.

The first via plug 206 may include a lower portion 206LP and an upper portion 206UP. The upper portion 206UP of the first via plug is a protrusion protruding in the third direction Z from the top surface 191_US of the second interlayer insulating layer.

In FIG. 3, the first via plug 206 includes a first sidewall 206_SW1 and a second sidewall 206_SW2 facing in the first direction X. In cross-sectional view, the first sidewall 206_SW1 of the first via plug may be a sidewall opposite to the second sidewall 206_SW2 of the first via plug. In the lower portion 206LP of the first via plug, the second interlayer insulating layer 191 covers the first sidewall 206_SW1 of the first via plug and the second sidewall 206_SW2 of the first via plug. In the upper portion 206UP of the first via plug, the second interlayer insulating layer 191 does not cover the first sidewall 206_SW1 of the first via plug and the second sidewall 206_SW2 of the first via plug.

The first via plug 206 includes a top surface 206_US disposed above the top surface 191_US of the second interlayer insulating layer. For example, the top surface 206_US of the first via plug may include a first curved portion 206_USC1 and a flat portion 206_USF. As a result, the top surface 206_US may be a convex curved surface in a direction away from a top surface of the substrate. In some embodiments, the flat portion 206_USF is also curved. For example, the flat portion 206_USF may be described as a central portion and the curved portions 206_USC1 may be described as edge portions or an edge portion (since in a plan view, the first via plug 206 may have a circular shape having a continuous edge). The central portion may have a radius of curvature smaller than a radius of curvature of the edge portions.

The bottom surface of the first via plug 206 may be lower than the top surface 145_US of the first gate capping pattern. For example, while the first via hole 206t is formed, a portion of the first source/drain contact 170 may be etched. Accordingly, a portion of the first via plug 206 may be indented into the first source/drain contact 170, or may protrude into the first source/drain contact 170. The first source/drain contact 170 may have a recess into which a portion of the first via plug 206 protrudes. Unlike the illustrated example, as another example, before forming the upper etch stop layer 196, a portion of the first source/drain contact 170 is etched, so that the top surface of the first source/drain contact 170 may be entirely made to be lower than the top surface 145_US of the first gate capping pattern.

In the semiconductor device according to some embodiments, the first via plug 206 may have a single layer structure. The first via plug 206 may have a structure formed of a single, continuous layer (e.g., with no grain boundaries formed therein). For example, the first via plug 206 may have a single conductive layer structure.

The first via plug 206 may be or may include, for example, tungsten (W). The first via plug 206 may have a single layer structure formed of tungsten. For example, the single layer may contact both the first source/drain contact 170 and the second interlayer insulating layer 191 and may fill the entire via hole 206t formed therebetween.

The second via plug 207 may fill the second via hole 207t in the second interlayer insulating layer 191 and the upper etch stop layer 196. A portion of the second via plug 207 may protrude above the top surface 191_US of the second interlayer insulating layer.

The second via plug 207 may include a second barrier conductive layer 207a and a second plug conductive layer 207b. The second barrier conductive layer 207a may extend along a sidewall of the second via hole 207t and a bottom surface of the second via hole 207t. The second barrier conductive layer 207a may extend along a sidewall and the bottom surface of the second plug conductive layer 207b.

In the semiconductor device according to some embodiments, the second via plug 207 may have a multilayer structure. For example, the second via plug 207 may have a conductive multilayer structure.

The second via plug 207 may include a lower portion 207LP and an upper portion 207UP. The upper portion 207UP of the second via plug is a protrusion protruding in the third direction Z from the top surface 191_US of the second interlayer insulating layer.

In FIG. 4, the second via plug 207 includes a first sidewall 207_SW1 and a second sidewall 207_SW2 facing in the first direction X. In cross-sectional view, the first sidewall 207_SW1 of the second via plug may be a sidewall opposite to the second sidewall 207_SW2 of the second via plug. In the lower portion 207LP of the second via plug, the second interlayer insulating layer 191 covers the first sidewall 207_SW1 of the second via plug and the second sidewall 207_SW2 of the second via plug. In the upper portion 207UP of the second via plug, the second interlayer insulating layer 191 does not cover the first sidewall 207_SW1 of the second via plug and the second sidewall 207_SW2 of the second via plug.

The second via plug 207 includes a top surface 207_US disposed above the top surface 191_US of the second interlayer insulating layer. The top surface 207_US of the second via plug includes a top surface 207a_US of the second barrier conductive layer and a top surface 207b_US of the second plug conductive layer. The top surface 207b_US of the second plug conductive layer may be defined by a portion protruding above the top surface 207a_US of the second barrier conductive layer. The top surface 207b_US of the second plug conductive layer may include a convex curved surface connected to the top surface 207a_US of the second barrier conductive layer.

A portion of the second plug conductive layer 207b is illustrated to protrude from the top surface 207a_US of the second barrier conductive layer, but is not limited thereto.

The first sidewall 207_SW1 of the second via plug and the second sidewall 207_SW2 of the second via plug are illustrated as being defined by the second barrier conductive layer 207a, but are not limited thereto. Unlike the illustrated example, a portion of the first sidewall 207_SW1 of the second via plug and a portion of the second sidewall 207_SW2 of the second via plug may include a sidewall of the second plug conductive layer 207b protruding above the top surface 207a_US of the second barrier conductive layer.

The bottom surface of the second via plug 207 may be lower than the top surface 145_US of the first gate capping pattern.

The second barrier conductive layer 207a may be or include, for example, at least one of tantalum (Ta), tantalum nitride (TaN), titanium (Ti), titanium nitride (TiN), titanium silicon nitride (TiSiN), nickel (Ni), nickel boron (NiB), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), or a two-dimensional (2D) material.

The second plug conductive layer 207b may be or include, for example, at least one of aluminum (Al), tungsten (W), cobalt (Co), ruthenium (Ru), copper (Cu), silver (Ag), gold (Au), manganese (Mn), or molybdenum (Mo). In the semiconductor device according to some embodiments, the second plug conductive layer 207b may be or may include the same material as the first via plug 206. The second plug conductive layer 207b may be or include tungsten.

The etch stop structure layer 210 is disposed on the second interlayer insulating layer 191. The etch stop structure layer 210 may include a plurality of layers sequentially stacked on the second interlayer insulating layer 191.

In the semiconductor device according to some embodiments, the etch stop structure layer 210 may include first to third etch stop layers 211, 212, and 213 sequentially stacked on the second interlayer insulating layer 191. The first etch stop layer 211 and the third etch stop layer 213 may include or may be formed of the same material. The first etch stop layer 211 and the third etch stop layer 213 may be, for example, metal oxide, such as aluminum oxide. The second etch stop layer 212 may be, for example, silicon oxycarbide (SiOC). Each of the first etch stop layer 211, the second etch stop layer 212, and the third etch stop layer 213 may be continuously formed to include both a horizontal portion and a vertical portion (described in more detail below).

The etch stop structure layer 210 may be in contact with the top surface 191_US of the second interlayer insulating layer. The first etch stop layer 211 may be in contact with the top surface 191_US of the second interlayer insulating layer.

The etch stop structure layer 210 may be in contact with the upper portion 207UP of the first via plug and the upper portion 207UP of the second via plug protruding above the top surface 191_US of the second interlayer insulating layer.

The first etch stop layer 211 may be in contact with the upper portion 206UP of the first via plug and the upper portion 207UP of the second via plug.

The etch stop structure layer 210 may be in contact with a sidewall of the upper portion 206UP of the first via plug and a sidewall of the upper portion 207UP of the second via plug. For example, in FIGS. 3 and 4, the first etch stop layer 211 may be in contact with the first sidewall 206_SW1 of the upper portion 206UP of the first via plug, the first sidewall 207_SW1 of the upper portion 207UP of the second via plug, and the second sidewall 207_SW2 of the upper portion 207UP of the second via plug.

The third interlayer insulating layer 192 is disposed on the etch stop structure layer 210. The third interlayer insulating layer 192 may be in contact with the etch stop structure layer 210. The third etch stop layer 213 may be in contact with the third interlayer insulating layer 192. The third interlayer insulating layer 192 may include or may be formed of, for example, at least one of silicon oxide, silicon nitride, silicon oxynitride, or a low-k material.

The wire line 205 may be disposed in the third interlayer insulating layer 192. The wire line 205 is connected to the first via plug 206. The wire line 205 is in contact with the first via plug 206. The wire line 205 is connected to the second via plug 207. The wire line 205 is in contact with the second via plug 207.

The wire line 205 may penetrate the etch stop structure layer 210 and may be in contact with the second interlayer insulating layer 191. A bottom surface 205_BS of the wire line may be in contact with the top surface 191_US of the second interlayer insulating layer.

In FIGS. 2 and 3, the wire line 205 connected to the first via plug 206 may extend in the first direction X. The wire line 205 may include a first portion 205_OL that vertically overlaps the top surface 206_US of the first via plug, and a second portion 205_NOL that does not vertically overlap the top surface 206_US of the first via plug. The first portion 205_OL of the wire line may overlap the top surface 206_US of the first via plug in the third direction Z. In the first portion 205_OL of the wire line, the bottom surface 205_BS of the wire line forms a boundary with the top surface 206_US of the first via plug. In the second portion 205_NOL of the wire line, the bottom surface 205_BS of the wire line forms a boundary with the top surface 191_US of the second interlayer insulating layer. For example, in the second portion 205_NOL of the wire line, the bottom surface 205_BS of the wire line is lower than the top surface 206_US of the first via plug.

Since the second portion 205_NOL of the wire line is in contact with the second interlayer insulating layer 191, the wire line 205 may be in contact with the second sidewall 206_SW2 of the upper portion 206UP of the first via plug. For example, in the upper portion 206UP of the first via plug, the first sidewall 206_SW1 of the first via plug may be in contact with the etch stop structure layer 210, and the second sidewall 206_SW2 of the first via plug may be in contact with the wire line 205. In the semiconductor device according to some embodiments, the bottom surface 205_BS of the wire line connected to the first via plug 206 does not protrude in the first direction X compared to the first sidewall 206_SW1 of the first via plug. In addition, in the semiconductor device according to some embodiments, the etch stop structure layer 210 does not extend along the top surface 206_US of the first via plug.

Around the first via plug 206 and the second via plug 207, each of the first to third etch stop layers 211, 212, and 213 is in contact with the sidewall of the wire line 205.

Around the first via plug 206 and the second via plug 207, the first etch stop layer 211 may include a horizontal portion 211HP extending along the top surface 191_US of the second interlayer insulating layer, and a vertical portion 211VP protruding in the third direction Z from the horizontal portion 211HP. The first etch stop layer 211 may be formed to have a uniform thickness along a profile of the top surface 191_US of the second interlayer insulating layer, the top portion 206UP of the first via plug, and the top portion 207UP of the second via plug. The thickness of the horizontal portion 211HP of the first etch stop layer may be the same as the thickness of the vertical portion 211VP of the first etch stop layer. The thickness of these portions may refer to a thickness in a direction perpendicular to a surface on which these layers are formed (e.g., where they are formed to conformally cover another layer).

The vertical portion 211VP of the first etch stop layer may include a portion forming 90 degrees with the horizontal portion 211HP of the first etch stop layer. Alternatively, the vertical portion 211VP of the first etch stop layer also may include a portion extending in the third direction Z while forming an acute angle with the horizontal portion 211HP of the first etch stop layer in a clockwise direction. The description of the vertical portion may be equally applied to the second etch stop layer 212 and the third etch stop layer 213.

The horizontal portion 211HP of the first etch stop layer is in contact with the top surface 191_US of the second interlayer insulating layer. The vertical portion 211VP of the first etch stop layer may extend along the first sidewall 206_SW1 of the first via plug, the first sidewall 207_SW1 of the second via plug, and the second sidewall 207_SW2 of the second via plug.

Around the first via plug 206 and the second via plug 207, the second etch stop layer 212 may include a horizontal portion 212HP extending along the top surface 191_US of the second interlayer insulating layer, and a vertical portion 212VP protruding in the third direction Z from the horizontal portion 212HP. The second etch stop layer 212 may be formed to have a uniform thickness along a top surface 211_US of the first etch stop layer. The thickness of the horizontal portion 212HP of the second etch stop layer may be the same as the thickness of the vertical portion 212VP of the second etch stop layer. The second etch stop layer 212 may be in contact with the top surface 211_US of the first etch stop layer.

Around the first via plug 206 and the second via plug 207, the third etch stop layer 213 may include a horizontal portion 213HP extending along the top surface 191_US of the second interlayer insulating layer, and a vertical portion 213VP protruding in the third direction Z from the horizontal portion 213HP. The third etch stop layer 213 may be formed to have a uniform thickness along a top surface 212_US of the second etch stop layer. The thickness of the horizontal portion 213HP of the third etch stop layer may be the same as the thickness of the vertical portion 213VP of the third etch stop layer. The third etch stop layer 213 may be in contact with the top surface 212_US of the second etch stop layer.

In the semiconductor device according to some embodiments, a top surface 213_US of the horizontal portion 213HP of the third etch stop layer is higher than the top surface 206_US of the first via plug, with respect to the top surface 191_US of the second interlayer insulating layer. For example, a height H22 from the top surface 191_US of the second interlayer insulating layer to the top surface 213_US of the horizontal portion 213HP of the third etch stop layer is greater than a height H21 of the top surface 206UP of the first via plug with respect to the top surface 191_US.

In a position other than the periphery of the first via plug 206 and the second via plug 207, each of the first to third etch stop layers 211, 212, and 213 does not include a vertical portion protruding in the third direction Z. For example, in a position other than the periphery of the first via plug 206 and the second via plug 207, each of the first to third etch stop layers 211, 212, and 213 may include a horizontal portion, only.

The wire line 205 may include a wire barrier layer 205a and a wire filling layer 205b. The wire barrier layer 205a may extend along the top surface 191_US of the second interlayer insulating layer, the top surface 206_US of the first via plug, and the top surface 207_US of the second via plug. The wire filling layer 205b may be disposed on the wire barrier layer 205a.

The wire barrier layer 205a may include or be formed of at least one of, for example, tantalum (Ta), tantalum nitride (TaN), titanium (Ti), titanium nitride (TiN), titanium silicon nitride (TiSiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), or a two-dimensional (2D) material. The wire filling layer 205b may include or be formed of at least one of, for example, aluminum (Al), copper (Cu), tungsten (W), cobalt (Co), ruthenium (Ru), silver (Ag), gold (Au), manganese (Mn), or molybdenum (Mo). Thus, each of the wire barrier layer 205a and the wire filling layer 205b may be formed of one or more conductive materials.

Although not illustrated, a first connection contact connecting the first via plug 206 to the first source/drain contact 170 may be further disposed between the first via plug 206 and the first source/drain contact 170. In addition, a second connection contact connecting the second via plug 207 to the first gate contact 180 may be further disposed between the second via plug 207 and the first gate contact 180.

The first etch stop layer 211 and the second etch stop layer 212 disposed below the top surface 206_US of the first via plug in the etch stop structure layer 210 may affect the capacitance of the first via plug 206. The third etch stop layer 213 disposed above the top surface 206_US of the first via plug in the etch stop structure layers 210 may affect the capacitance of the wire line 205. However, since the etch stop structure layer 210 is formed over the first via plug 206 and the wire line 205, the parasitic capacitance generated by the etch stop structure layer 210 is distributed over the first via plug 206 and the wire line 205. Through dispersion of the parasitic capacitance, the performance and reliability of the semiconductor device may be improved.

FIGS. 7 to 10 are diagrams each illustrating a semiconductor device according to some embodiments. For simplicity of description, the following description will focus on differences from the description with reference to FIGS. 1 to 6.

Figure 7:
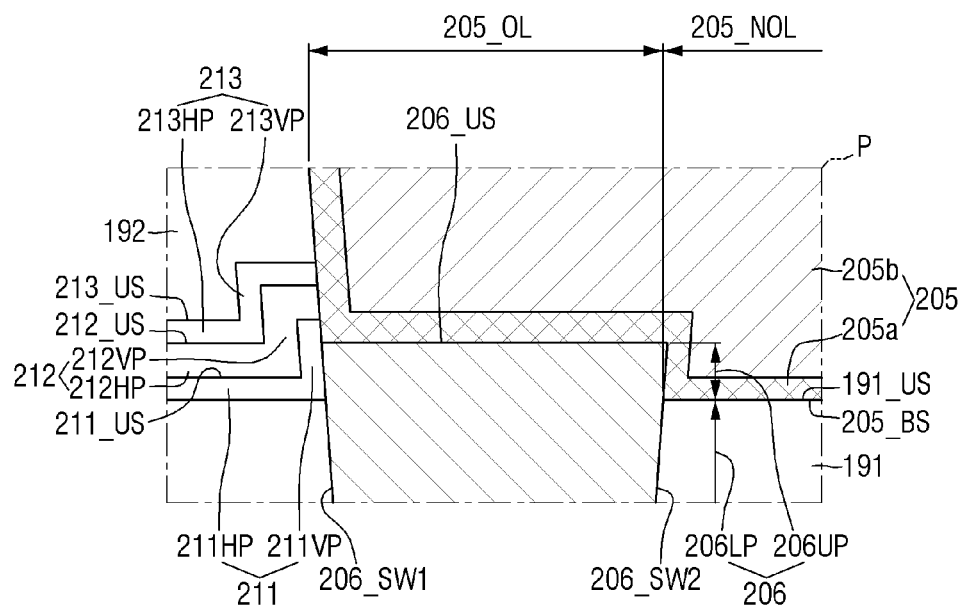
FIGS. 7 to 10 are diagrams each illustrating a semiconductor device according to some embodiments.

Referring to FIG. 7, in the semiconductor device according to some embodiments, the top surface 206_US of the first via plug includes a planar portion and does not include a first curved portion (206_USC1 in FIG. 3).

Although not illustrated, the shape of the etch stop structure layer 210 around the second via plug 207 may be similar to that of FIG. 7.

Figure 8:
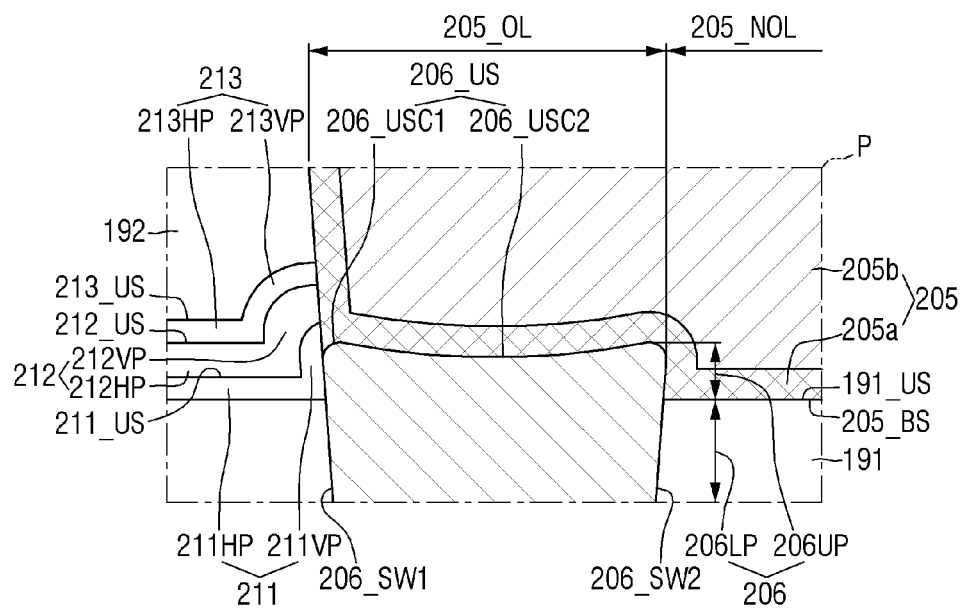

Referring to FIG. 8, in the semiconductor device according to some embodiments, the top surface 206_US of the first via plug may include the first curved portion 206_USC1 and a second curved portion 206_USC2.

The first curved portion 206_USC1 may be a convex curved surface, and the second curved portion 206_USC2 may be a concave curved surface.

Figure 9:
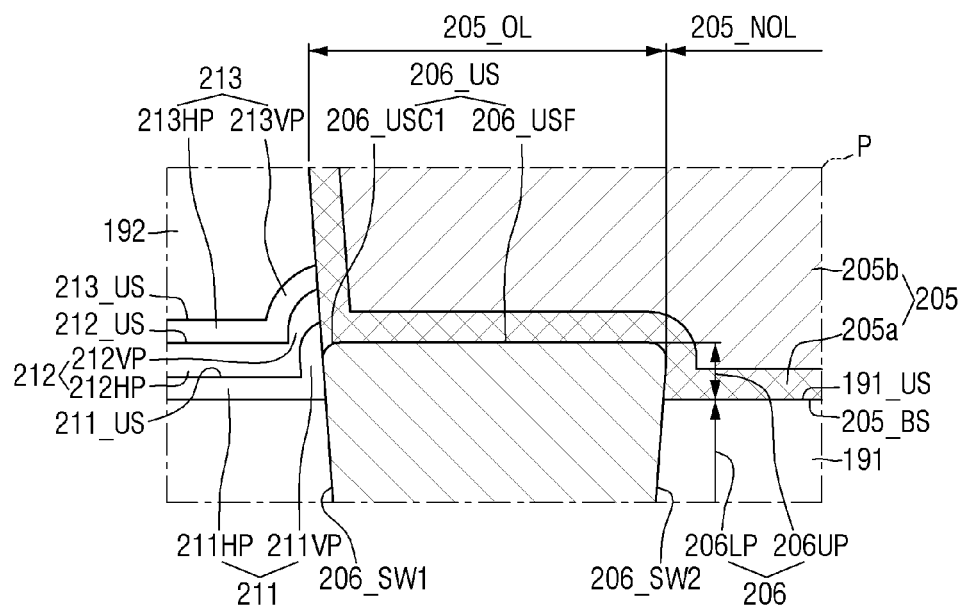

Referring to FIG. 9, in the semiconductor device according to some embodiments, the thickness of the horizontal portion 212HP of the second etch stop layer is greater than the thickness of the vertical portion 212VP of the second etch stop layer.

When the step coverage of the method of depositing the second etch stop layer 212 is not as good, the thickness of the vertical portion 212VP of the second etch stop layer formed along the vertical portion 211VP of the first etch stop layer becomes smaller.

Figure 10:
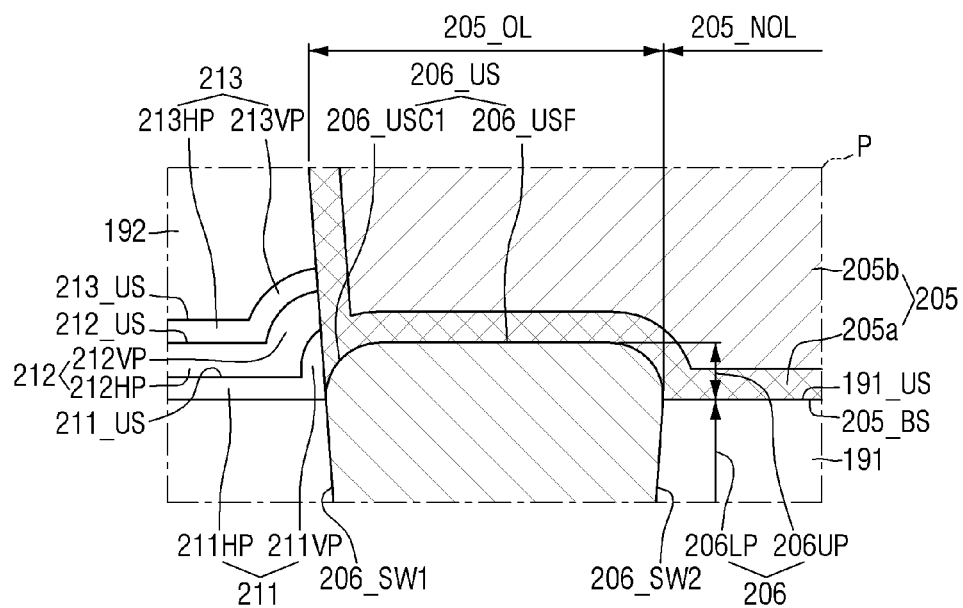

Referring to FIG. 10, in the semiconductor device according to some embodiments, an upper portion 206UP of the first via plug does not include a first sidewall 206_SW1 of the first via plug and a second sidewall 206_SW2 of the first via plug.

The first sidewall 206_SW1 of the first via plug and the second sidewall 206_SW2 of the first via plug do not protrude above the top surface 191_US of the second interlayer insulating layer.

FIGS. 11 to 14 are diagrams each illustrating a semiconductor device according to some embodiments. For simplicity of description, the following description will focus on differences from the description with reference to FIGS. 1 to 6.

Figure 11:
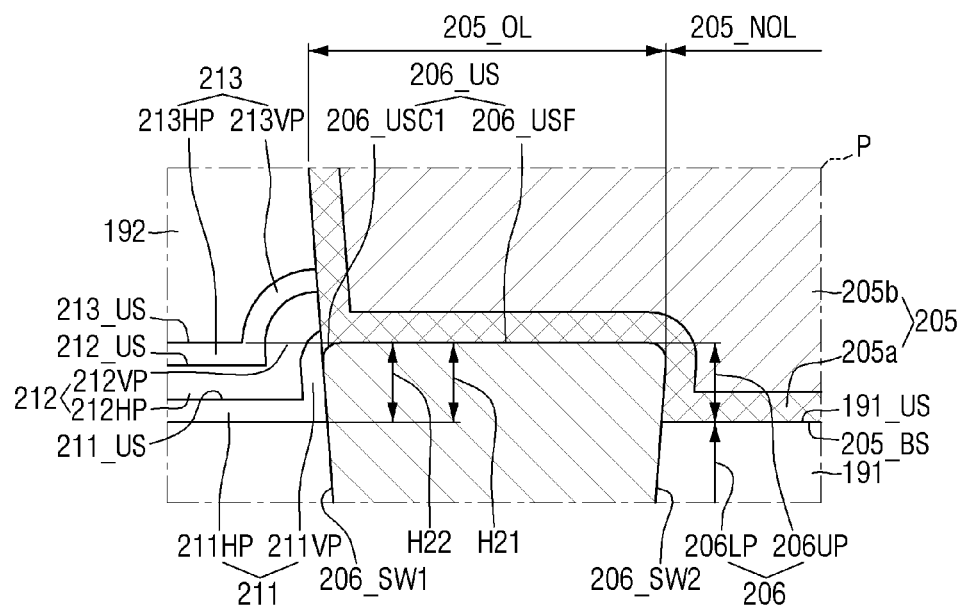
FIGS. 11 to 14 are diagrams each illustrating a semiconductor device according to some embodiments.

Referring to FIG. 11, in the semiconductor device according to some embodiments, the top surface 213_US of the horizontal portion 213HP of the third etch stop layer is lower than or equal to the top surface 206_US of the first via plug, with respect to the top surface 191_US of the second interlayer insulating layer.

For example, the height H22 from the top surface 191_US of the second interlayer insulating layer to the top surface 213_US of the horizontal portion 213HP of the third etch stop layer is smaller than or equal to the height H21 of the top surface 206UP of the first via plug.

Figure 12:
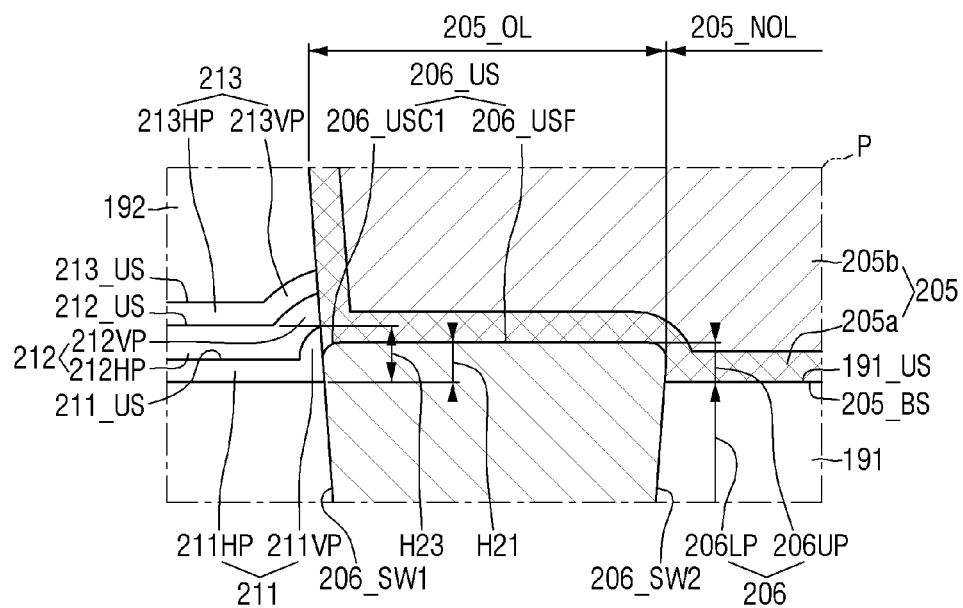

Referring to FIG. 12, in the semiconductor device according to some embodiments, the top surface 212_US of the horizontal portion 212HP of the second etch stop layer is higher than the top surface 206_US of the first via plug, with respect to the top surface 191_US of the second interlayer insulating layer.

For example, a height H23 from the top surface 191_US of the second interlayer insulating layer to the top surface 212_US of the horizontal portion 212HP of the second etch stop layer is greater than the height H21 of the top surface 206UP of the first via plug.

Figure 13:
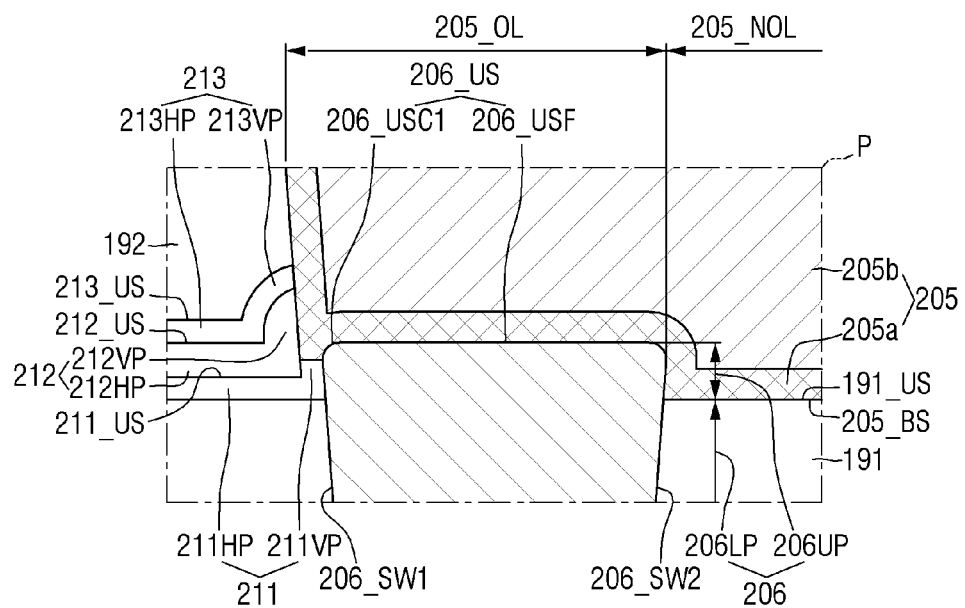

Referring to FIG. 13, in the semiconductor device according to some embodiments, the bottom surface 205_BS of the wire line connected to the first via plug 206 may protrude in the first direction X compared to the first sidewall 206_SW1 of the first via plug.

Figure 14:
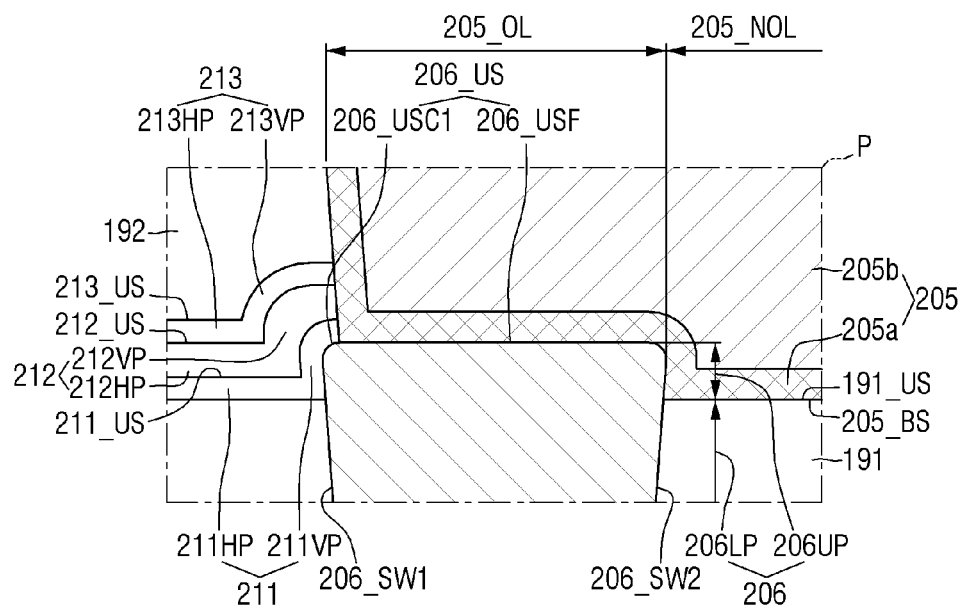

Referring to FIG. 14, in the semiconductor device according to some embodiments, the etch stop structure layer 210 may extend along the top surface 206_US of the first via plug.

The first etch stop layer 211 may be in contact with a portion of the top surface 206_US of the first via plug.

Figure 15:
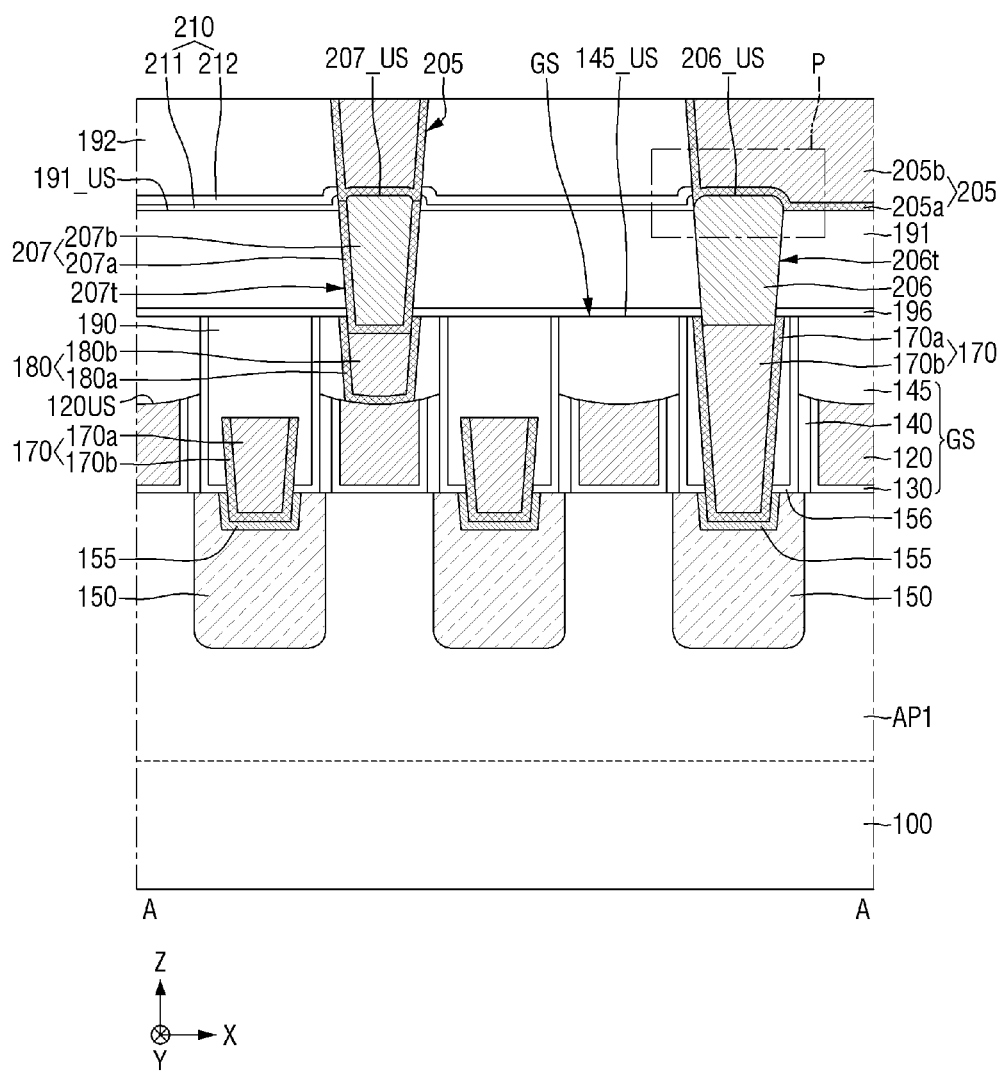
FIGS. 15 and 16 are diagrams illustrating a semiconductor device according to some embodiments.
Figure 16:
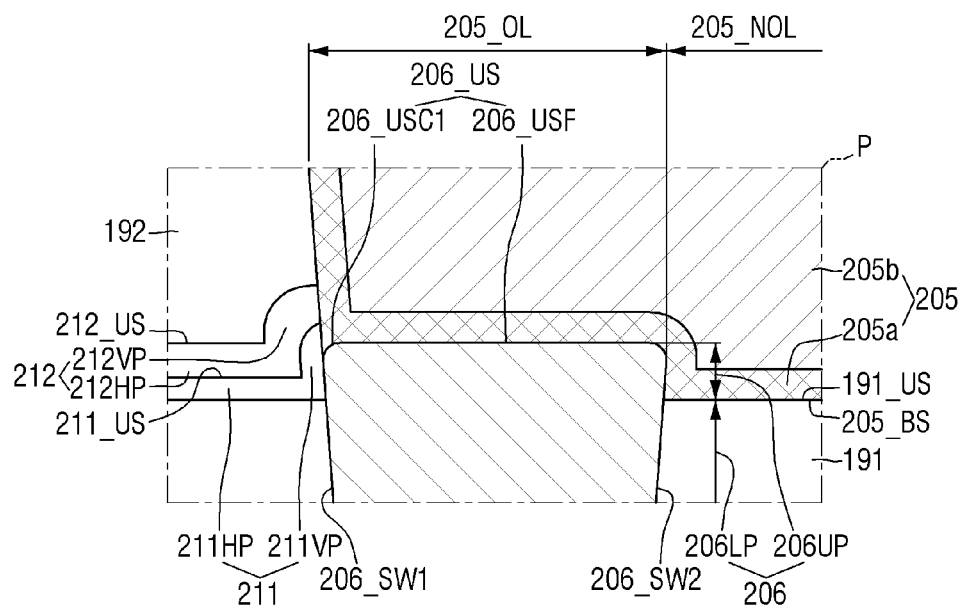

FIGS. 15 and 16 are diagrams illustrating a semiconductor device according to some embodiments. For simplicity of description, the following description will focus on differences from the description with reference to FIGS. 1 to 6.

Referring to FIGS. 15 and 16, in the semiconductor device according to some embodiments, the etch stop structure layer 210 may have a double layer structure.

The etch stop structure layer 210 may include the first etch stop layer 211 and the second etch stop layer 212. However, it does not include the third etch stop layer 213 in FIG. 2 including the same material as the first etch stop layer 211.

The second etch stop layer 212 may be in contact with the third interlayer insulating layer 192.

With respect to the top surface 191_US of the second interlayer insulating layer, the top surface 212_US of the horizontal portion 211HP of the first etch stop layer may be lower than the top surface 206_US of the first via plug.

FIGS. 17 to 20 are diagrams each illustrating a semiconductor device according to some embodiments. For simplicity of description, the following description will focus on differences from the description with reference to FIGS. 1 to 6.

Figure 17:
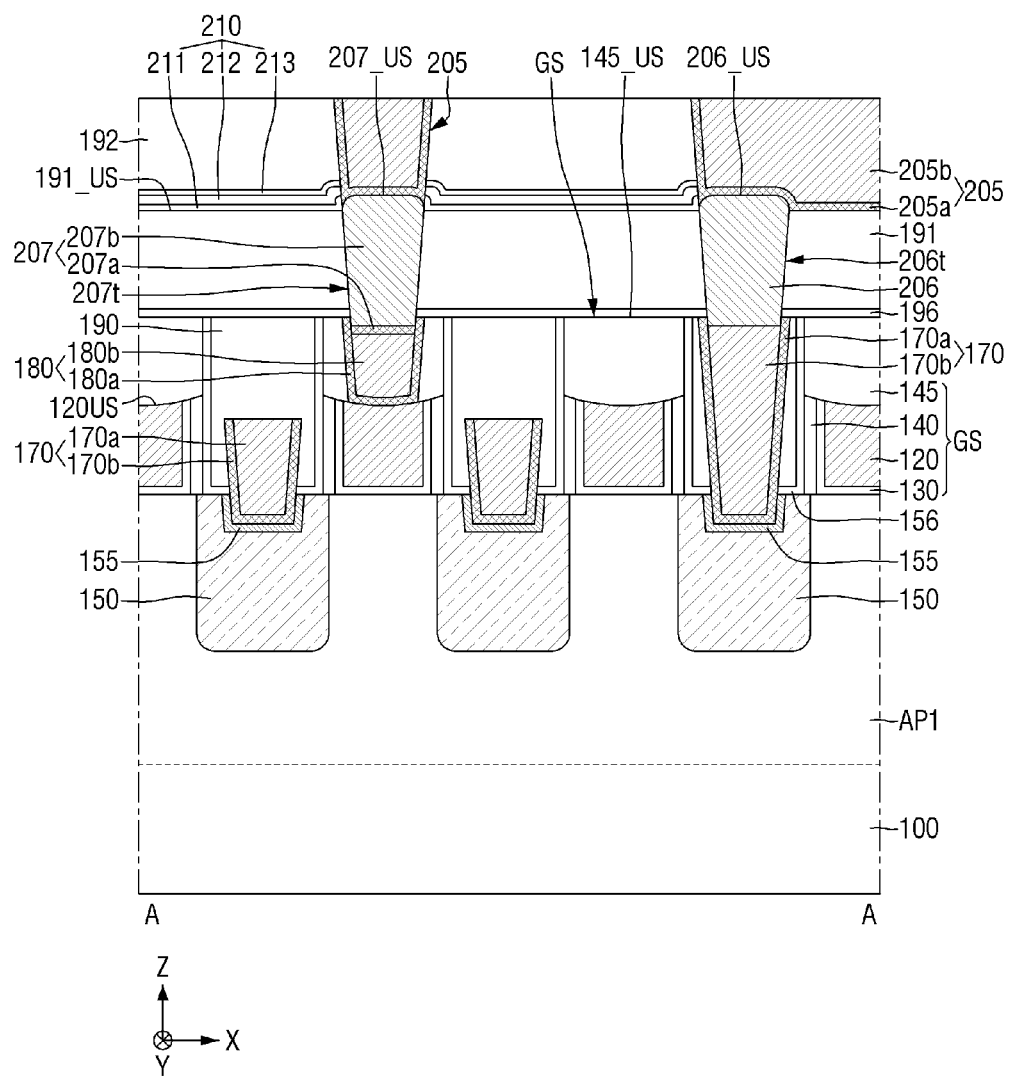
FIGS. 17 to 20 are diagrams each illustrating a semiconductor device according to some embodiments.

Referring to FIG. 17, in the semiconductor device according to some embodiments, the second barrier conductive layer 207a does not extend along the sidewall of the second plug conductive layer 207b.

The second barrier conductive layer 207a extends along the bottom surface of the second via hole 207t and does not extend along the sidewall of the second via hole 207t.

Figure 18:
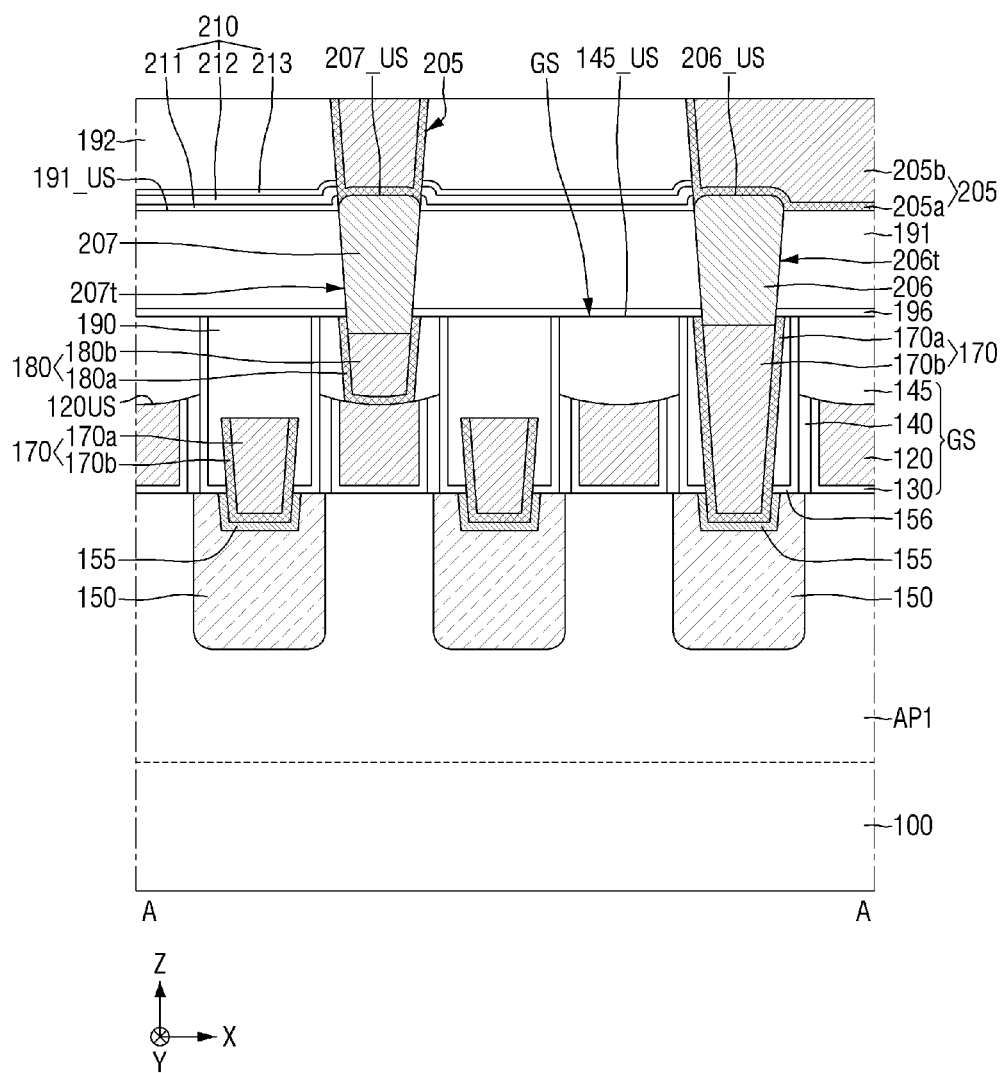

Referring to FIG. 18, in the semiconductor device according to some embodiments, the second via plug 207 may have a single layer structure.

The second via plug 207 may have a structure formed of a single layer. For example, the second via plug 207 may include the same conductive material as the first via plug 206. As another example, the second via plug 207 may include a conductive material different from that of the first via plug 206.

Figure 19:
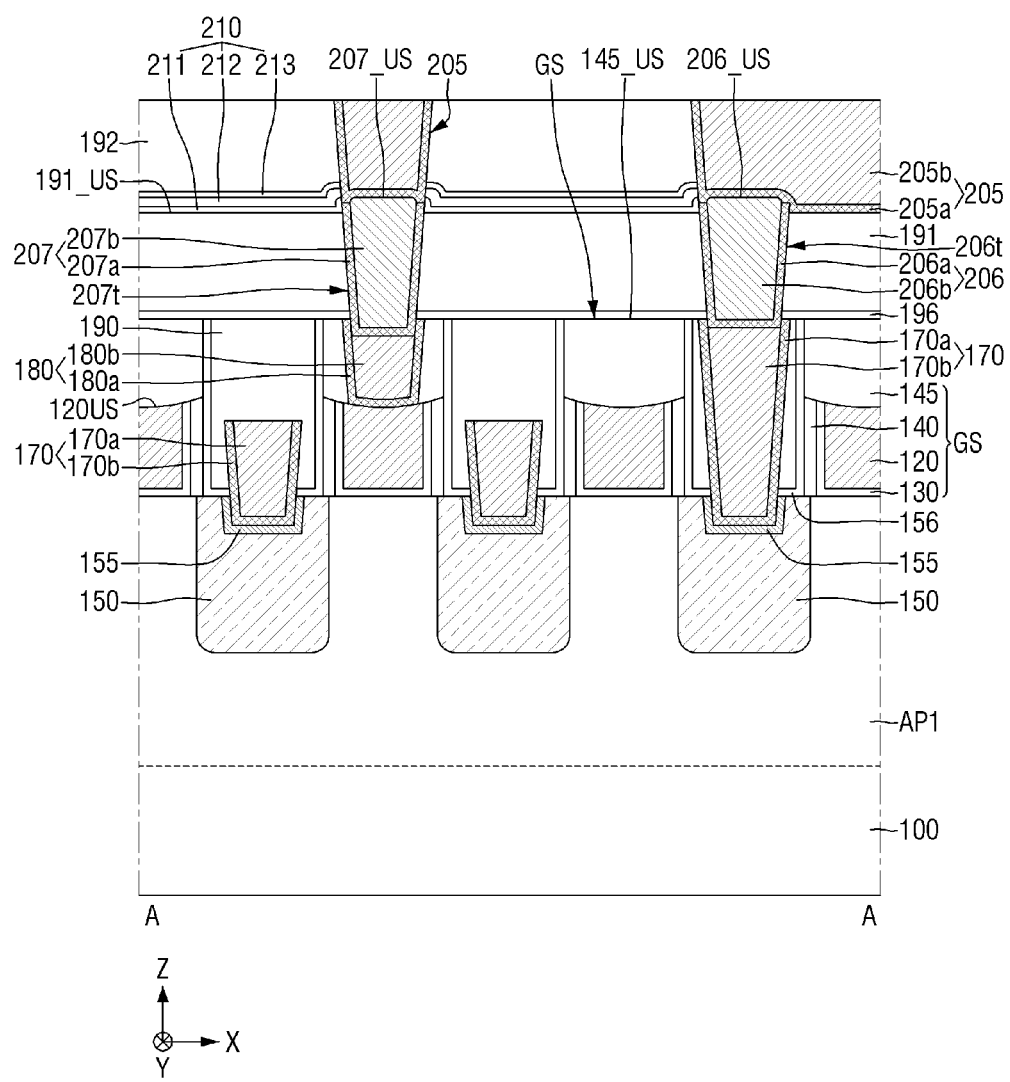

Referring to FIG. 19, in the semiconductor device according to some embodiments, the first via plug 206 may include a first barrier conductive layer 206a and a first plug conductive layer 206b.

The first barrier conductive layer 206a may extend along a sidewall of the first via hole 206t and a bottom surface of the first via hole 206t. The first barrier conductive layer 206a may extend along a sidewall and the bottom surface of the first plug conductive layer 206b.

The first via plug 206 may have a multilayer structure. That is, the first via plug 206 may have a conductive multilayer structure. The first barrier conductive layer 206a may be formed of or may include the same material as the second barrier conductive layer 207a, or may include a different material. The first plug conductive layer 206b may be formed of or may include the same material as the second plug conductive layer 207b, or may include a different material.

Figure 20:
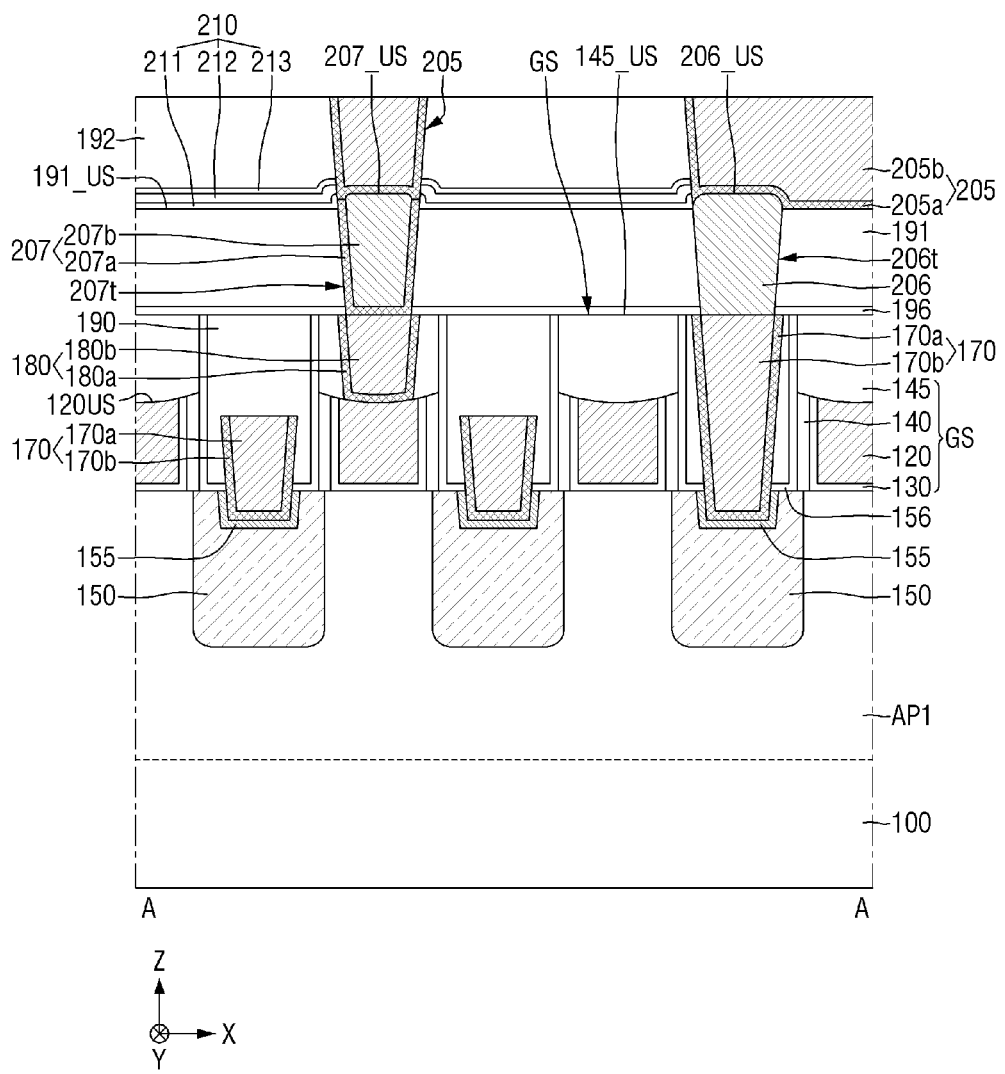

Referring to FIG. 20, in the semiconductor device according to some embodiments, the bottom surface of the first via plug 206 and the bottom surface of the second via plug 207 may be placed on the same plane as the top surface 145_US of the first gate capping pattern.

Unlike the illustrated example, one of the bottom surface of the first via plug 206 and the bottom surface of the second via plug 207 may be on the same plane as the top surface 145_US of the first gate capping pattern.

Figure 21:
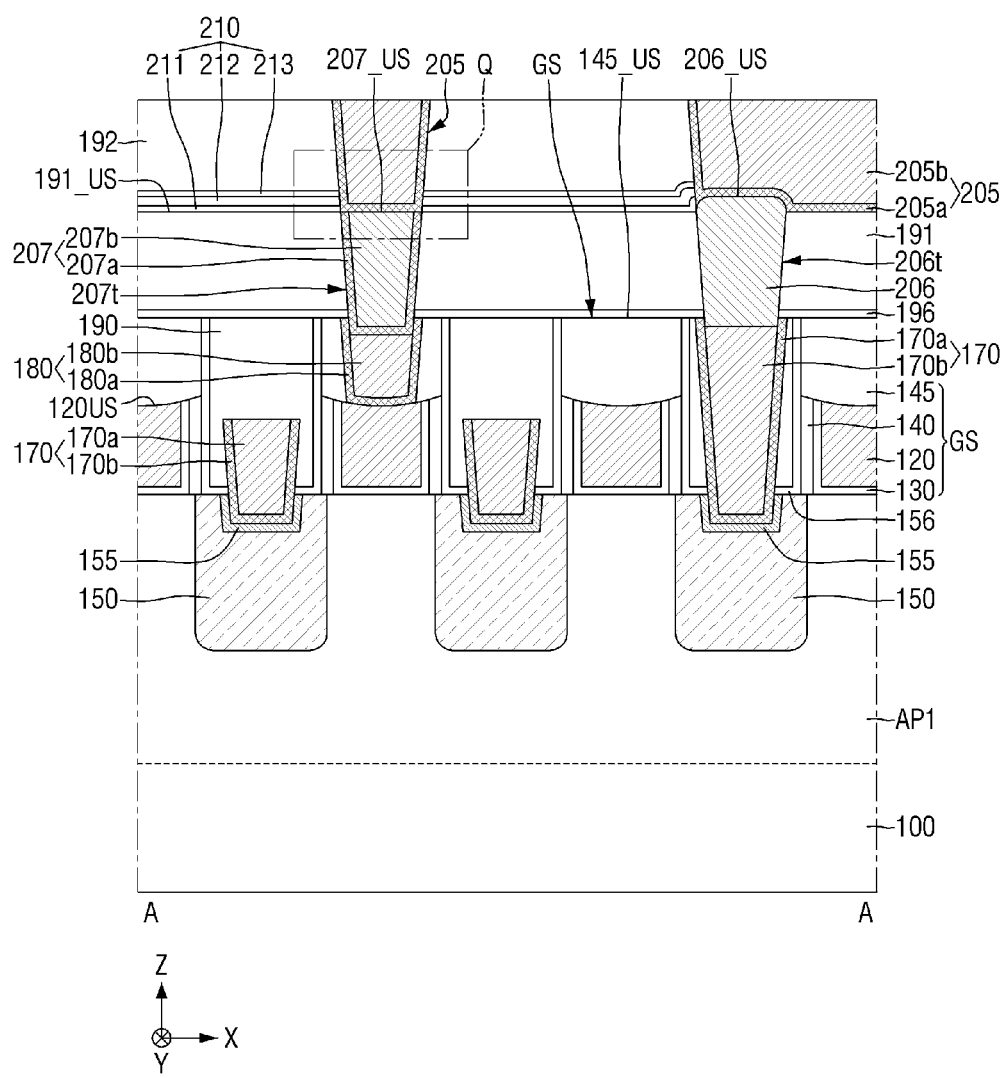
FIGS. 21 to 23 are diagrams illustrating a semiconductor device according to some embodiments.
Figure 22:
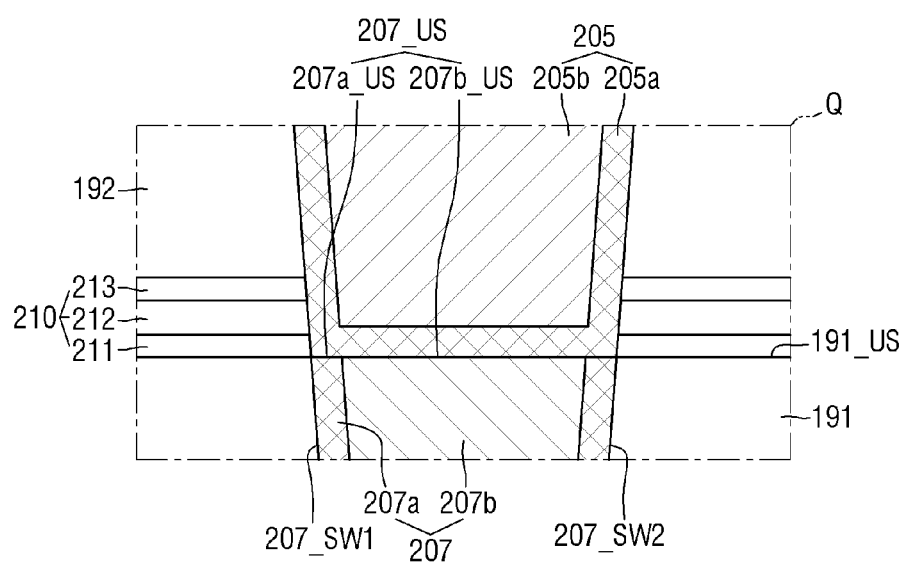
Figure 23:
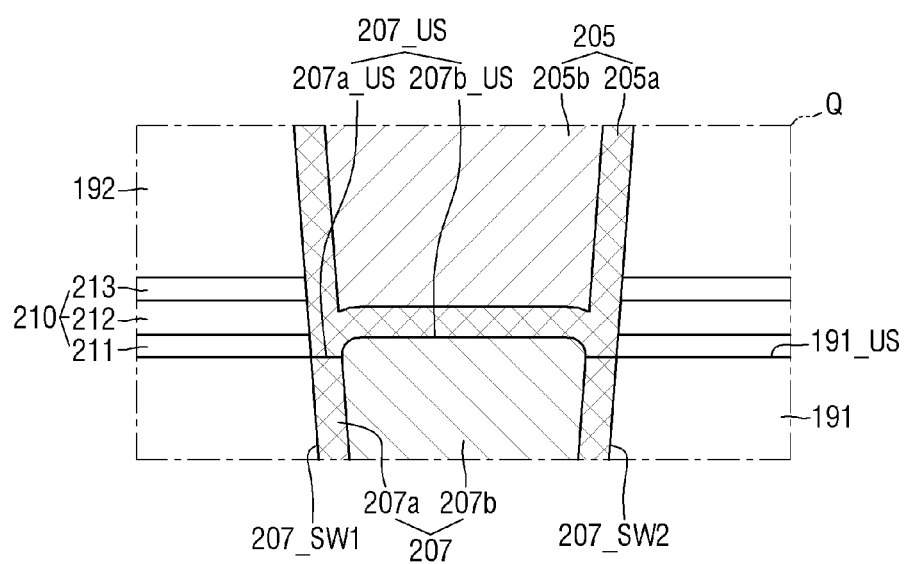

FIGS. 21 to 23 are diagrams illustrating a semiconductor device according to some embodiments. For simplicity of description, the following description will focus on differences from the description with reference to FIGS. 1 to 6. For reference, FIGS. 22 and 23 are exemplary diagrams in which portion Q of FIG. 21 is enlarged.

Referring to FIGS. 21 to 23, around the second via plug 207, the first etch stop layer 211 includes a horizontal portion extending along the top surface 191_US of the second interlayer insulating layer, but does not include a vertical portion protruding in the third direction Z from a horizontal portion.

Each of the second etch stop layer 212 and the third etch stop layer 213 includes a horizontal portion extending along the top surface 191_US of the second interlayer insulating layer, but does not include a vertical portion protruding in the third direction Z from the horizontal portion.

Around the second via plug 207, the first to third etch stop layers 211, 212, and 213 do not include a portion extending along a sidewall of the wire line 205.

For example, the second plug conductive layer 207b includes a conductive material different from that of the first via plug 206. Different materials may have different etching properties from each other. For example, while the first plug conductive layer 206 is formed in FIG. 44 (described in more detail below), the second plug conductive layer 207b may be over-etched compared to the first via plug 206.

After that, when the etch stop structure layer 210 is formed on the first via plug 206 and the second via plug 207, the vertical portions of the etch stop layers 211, 212, and 213 may not be formed.

In FIG. 22, the second via plug 207 does not include a protrusion protruding above the top surface 191_US of the second interlayer insulating layer. The top surface 207_US of the second via plug is not higher than the top surface 191_US of the second interlayer insulating layer.

In FIG. 23, a portion of the second plug conductive layer 207b may protrude above the top surface 191_US of the second interlayer insulating layer. However, the second barrier conductive layer 207a does not protrude above the top surface 191_US of the second interlayer insulating layer.

Figure 24:
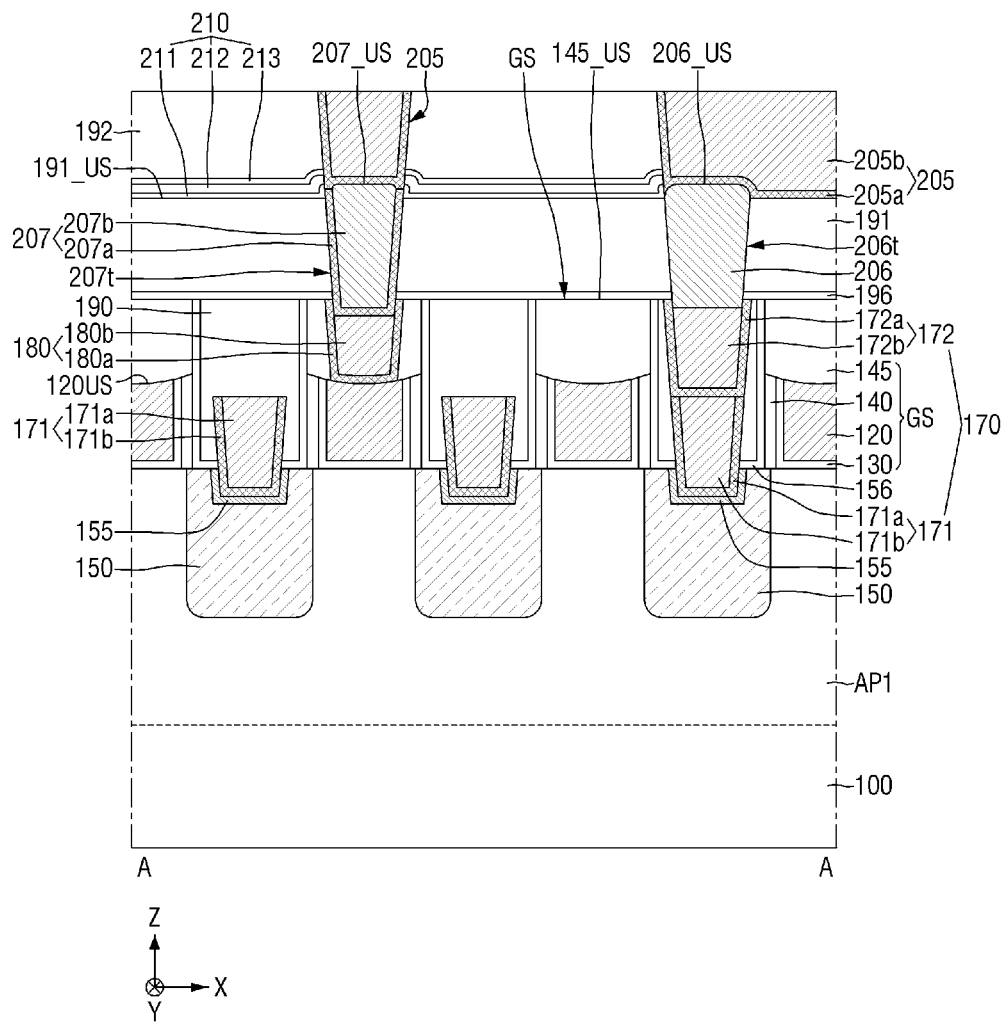
FIGS. 24 and 25 are diagrams illustrating a semiconductor device according to some embodiments.
Figure 25:
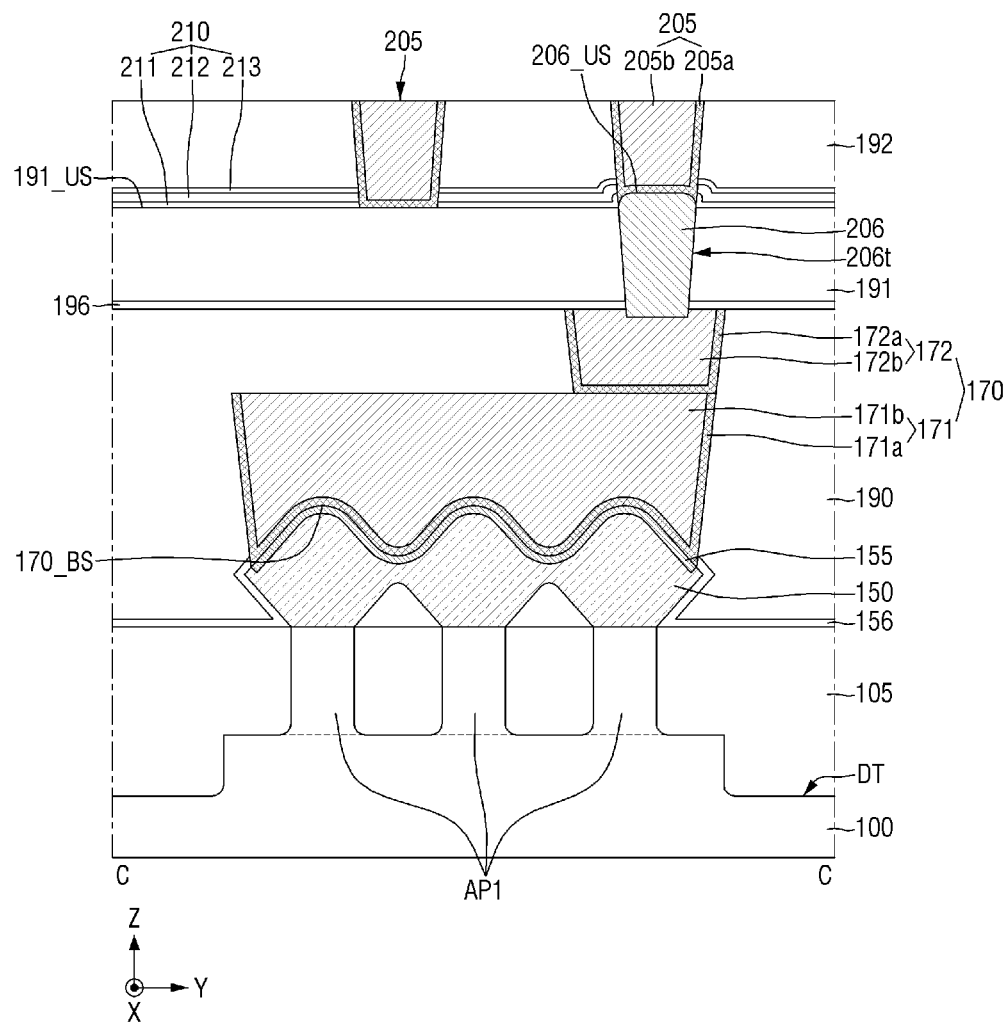

FIGS. 24 and 25 are diagrams illustrating a semiconductor device according to some embodiments. For simplicity of description, the following description will focus on differences from the description with reference to FIGS. 1 to 6.

Referring to FIGS. 24 and 25, in the semiconductor device according to some embodiments, the first source/drain contact 170 may include a lower source/drain contact 171 and an upper source/drain contact 172.

The lower source/drain contact 171 may include a lower source/drain barrier layer 171a and a lower source/drain filling layer 171b. The upper source/drain contact 172 may include an upper source/drain barrier layer 172a and an upper source/drain filling layer 172b.

The top surface of the first source/drain contact 170 may be the top surface of the upper source/drain contact 172.

The description of the material included in the lower source/drain barrier layer 171a and the upper source/drain barrier layer 172a may be the same as the description of the first source/drain barrier layer 170a. The description of the material included in the lower source/drain filling layer 171b and the upper source/drain filling layer 172b may be the same as the description of the first source/drain filling layer 170b.

In one embodiment, the height from the top surface of the first active pattern AP1 to the top surface 120US of the first gate electrode may be greater than the height from the top surface of the first active pattern AP1 to the top surface of the lower source/drain contact 171. In another embodiment, the height from the top surface of the first active pattern AP1 to the top surface 120US of the first gate electrode may be the same as the height from the top surface of the first active pattern AP1 to the top surface of the lower source/drain contact 171. As still another example, the height from the top surface of the first active pattern AP1 to the top surface 120US of the first gate electrode may be smaller than the height from the top surface of the first active pattern AP1 to the top surface of the lower source/drain contact 171.

The first via plug 206 is connected to the upper source/drain contact 172.

Figure 26:
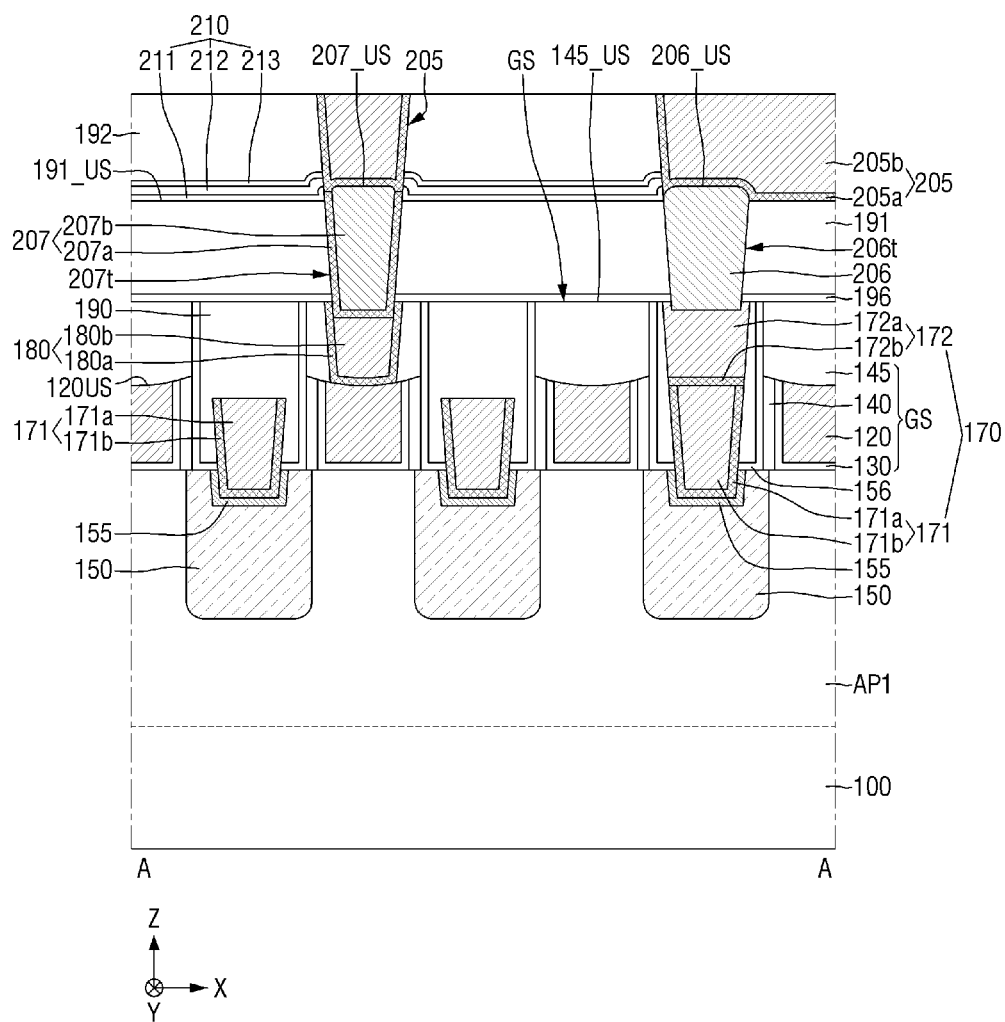
FIG. 26 is a diagram illustrating a semiconductor device according to some embodiments.

FIG. 26 is a diagram illustrating a semiconductor device according to some embodiments. For simplicity of description, the following description will focus on differences from the description with reference to FIGS. 24 and 25.

Referring to FIG. 26, the upper source/drain barrier layer 172a does not extend along a sidewall of the upper source/drain filling layer 172b.

The upper source/drain barrier layer 172a may be formed only on the bottom surface of the upper source/drain filling layer 172b. Unlike the illustrated example, in the first gate contact 180, the gate barrier layer 180a may not extend along a sidewall of the gate filling layer 180b.

FIGS. 27 to 30 are diagrams each illustrating a semiconductor device according to some embodiments. For simplicity of description, the following description will focus on differences from the description with reference to FIGS. 1 to 6.

Figure 27:
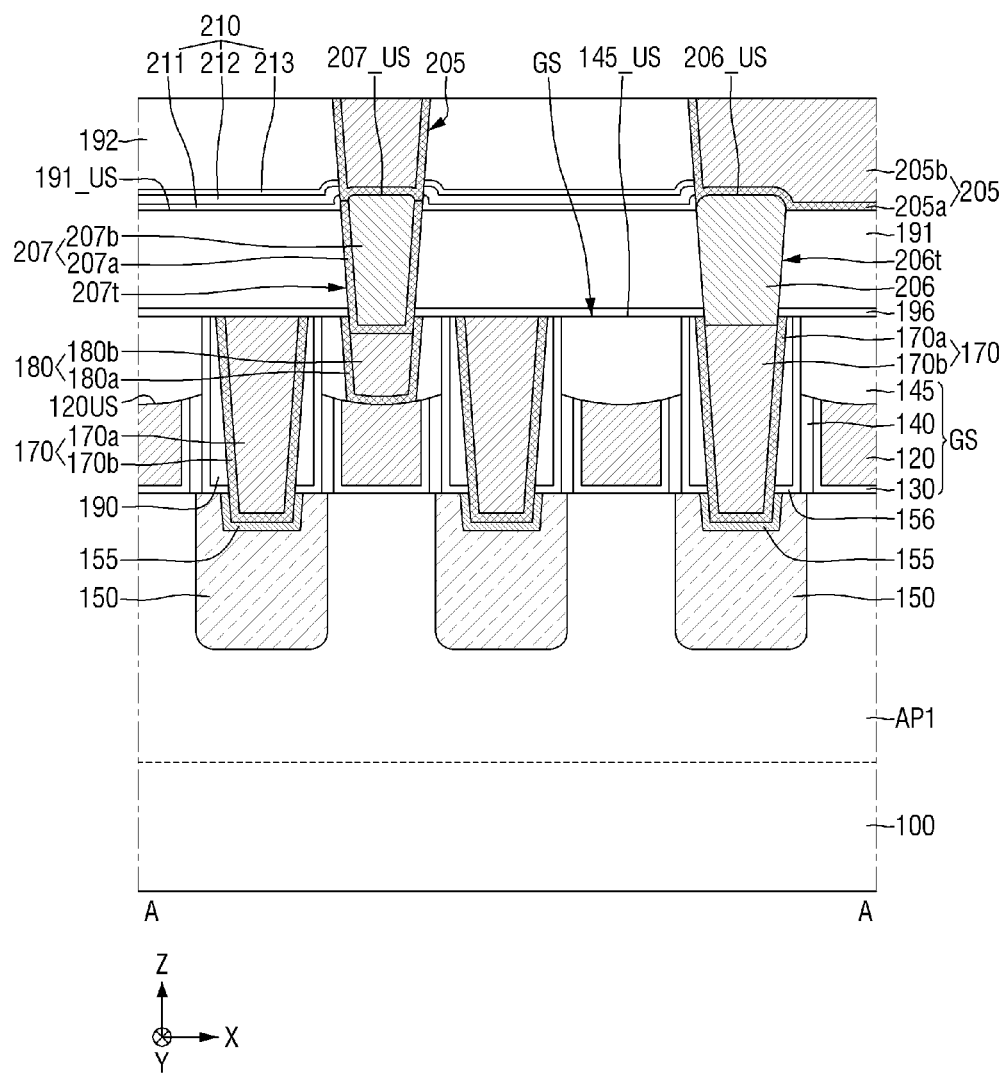
FIGS. 27 to 30 are diagrams each illustrating a semiconductor device according to some embodiments.

Referring to FIG. 27, in the semiconductor device according to some embodiments, regardless of whether the first via plug 206 is landed, the height of the first source/drain contact 170 may be constant with respect to the top surface of the first active pattern AP1.

When the first source/drain contact 170 includes a first portion on which the first via plug 206 is not landed and a second portion on which the first via plug 206 is landed, the height of the top surface of the second portion of the first source/drain contact 170 may be the same as the height of the top surface of the first portion of the first source/drain contact 170.

Figure 28:
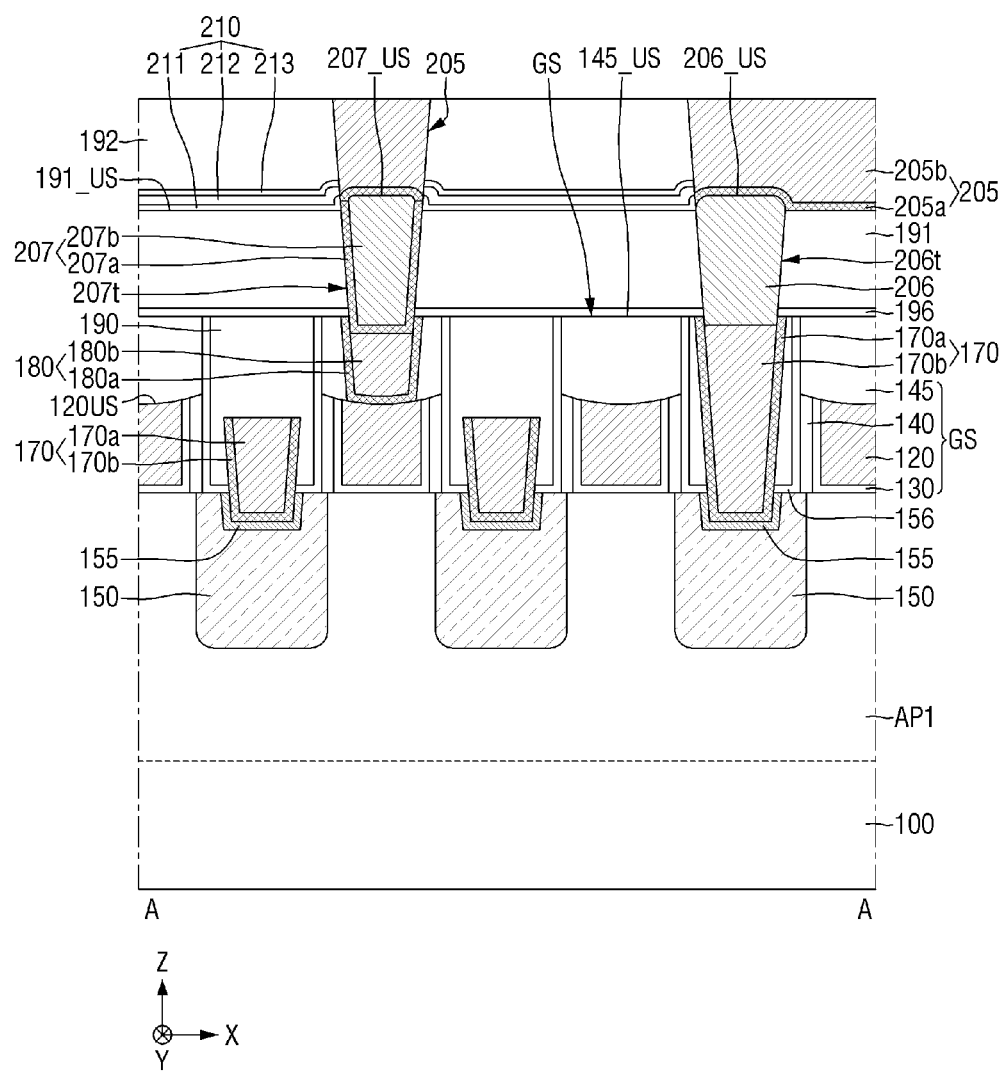

Referring to FIG. 28, in the semiconductor device according to some embodiments, the wire barrier layer 205a does not extend along the sidewall of the wire filling layer 205b.

Figure 29:
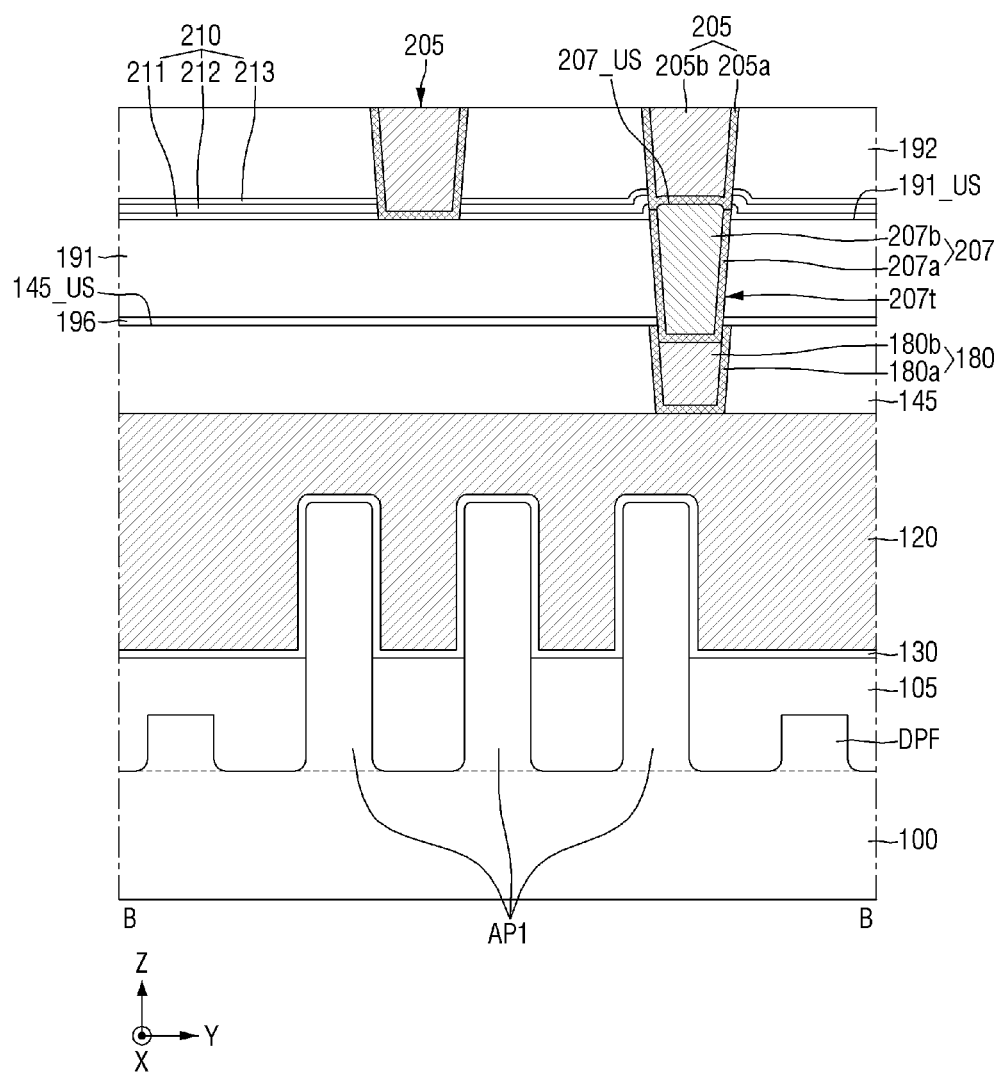

Referring to FIG. 29, in the semiconductor device according to some embodiments, a dummy protruding pattern DPF formed in the field region FX may be included.

The deep trench DT in FIG. 2 is not formed in the field region FX. The top surface of the dummy protruding pattern DPF is covered by the field insulating layer 105.

Figure 30:
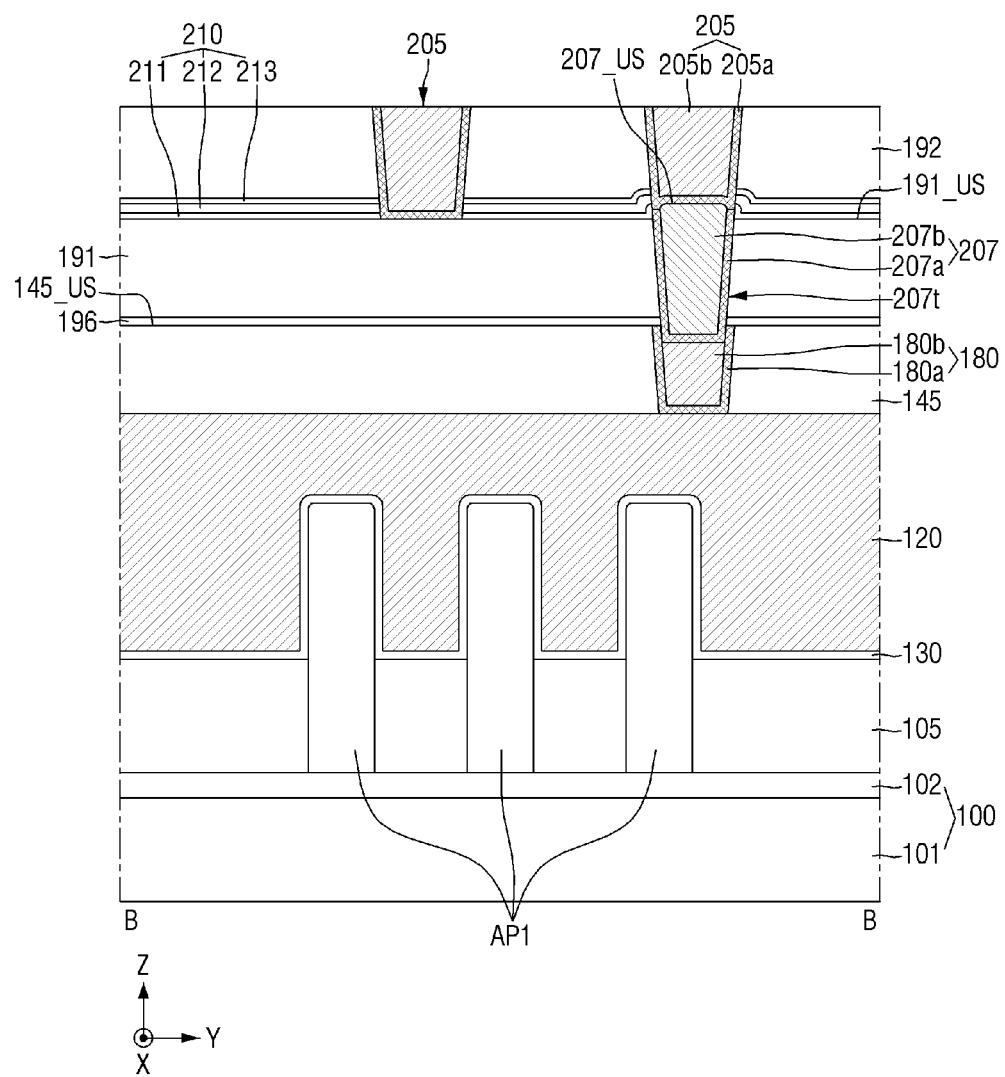

Referring to FIG. 30, in the semiconductor device according to some embodiments, the substrate 100 may include a base substrate 101 and a buried insulating layer 102 on the base substrate 101.

The base substrate 101 may be a semiconductor material, but is not limited thereto. The buried insulating layer 102 may be formed entirely along the top surface of the base substrate 101. The buried insulating layer 102 may be an insulating material.

Figure 31:
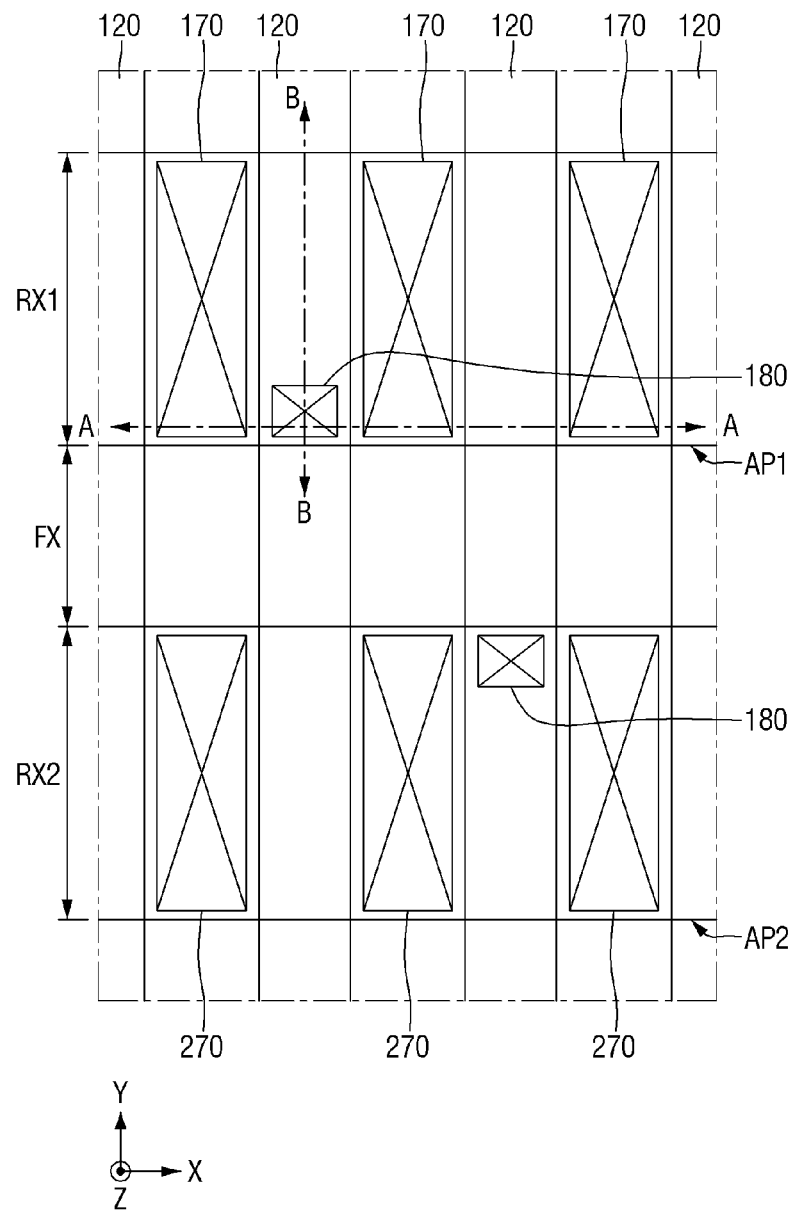
FIGS. 31 to 34 are diagrams illustrating a semiconductor device according to some embodiments.
Figure 32:
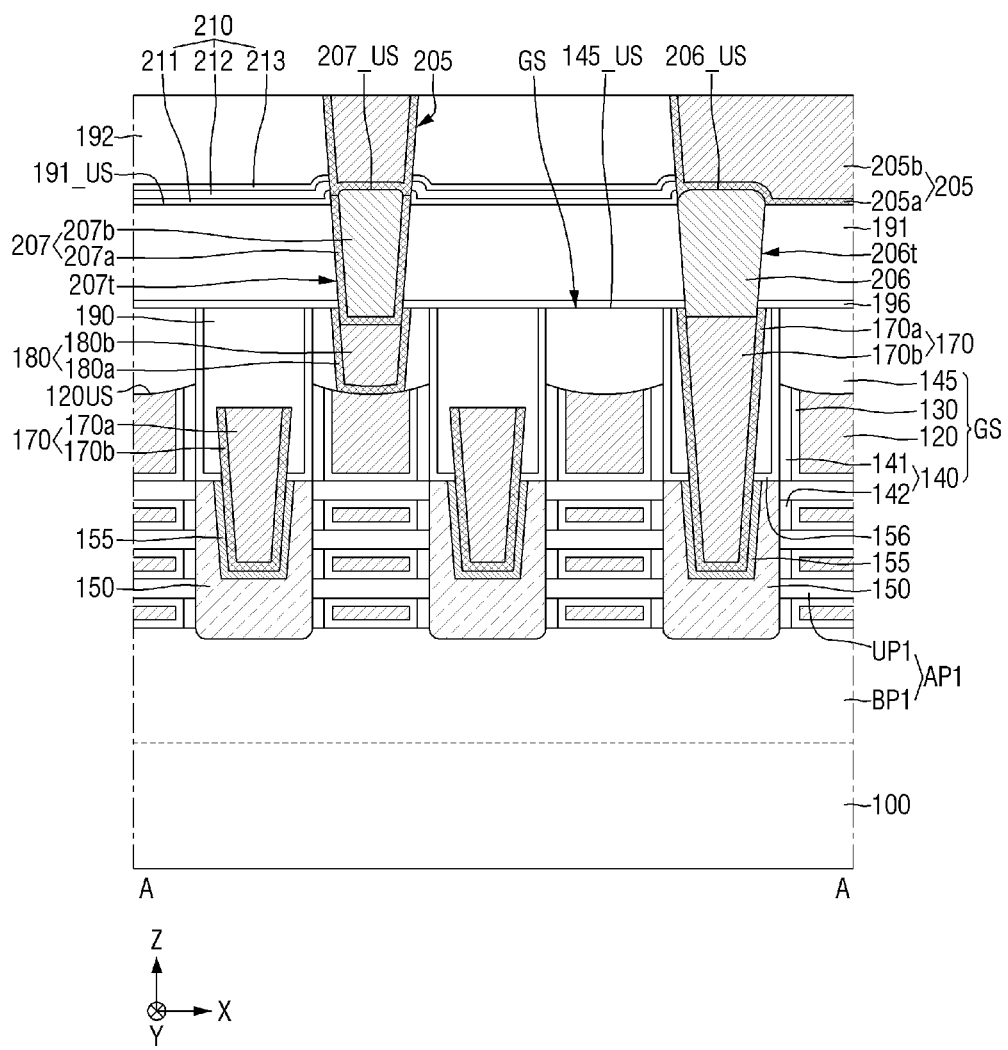
Figure 33:
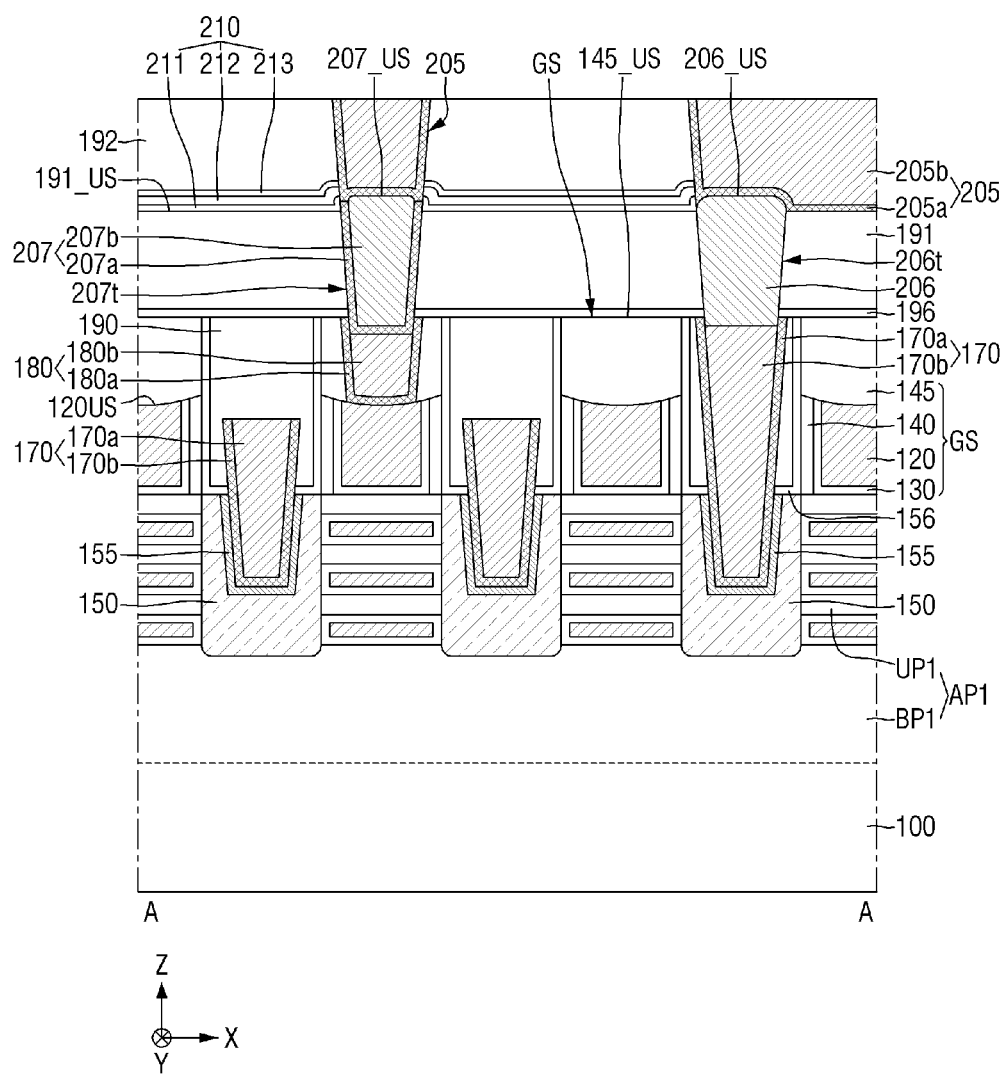
Figure 34:
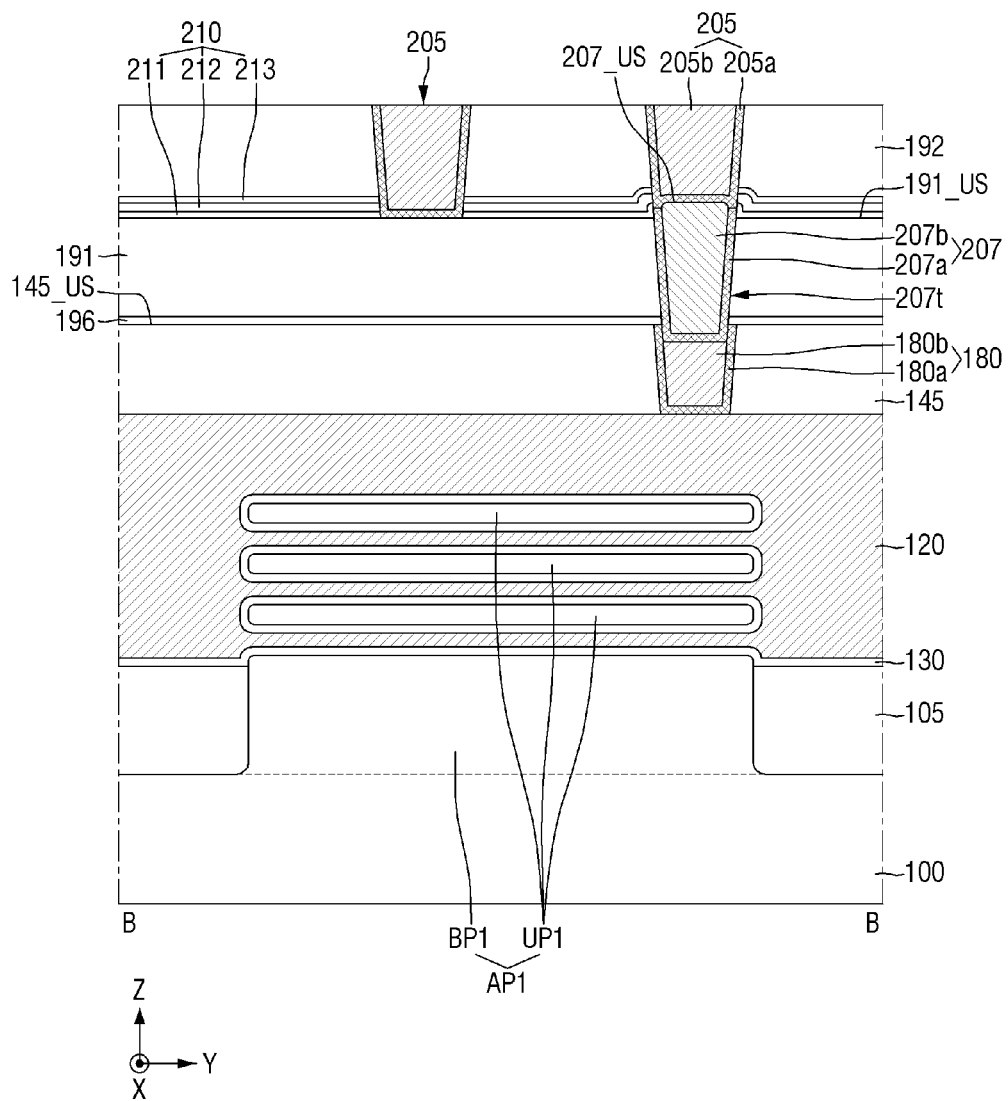

FIGS. 31 to 34 are diagrams illustrating a semiconductor device according to some embodiments. FIG. 31 is an exemplary layout diagram illustrating a semiconductor device according to some embodiments. FIGS. 32 and 33 are exemplary cross-sectional views taken along line A-A of FIG. 31. FIG. 34 is a cross-sectional view taken along line B-B of FIG. 31. For simplicity of description, the following description will focus on differences from the description with reference to FIGS. 1 to 6.

Referring to FIGS. 31 to 34, in the semiconductor device according to some embodiments, the first active pattern AP1 may include a lower pattern BP1 and a sheet pattern UP1.

Although not shown, the second active pattern AP2 may include a lower pattern and a sheet pattern.

The lower pattern BP1 may extend along the first direction X. The sheet pattern UP1 may be disposed on the lower pattern BP1 to be spaced apart from the lower pattern BP1.

The sheet pattern UP1 may include a plurality of sheet patterns stacked in the third direction Z. Although three sheet patterns UP1 are illustrated for simplicity of description, the present disclosure is not limited thereto.

The sheet pattern UP1 may be connected to the first source/drain pattern 150. The sheet pattern UP1 may be a channel pattern used as a channel region of a transistor. For example, the sheet pattern UP1 may be a nanosheet or nanowire.

The first gate insulating layer 130 may extend along the top surface of the lower pattern BP1 and the top surface of the field insulating layer 105. The first gate insulating layer 130 may wrap around the sheet pattern UP1.

The first gate electrode 120 is disposed on the lower pattern BP1. The first gate electrode 120 intersects the lower pattern BP1. The first gate electrode 120 may wrap around the sheet pattern UP1. The first gate electrode 120 may be disposed between the lower pattern BP1 and the sheet pattern UP1, and between the adjacent sheet patterns UP1.

In FIG. 32, the first gate spacer 140 may include an outer spacer 141 and an inner spacer 142. The inner spacer 142 may be disposed between the lower pattern BP1 and the sheet pattern UP1, and between the adjacent sheet patterns UP1.

In FIG. 33, the first gate spacer 140 may include only the outer spacer 141. The inner spacer is not disposed between the lower pattern BP1 and the sheet pattern UP1, and between the adjacent sheet patterns UP1.

The bottom surface of the first source/drain contact 170 may be located between the top surface of the sheet pattern UP1 disposed at the lowermost part of the plurality of sheet patterns UP1 and the bottom surface of the sheet pattern UP1 disposed at the uppermost part thereof. Unlike the illustrated example, the bottom surface of the first source/drain contact 170 may be positioned between the top surface of the sheet pattern UP1 disposed at the uppermost portion and the bottom surface of the sheet pattern UP1 disposed at the uppermost portion.

Figure 35:
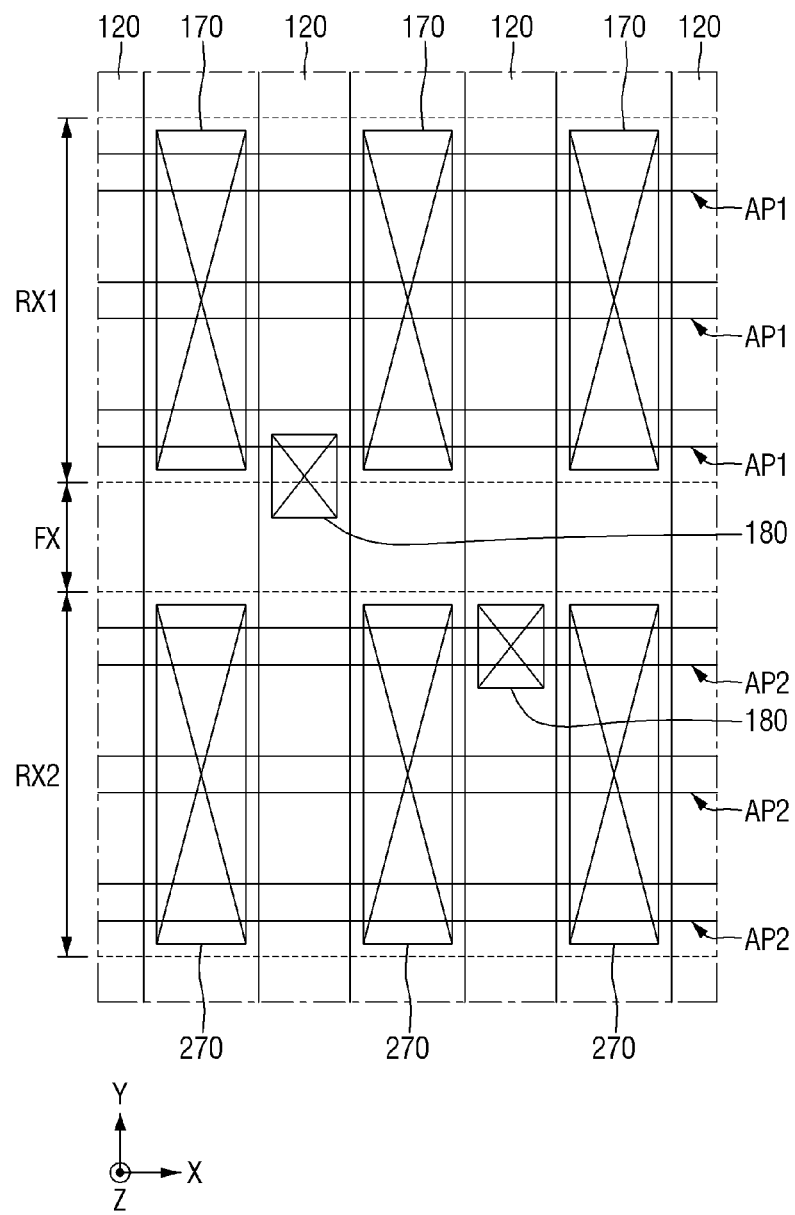
FIGS. 35 and 36 are exemplary layout diagrams illustrating a semiconductor device according to some embodiments.
Figure 36:
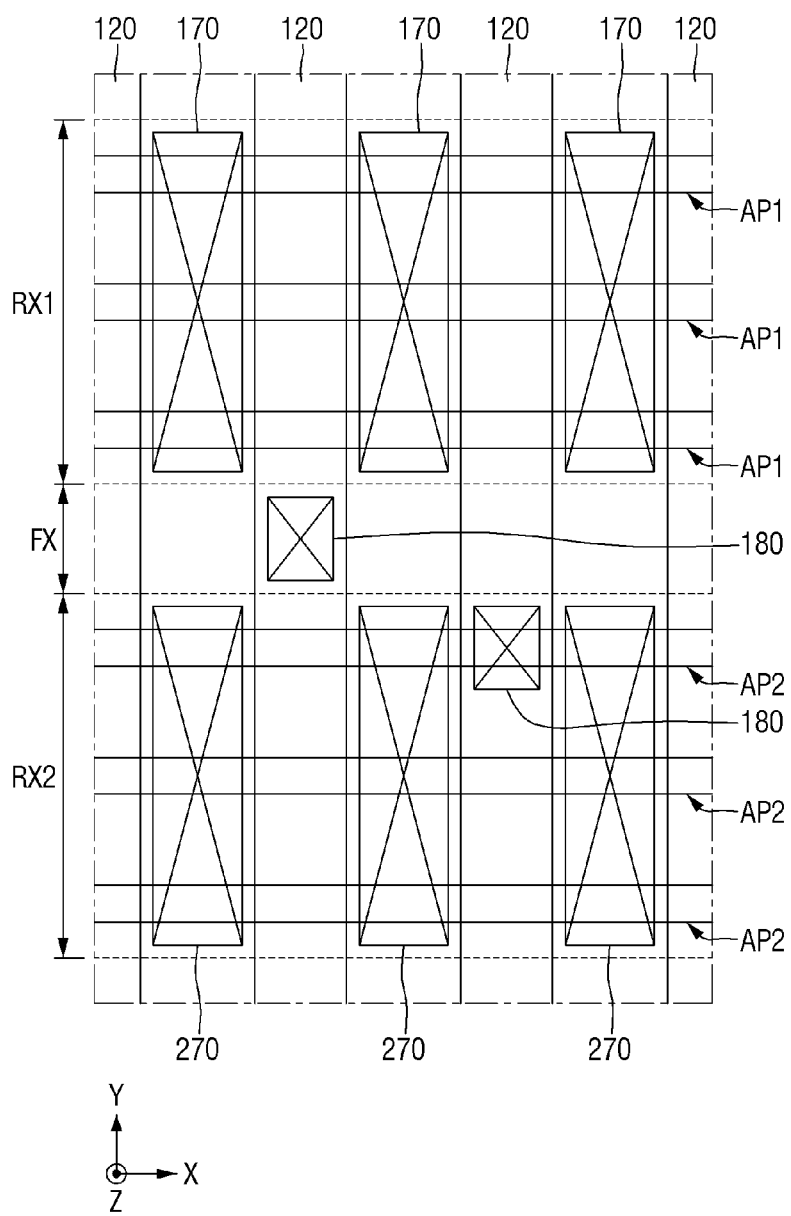

FIGS. 35 and 36 are exemplary layout diagrams illustrating a semiconductor device according to some embodiments. For simplicity of description, the following description will focus on differences from the description with reference to FIGS. 1 to 6.

Referring to FIG. 35, in the semiconductor device according to some embodiments, in plan view, at least one of the first gate contacts 180 may be disposed across the active regions RX1 and RX2 and the field region FX.

For example, a portion of the first gate contact 180 may be disposed in a position overlapping the first active region RX1.

Referring to FIG. 36, in the semiconductor device according to some embodiments, in plan view, at least one of the first gate contacts 180 may be entirely disposed on the field region FX.

At least one of the first gate contacts 180 may be disposed in a position entirely overlapping with the field region FX.

In FIGS. 35 and 36, at least other one of the first gate contacts 180 is illustrated to be entirely disposed on the second active region RX2, but is not limited thereto.

In FIGS. 1, 35, and 36, according to the position of the first gate contact 180, each of a cross section (a view taken in the second direction Y) of the first source/drain contact 170 and a cross section of the second source/drain contact 270 may have an "L" shape or may have a "T" shape rotated 180 degrees.

Alternatively, regardless of the position of the first gate contact 180, each of the first source/drain contact 170 and the second source/drain contact 270 may not include a recessed portion as illustrated in FIG. 6.

Figure 37:
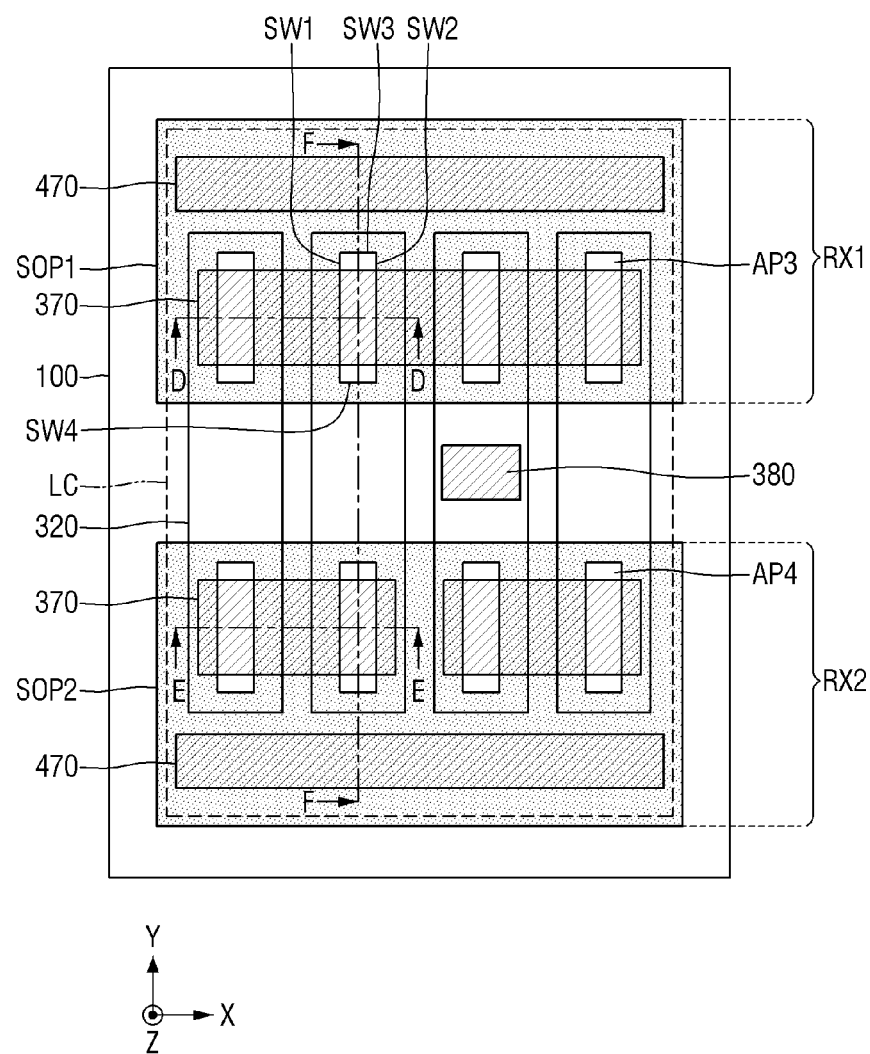
FIGS. 37 to 39 are diagrams illustrating a semiconductor device according to some embodiments.
Figure 38:
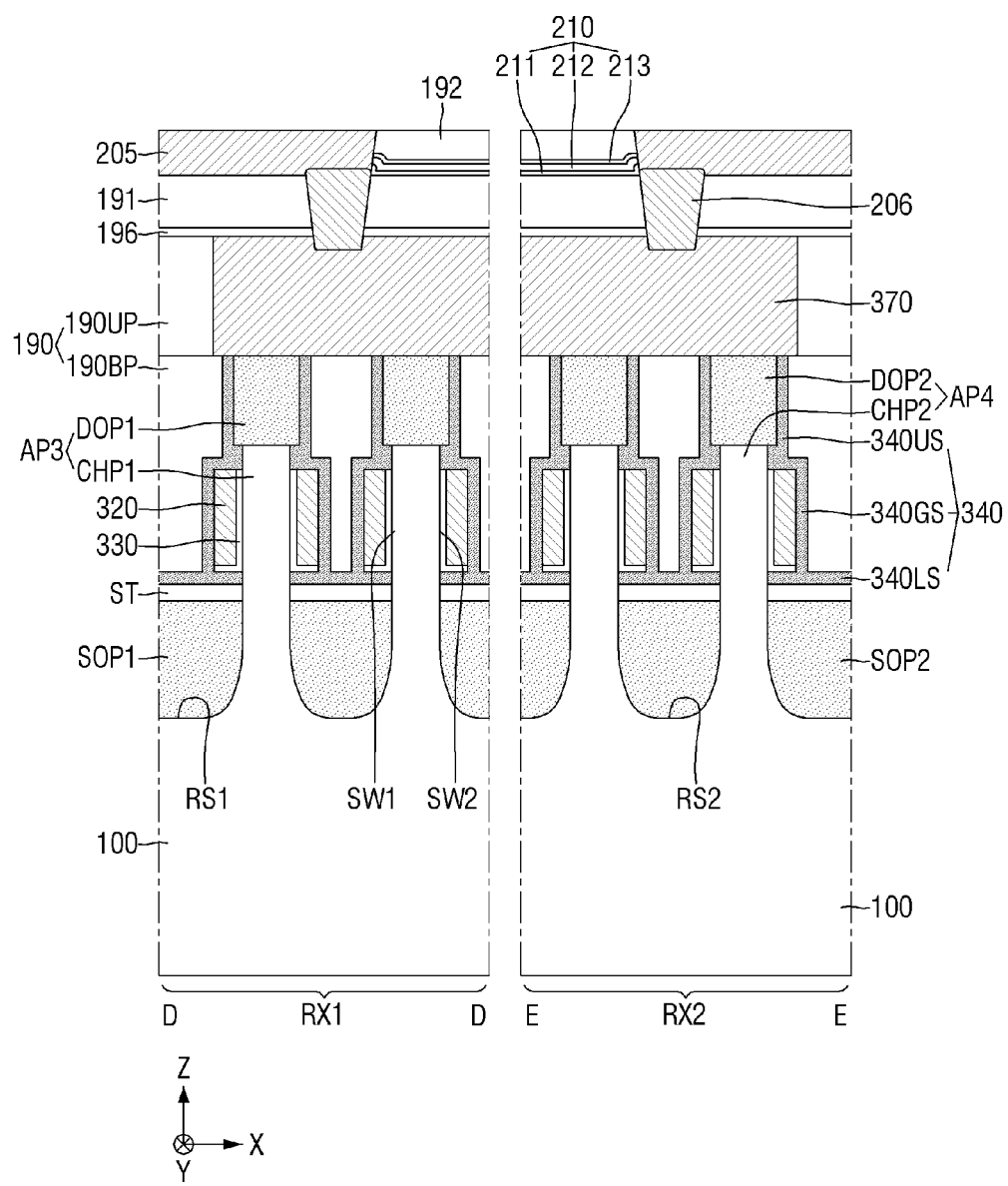
Figure 39:
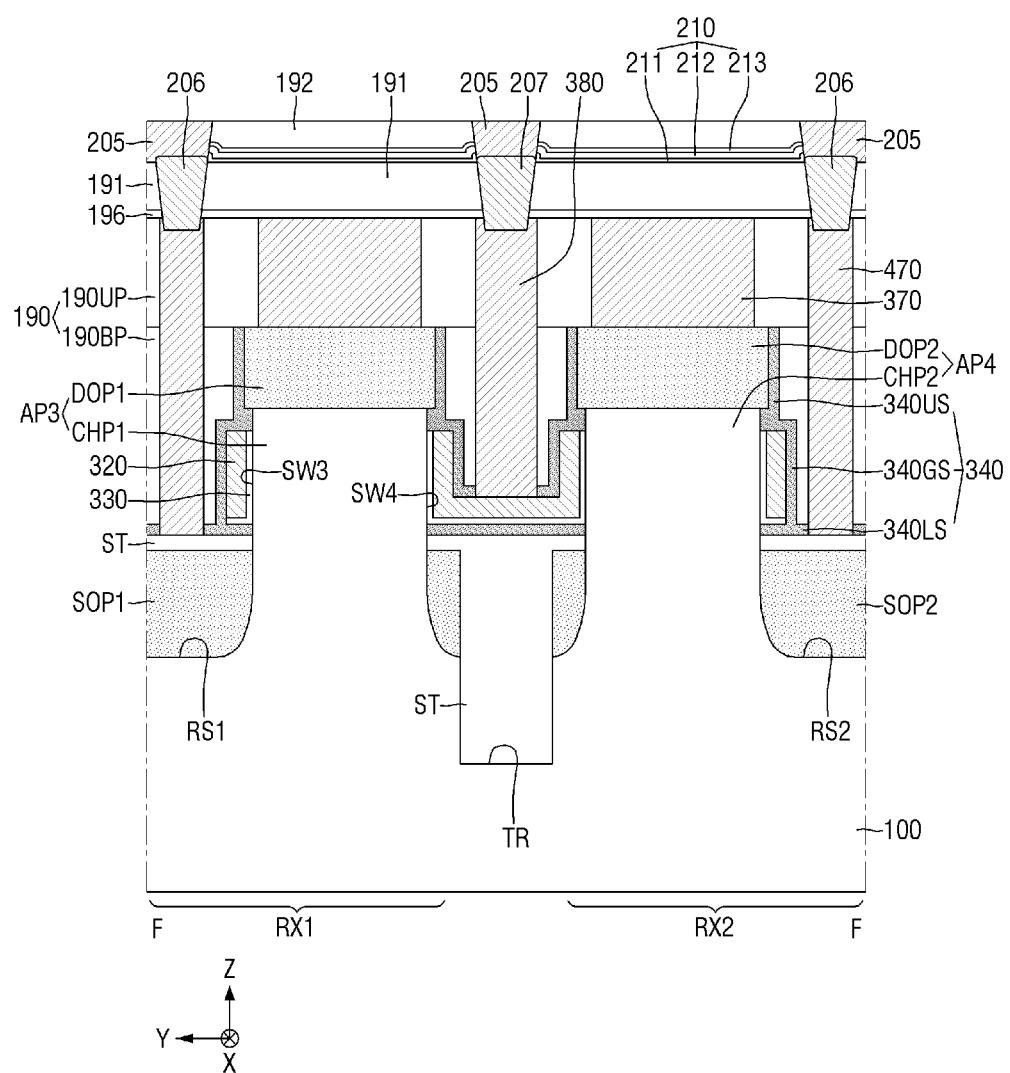

FIGS. 37 to 39 are diagrams illustrating a semiconductor device according to some embodiments. For reference, FIG. 37 is a plan view illustrating a semiconductor device according to some embodiments. FIG. 38 is a cross-sectional view taken along lines D-D and E-E of FIG. 37. FIG. 39 is a cross-sectional view taken along line F-F of FIG. 37.

Referring to FIGS. 37 to 39, a logic cell LC may be provided on the substrate 100. The logic cell LC may mean a logic element (e.g., an inverter, a flip-flop, or the like) performing a specific function. The logic cell LC may include vertical transistors (vertical FET) constituting a logic element and wires connecting the vertical transistors to each other.

The logic cell LC on the substrate 100 may include the first active region RX1 and the second active region RX2. For example, the first active region RX1 may be a PMOS-FET region, and the second active region RX2 may be an NMOSFET region. The first and second active regions RX1 and RX2 may be defined by the trench TR formed on the substrate 100. The first and second active regions RX1 and RX2 may be spaced apart from each other in the second direction Y.

A first lower epitaxial pattern SOP1 may be provided on the first active region RX1, and a second lower epitaxial pattern SOP2 may be provided on the second active region RX2. In plan view, the first lower epitaxial pattern SOP1 may overlap the first active region RX1, and the second lower epitaxial pattern SOP2 may overlap the second active region RX2. The first and second lower epitaxial patterns SOP1 and SOP2 may be epitaxial patterns formed by a selective epitaxial growth process. The first lower epitaxial pattern SOP1 may be provided in a first recess area RS1 of the substrate 100, and the second lower epitaxial pattern SOP2 may be provided in a second recess area RS2 of the substrate 100.

Third active patterns AP3 may be provided on the first active region RX1, and fourth active patterns AP4 may be provided on the second active region RX2. Each of the third and fourth active patterns AP3 and AP4 may have a fin shape protruding vertically. In plan view, each of the third and fourth active patterns AP3 and AP4 may have a bar shape extending in the second direction Y. The third active patterns AP3 may be arranged along the first direction X, and the fourth active patterns AP4 may be arranged along the first direction X.

Each of the third active patterns AP3 may include a first channel pattern CHP1 protruding vertically from the first lower epitaxial pattern SOP1 and a first upper epitaxial pattern DOP1 on the first channel pattern CHP1. Each of the fourth active patterns AP4 may include a second channel pattern CHP2 protruding vertically from the second lower epitaxial pattern SOP2 and a second upper epitaxial pattern DOP2 on the second channel pattern CHP2.

An element isolation layer ST may be provided on the substrate 100 to fill the trench TR. The element isolation layer ST may cover the top surfaces of the first and second lower epitaxial patterns SOP1 and SOP2. The third and fourth active patterns AP3 and AP4 may vertically protrude above the element isolation layer ST.

A plurality of second gate electrodes 320 extending parallel to each other in the second direction Y may be provided on the element isolation layer ST. The second gate electrodes 320 may be arranged along the first direction X. The second gate electrode 320 may wrap the first channel pattern CHP1 of the third active pattern AP3 and may wrap the second channel pattern CHP2 of the fourth active pattern AP4. For example, the first channel pattern CHP1 of the third active pattern AP3 may have first to fourth sidewalls SW1 to SW4. The first and second sidewalls SW1 and SW2 may face each other in the first direction X, and the third and fourth sidewalls SW3 and SW4 may face each other in the second direction Y. The second gate electrode 320 may be provided on the first to fourth sidewalls SW1 to SW4. Therefore, the second gate electrode 320 may surround the first to fourth sidewalls SW1 to SW4.

A second gate insulating layer 330 may be interposed between the second gate electrode 320 and each of the first and second channel patterns CHP1 and CHP2. The second gate insulating layer 330 may cover the bottom surface of the second gate electrode 320 and the inner wall of the second gate electrode 320. For example, the second gate insulating layer 330 may directly cover the first to fourth sidewalls SW1 to SW4 of the third active pattern AP3.

The first and second upper epitaxial patterns DOP1 and DOP2 may vertically protrude above the second gate electrode 320. The top surface of the second gate electrode 320 may be lower than the bottom surface of each of the first and second upper epitaxial patterns DOP1 and DOP2. Each of the third and fourth active patterns AP3 and AP4 may have a structure that protrudes vertically from the substrate 100 and penetrates the second gate electrode 320.

The semiconductor device according to some embodiments may include vertical transistors in which carriers move in the third direction Z. For example, when a voltage is applied to the second gate electrode 320 and the transistor is "on", carriers may move from the lower epitaxial patterns SOP1 and SOP2 to the upper epitaxial patterns DOP1 and DOP2 through the channel patterns CHP1 and CHP2. In the semiconductor device according to some embodiments, the second gate electrode 320 may completely surround the sidewalls SW1 to SW4 of the channel patterns CHP1 and CHP2. The transistor according to the present disclosure may be a three-dimensional field effect transistor (e.g., VFET) having a gate all around structure. Since the gate surrounds the channel, the semiconductor device according to some embodiments may have excellent electrical characteristics.

A spacer 340 covering the second gate electrodes 320 and the third and fourth active patterns AP3 and AP4 may be provided on the element isolation layer ST. The spacer 340 may include or may be a silicon nitride layer or a silicon oxynitride layer. The spacer 340 may include a lower spacer 340LS, an upper spacer 340US, and a gate spacer 340GS between the lower and upper spacers 340LS and 340US.

The lower spacer 340LS may directly cover the top surface of the element isolation layer ST. The second gate electrodes 320 may be spaced apart from the element isolation layer ST in the third direction Z by the lower spacer 340LS. The gate spacer 340GS may cover the top surface and the outer wall of each of the second gate electrodes 320. The upper spacer 340 may cover the first and second upper epitaxial patterns DOP1 and DOP2. However, the upper spacer 340US may not cover the top surfaces of the first and second upper epitaxial patterns DOP1 and DOP2, and may expose the top surfaces of the first and second upper epitaxial patterns DOP1 and DOP2.

A first lower interlayer insulating layer 190BP may be provided on the spacer 340. The top surface of the first lower interlayer insulating layer 190BP may be substantially flush (e.g., coplanar) with the top surfaces of the first and second upper epitaxial patterns DOP1 and DOP2. A first upper interlayer insulating layer 190UP and the second and third interlayer insulating layers 191 and 192 may be sequentially stacked on the first lower interlayer insulating layer 190BP. The first lower interlayer insulating layer 190BP and the first upper interlayer insulating layer 190UP may be included in the first interlayer insulating layer 190. The first upper interlayer insulating layer 190UP may cover the top surfaces of the first and second upper epitaxial patterns DOP1 and DOP2.

At least one third source/drain contact 370 penetrating the first upper interlayer insulating layer 190UP to connect to the first and second upper epitaxial patterns DOP1 and DOP2, may be provided. At least one fourth source/drain contact 470 that sequentially penetrates the first interlayer insulating layer 190, the lower spacer 340LS, and the element isolation layer ST and that connects to the first and second lower epitaxial patterns SOP1 and SOP2, may be provided. A second gate contact 380 that sequentially penetrates the first upper interlayer insulating layer 190UP, the first lower interlayer insulating layer 190BP, and the gate spacer 340GS and that connects to the second gate electrode 320, may be provided.

The upper etch stop layer 196 may be disposed between the first upper interlayer insulating layer 190UP and the second interlayer insulating layer 191. The etch stop structure layer 210 may be disposed between the second interlayer insulating layer 191 and the third interlayer insulating layer 192.

The first via plug 206 and the second via plug 207 may be provided in the second interlayer insulating layer 191. The wire line 205 may be provided in the third interlayer insulating layer 192. The second via plug 207 and the wire line 205 are illustrated as a single layer, but this is only for convenience of description and is not limited thereto.

Detailed descriptions of the first via plug 206, the second via plug 207, the wire line 205, and the etch stop structure layer 210 may be substantially the same as those described with reference to FIGS. 1 to 23 above.

FIGS. 40 to 46 are views illustrating the intermediate steps of a method for fabricating a semiconductor device according to some embodiments. For reference, FIGS. 40 to 46 are cross-sectional views taken along line A-A of FIG. 1. The following fabricating method is described from a cross-sectional view.

Figure 40:
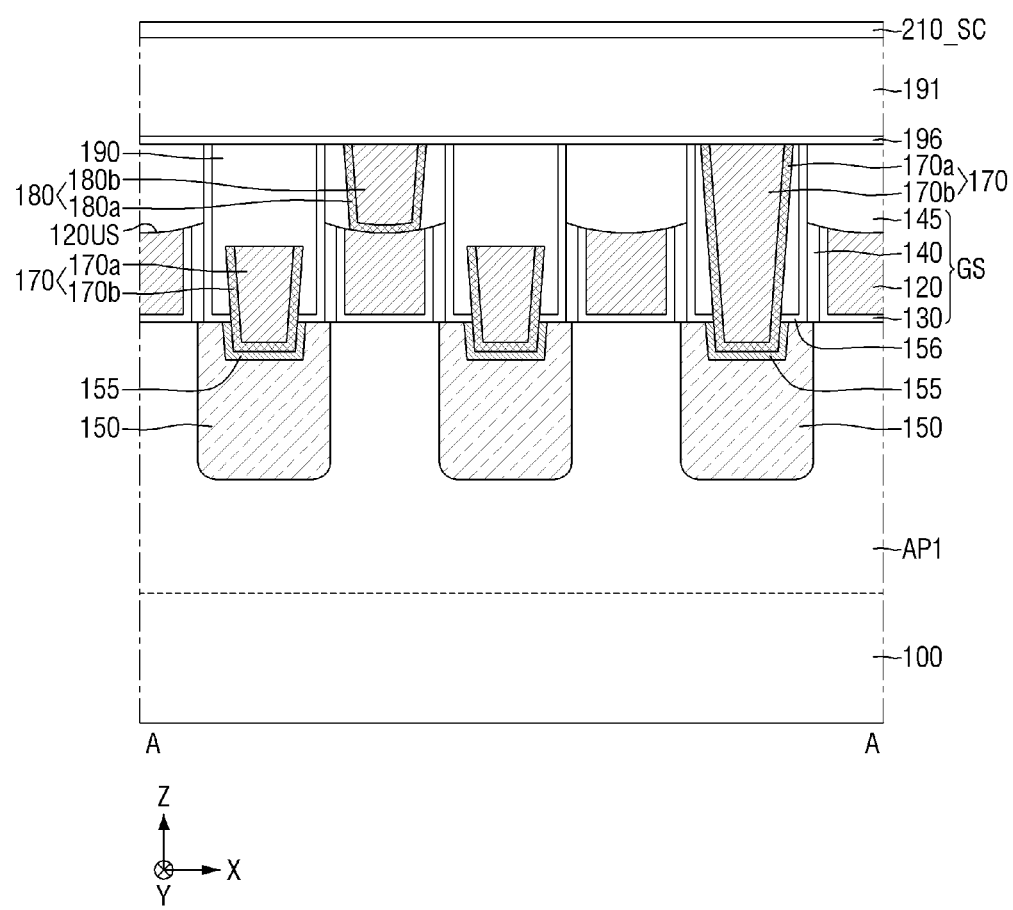
FIGS. 40 to 46 are views illustrating the intermediate steps of a method for fabricating a semiconductor device according to some embodiments.

Referring to FIG. 40, the gate structure GS and the first source/drain pattern 150 may be formed on the first active pattern AP1.

Subsequently, a first source/drain contact 170 may be formed on the first source/drain pattern 150. In addition, the first gate contact 180 may be formed on the first gate electrode 120.

Subsequently, an upper etch stop layer 196, a second interlayer insulating layer 191, and a sacrificial etch stop layer 210_SC may be sequentially formed on the first gate contact 180 and the first source/drain contact 170. The sacrificial etch stop layer 210_SC may be, for example, silicon nitride, but is not limited thereto.

Figure 41:
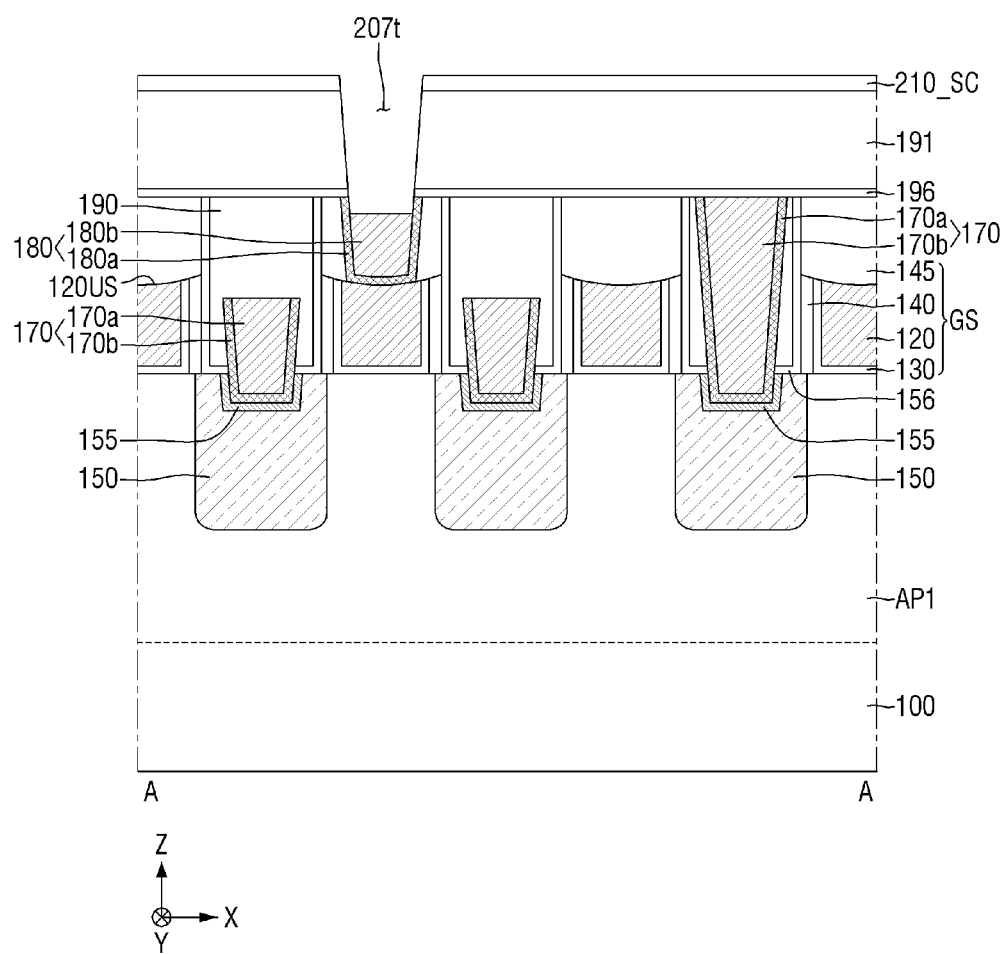

Referring to FIG. 41, the second via hole 207*t* penetrating the sacrificial etch stop layer 210_SC, the second interlayer insulating layer 191, and the upper etch stop layer 196 is formed.

The second via hole 207*t* may expose the first gate contact 180.

Figure 42:
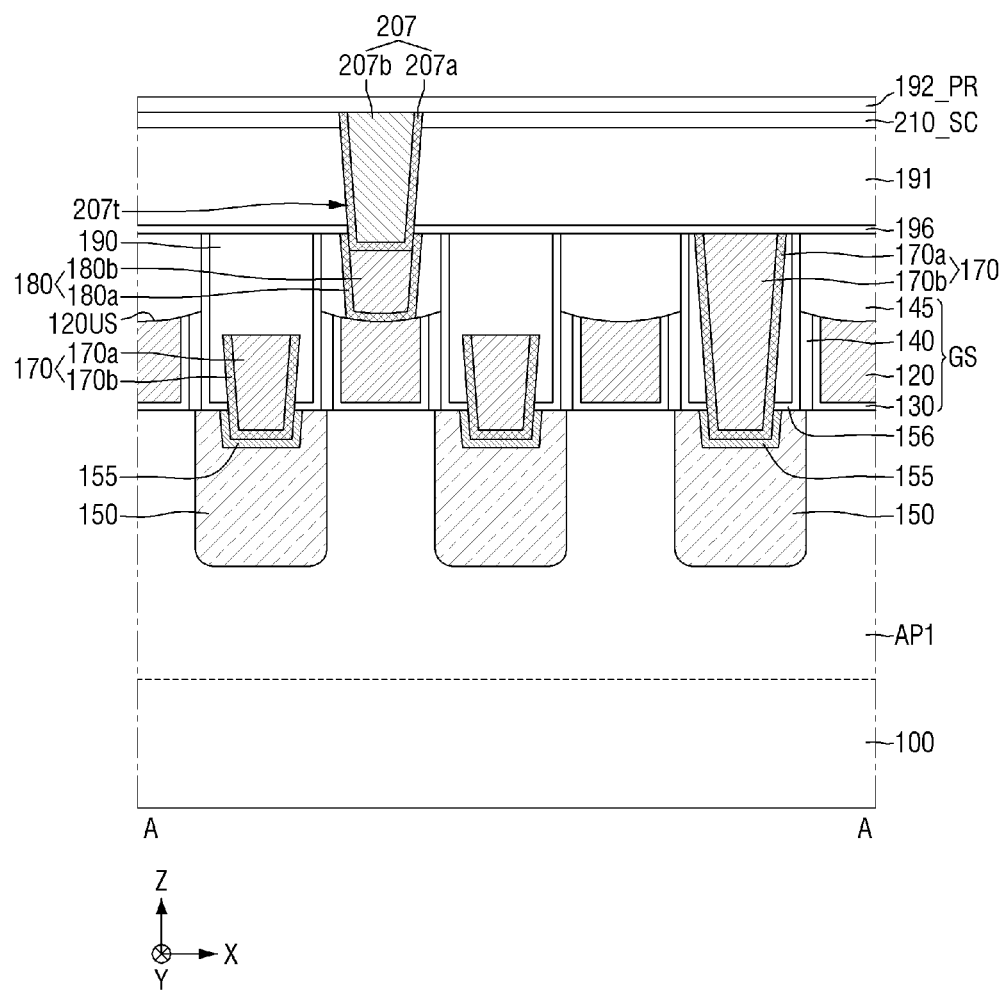

Referring to FIG. 42, the second via plug 207 including the second barrier conductive layer 207*a* and the second plug conductive layer 207*b* may be formed in the second via hole 207*t*.

The second via plug 207 penetrates the sacrificial etch stop layer 210_SC and the second interlayer insulating layer 191, and is connected to the first gate electrode 180.

Subsequently, a third pre-interlayer insulating layer 192_PR is formed on the sacrificial etch stop layer 210_SC. The third free interlayer insulating layer 192_PR covers the top surface of the second via plug 207.

Figure 43:
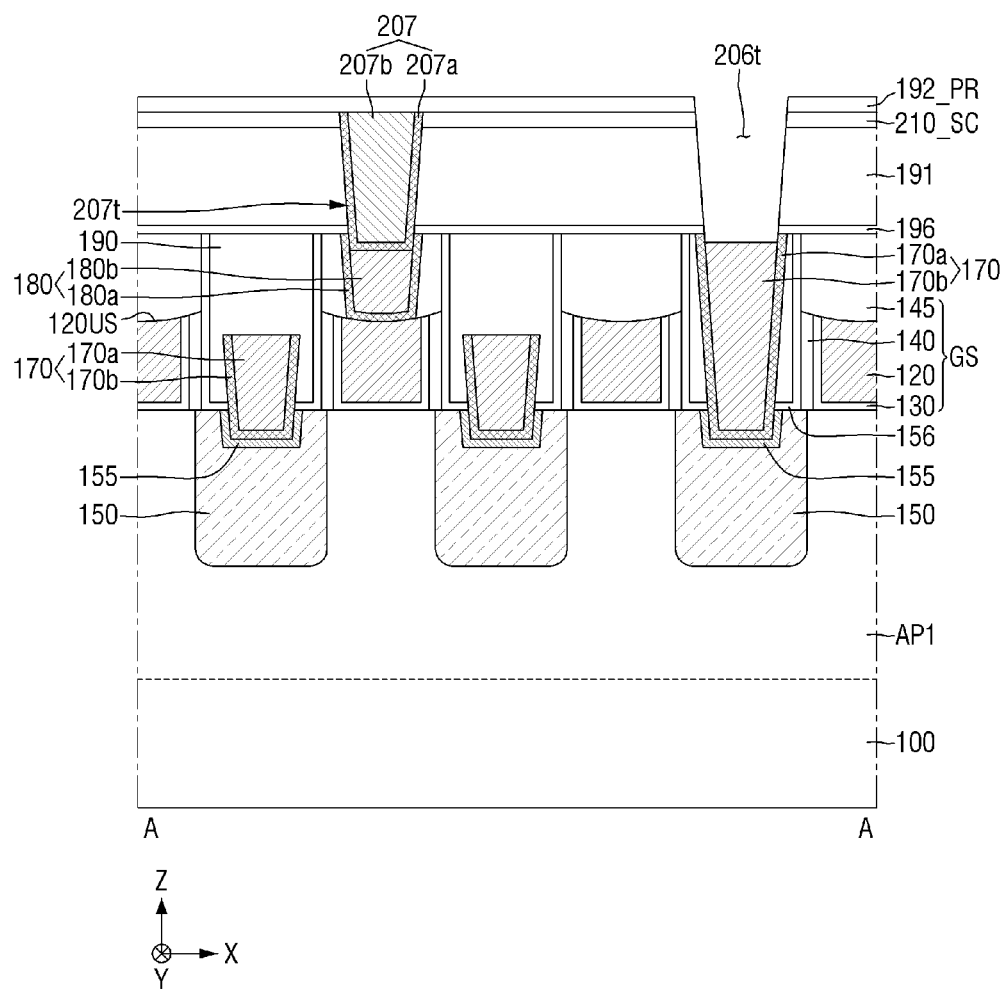

Referring to FIG. 43, a second hold 206*t* penetrating the third free interlayer insulating layer 192_PR, the sacrificial etch stop layer 210_SC, the second interlayer insulating layer 191, and the upper etch stop layer 196 may be formed.

The first via hole 206*t* may expose the first source/drain contact 170.

Figure 44:
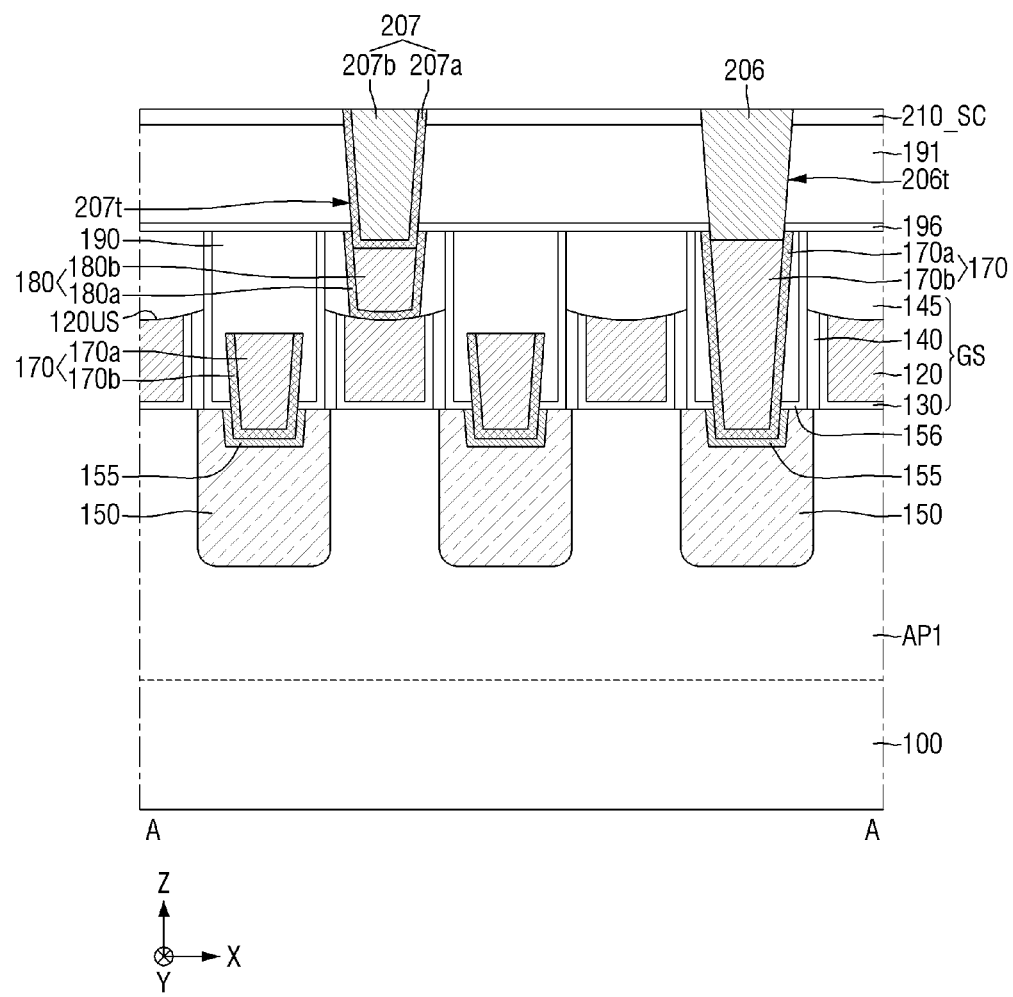

Referring to FIG. 44, the first via plug 206 is formed in the first via hole 206*t*.

While the first via plug 206 is being formed, the third free interlayer insulating layer 192_PR is removed. While the first via plug 206 is being formed, the second via plug 207 is exposed.

More specifically, a first via plug layer filling the first via hole 206*t* is formed. The first via plug layer is also formed on the top surface of the third free interlayer insulating layer 192_PR. Subsequently, until the sacrificial etch stop layer 210_SC is exposed, the third free interlayer insulating layer 192_PR and the first via plug layer are removed by using a chemical mechanical planarization (CMP) method.

When the first via plug 206 and the second plug conductive layer 207*b* include or are formed of the same conductive material, the degree of polishing of the first via plug 206 and the second plug conductive layer 207*b* during the CMP process may be substantially the same. When the first via plug 206 and the second plug conductive layer 207*b* include different conductive materials, in one embodiment, the different materials cause the second via plug 207 in the second via hole 207*t* to be over-etched.

Figure 45:
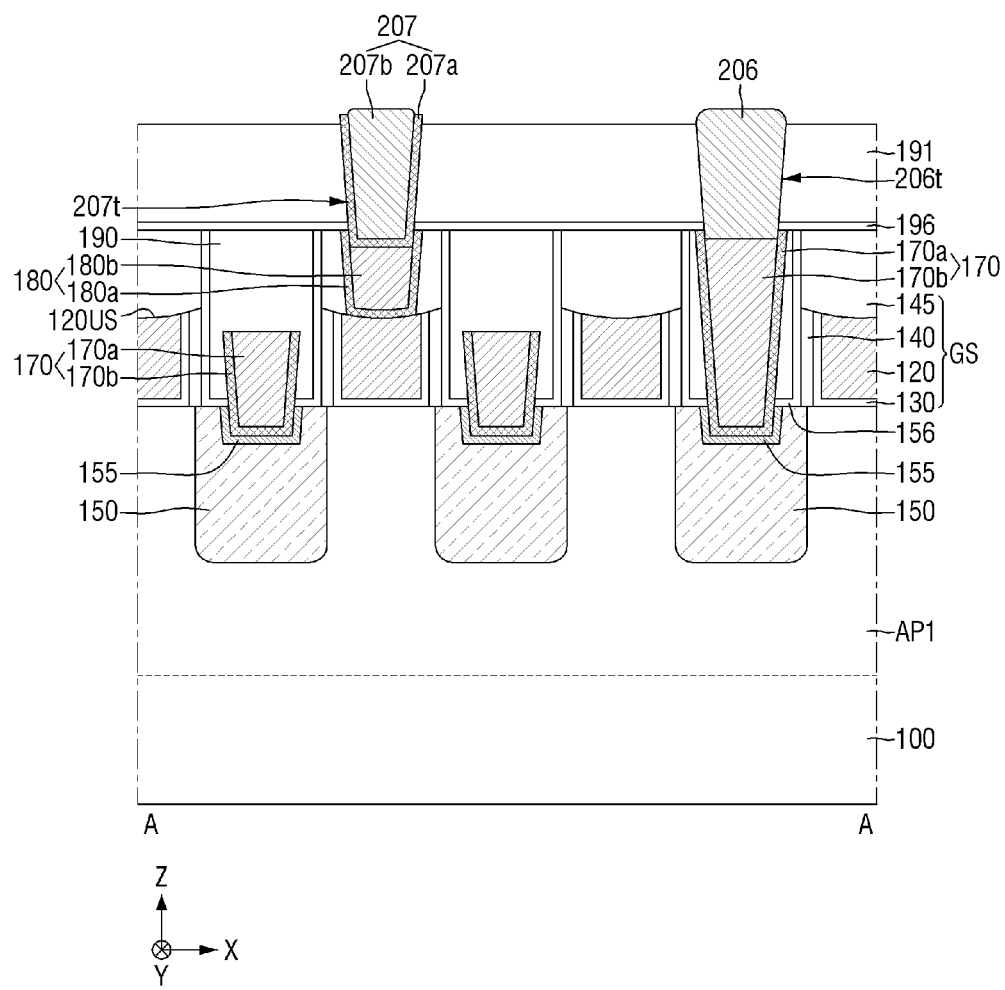

Referring to FIG. 45, by removing the sacrificial etch stop layer 210_SC, the second interlayer insulating layer 191 is exposed.

As the sacrificial etch stop layer 210_SC is removed, a portion of the first via plug 206 and a portion of the second via plug 207 protrude from the top surface of the second interlayer insulating layer 191. While the sacrificial etch stop layer 210_SC is removed, a corner portion of the first via plug 206 and a corner portion of the second via plug 207 may be etched. Through this, a convex curved surface may be included on the top surface of the first via plug 206 and the top surface of the second via plug 207, and the overall top surface of the first via plug 206 and the top surface of the second via plug 207 may be convex. The height difference between the lowest and highest portions of the convex top surface of each of the first via plug 206 and the second via plug 207 may be, for example, the thickness of the sacrificial etch stop layer 210_SC.

Figure 46:
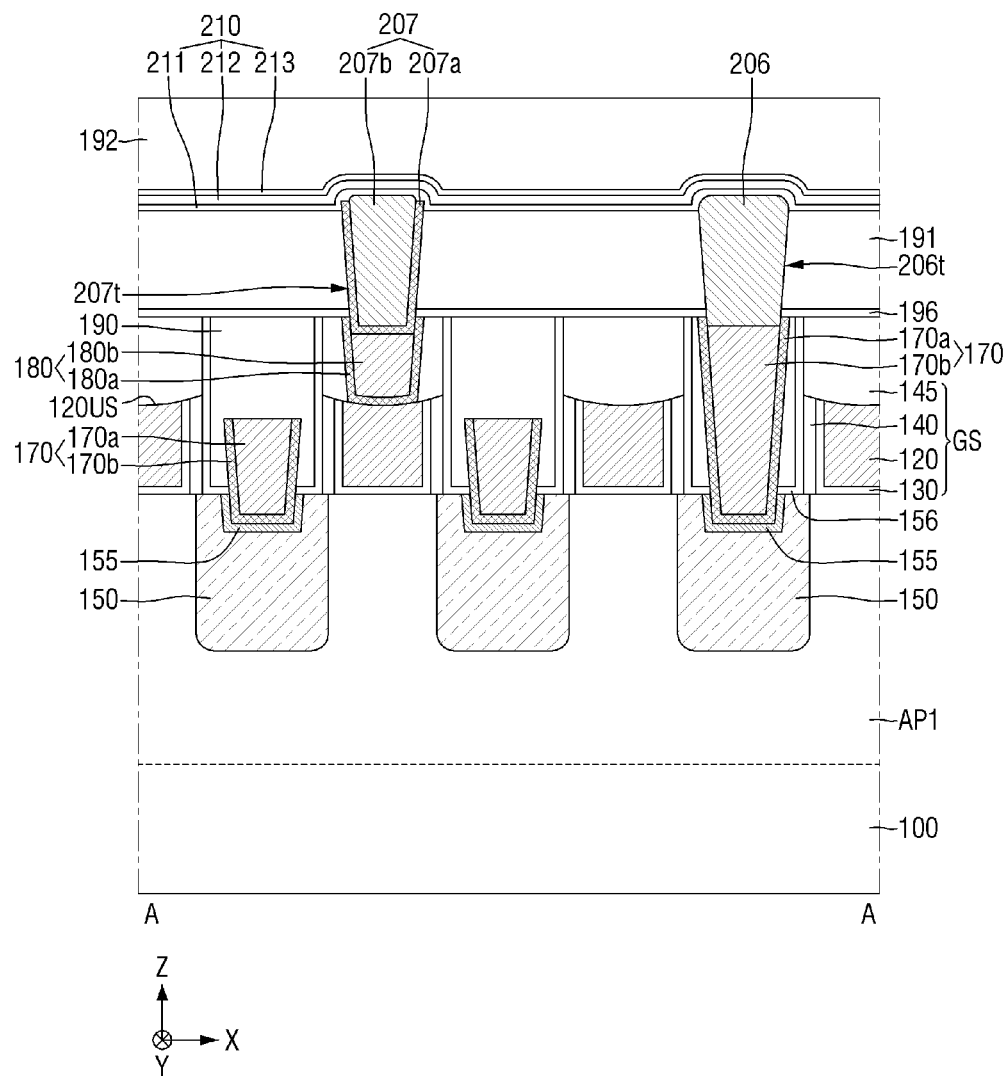

Referring to FIG. 46, the etch stop structure layer 210 that covers the first via plug 206 and the second via plug 207 protruding from the top surface of the second interlayer insulating layer 191 is formed. The etch stop structure layer 210 includes a plurality of layers. The etch stop structure layer 210 is in contact with the top surface of the second interlayer insulating layer 191. The etch stop structure layer 210 is in contact with a portion of the first via plug 206 and a portion of the second via plug 207 protruding from the top surface of the second interlayer insulating layer 191. The etch stop structure layer 210 may therefore including portions having convex surfaces that conform to the convex surfaces of the first via plug 206 and second via plug 207. In some cases, if only one of the first via plug 206 and second via plug 207 has the convex shape (e.g., as shown in the example embodiment of FIGS. 21-22), then the etch stop structure layer 210 similarly only includes a corresponding convex portion for the convex via plug.

The third interlayer insulating layer 192 is formed on the etch stop structure layer 210.

Subsequently, referring to FIG. 2, the wire line 205 is formed by penetrating the third interlayer insulating layer 192 and the etch stop structure layer 210. The wire line 205 is connected to the top surface of the first via plug 206 and the second via plug 207.

Although examples according to the technical idea of the present disclosure have been described above referring to the attached drawings, the present disclosure is not limited to the above examples and may be fabricated in various different forms. Those who have ordinary knowledge in the technical field to which the present disclosure belongs will understand that the present disclosure can be carried out in other specific forms without changing the technical idea or essential features of the present disclosure. Therefore, it should be understood that the examples described above are exemplary in all respects and are not limiting.

Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise.

What is claimed is:

1. A semiconductor device comprising:
a gate structure including a gate electrode, on a substrate;
a source/drain pattern disposed on a side surface of the gate electrode, on the substrate;
a first interlayer insulating layer on the gate structure;
a first via plug disposed in the first interlayer insulating layer and connected to the source/drain pattern;
an etch stop structure layer including first, second, and third etch stop layers sequentially stacked, on the first interlayer insulating layer, such that the second etch stop layer is between the first etch stop layer and the third etch stop layer;
a second interlayer insulating layer contacting the etch stop structure layer, on the etch stop structure layer, such that the etch stop structure layer is between the first interlayer insulating layer and the second interlayer insulating layer; and
a wire line disposed in the second interlayer insulating layer and contacting the first via plug,
wherein the first etch stop layer contacts a top surface of the first interlayer insulating layer,
wherein the third etch stop layer is a continuously-formed layer that includes a first horizontal portion extending along the top surface of the first interlayer insulating layer, and a first vertical portion protruding from the first horizontal portion of the third etch stop layer in a thickness direction of the substrate, and
wherein a first portion of the first etch stop layer is at a higher vertical level than a first portion of the second etch stop layer, and/or a second portion of the second etch stop layer is at a higher vertical level than the first horizontal portion of the third etch stop layer.

2. The semiconductor device of claim 1, wherein the first via plug includes a protrusion protruding from the top surface of the first interlayer insulating layer, and
the protrusion of the first via plug contacts the first etch stop layer.

3. The semiconductor device of claim 2, wherein a top surface of the first horizontal portion of the third etch stop layer is higher than a top surface of the first via plug.

4. The semiconductor device of claim 2, wherein the first etch stop layer is a continuously-formed layer that includes a second horizontal portion extending along a top surface of the first interlayer insulating layer, and a second vertical portion protruding from a second horizontal portion of the first etch stop layer in the thickness direction of the substrate.

5. The semiconductor device of claim 1, wherein the first etch stop layer and the third etch stop layer each include metal oxide.

6. The semiconductor device of claim 1, wherein the third etch stop layer contacts the second interlayer insulating layer.

7. The semiconductor device of claim 1, further comprising:
a gate contact connected to the gate electrode; and
a second via plug disposed in the first interlayer insulating layer and connected to the gate contact,
wherein the first via plug has a single conductive layer structure, and
the second via plug has a conductive multilayer structure.

8. The semiconductor device of claim 7, wherein the second via plug includes a plug conductive layer and a barrier conductive layer extending along a sidewall and a bottom surface of the plug conductive layer, and
the plug conductive layer includes the same material as the first via plug.

9. The semiconductor device of claim 7, wherein the second via plug includes a protrusion protruding from the top surface of the first interlayer insulating layer, and
the first etch stop layer contacts the protrusion of the second via plug.

10. The semiconductor device of claim 1, wherein a top surface of the first via plug is convex in a direction away from a top surface of the substrate.

11. The semiconductor device of claim 1, wherein the wire line includes a first portion which vertically overlaps a top surface of the first via plug and a second portion which does not vertically overlap the top surface of the first via plug, and
a bottom surface of the second portion of the wire line is lower than the top surface of the first via plug, and contacts the first interlayer insulating layer.

12. The semiconductor device of claim 1, wherein the etch stop structure layer has a side surface that contacts the wire line, and that includes coplanar side surfaces of the first etch stop layer, the second etch stop layer, and the third etch stop layer.

13. A semiconductor device comprising:
a gate structure including a gate electrode extending in a first direction, on a substrate;
a source/drain pattern disposed on a side surface of the gate electrode, on the substrate;
a first interlayer insulating layer on the gate structure;
a first via plug disposed in the first interlayer insulating layer and having a single conductive layer structure, the first via plug connected to the source/drain pattern and including a first protrusion protruding from a top surface of the first interlayer insulating layer;
a second via plug disposed in the first interlayer insulating layer, connected to the gate electrode, and having a conductive multilayer structure;
an etch stop structure layer contacting the top surface of the first interlayer insulating layer and including a plurality of layers;
a second interlayer insulating layer on the etch stop structure layer and contacting the etch stop structure layer; and
a wire line disposed in the second interlayer insulating layer, and contacting the first via plug and the first interlayer insulating layer,
wherein the first via plug includes a first sidewall and a second sidewall opposite the first sidewall in a second direction perpendicular to the first direction,
the first sidewall extends onto the first protrusion of the first via plug and contacts the etch stop structure layer at the first protrusion of the first via plug, and
the second sidewall extends onto the first protrusion of the first via plug and contacts the wire line at the first protrusion of the first via plug.

14. The semiconductor device of claim 13, wherein the etch stop structure layer includes first, second, and third etch stop layers sequentially stacked on the first interlayer insulating layer such that the second etch stop layer is between the first etch stop layer and the third etch stop layer, and
the first etch stop layer and the third etch stop layer contain the same material.

15. The semiconductor device of claim 14, wherein the first etch stop layer and the third etch stop layer each include aluminum oxide.

16. The semiconductor device of claim 14, wherein the first etch stop layer includes a horizontal portion extending along a top surface of the first interlayer insulating layer and a vertical portion protruding from the horizontal portion of the first etch stop layer in a thickness direction of the substrate.

17. The semiconductor device of claim 13, wherein the second via plug includes a second protrusion protruding from the top surface of the first interlayer insulating layer.

18. The semiconductor device of claim 13, wherein the etch stop structure layer includes a first etch stop layer contacting the first interlayer insulating layer, and a second etch stop layer between the first etch stop layer and the second interlayer insulating layer, and
the first etch stop layer is formed of metal oxide.

19. A semiconductor device comprising:
an active pattern on a substrate;
a gate structure disposed on the active pattern and including a gate electrode and a gate capping pattern, the gate capping pattern being disposed on the gate electrode;
a source/drain pattern disposed on a side surface of the gate structure, on the active pattern;
a first interlayer insulating layer on the gate capping pattern;
a first via plug connected to the source/drain pattern and including a first protrusion protruding from a top surface of the first interlayer insulating layer;
a second via plug connected to the gate electrode and including a second protrusion protruding from a top surface of the first interlayer insulating layer;
an etch stop structure layer including first to third etch stop layers sequentially stacked, so that a second etch stop layer is between a first etch stop layer and a third etch stop layer, the etch stop structure layer on the first interlayer insulating layer;
a second interlayer insulating layer contacting the etch stop structure layer, on the etch stop structure layer; and
a wire line disposed in the second interlayer insulating layer and contacting the first via plug,
wherein a sidewall of the first protrusion of the first via plug and a sidewall of the second protrusion of the second via plug contact the first etch stop layer,
wherein the first via plug has a single conductive layer structure,
wherein the second via plug includes a plug conductive layer and a barrier conductive layer extending along a bottom surface and a sidewall of the plug conductive layer, and
wherein the first via plug and the plug conductive layer are formed of tungsten (W).

20. The semiconductor device of claim 19, wherein the first etch stop layer and the third etch stop layer include aluminum oxide.

21. The semiconductor device of claim 19, wherein the first etch stop layer includes a continuously-formed material that includes a horizontal portion extending along a top surface of the first interlayer insulating layer and a vertical portion protruding from the horizontal portion of the first etch stop layer in a thickness direction of the substrate.

* * * * *